(12) United States Patent
Abe

(10) Patent No.: US 10,044,343 B2
(45) Date of Patent: Aug. 7, 2018

(54) DRIVE CIRCUIT, AND CONTROL METHOD OF DRIVE CIRCUIT

(71) Applicant: SEIKO EPSON CORPORATION, Tokyo (JP)

(72) Inventor: Akira Abe, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/412,477

(22) Filed: Jan. 23, 2017

(65) Prior Publication Data
US 2017/0250679 A1 Aug. 31, 2017

(30) Foreign Application Priority Data

Feb. 26, 2016 (JP) .................. 2016-034988

(51) Int. Cl.
| | |
|---|---|
| *H03B 1/00* | (2006.01) |
| *H03K 3/00* | (2006.01) |
| *H03K 3/012* | (2006.01) |
| *B41J 2/045* | (2006.01) |
| *H01L 41/04* | (2006.01) |
| *H01L 41/09* | (2006.01) |
| *H03K 4/94* | (2006.01) |

(52) U.S. Cl.
CPC .......... *H03K 3/012* (2013.01); *B41J 2/04541* (2013.01); *B41J 2/04581* (2013.01); *H01L 41/042* (2013.01); *H01L 41/0973* (2013.01); *H03K 4/94* (2013.01)

(58) Field of Classification Search
CPC ............ H03K 3/00; H03K 3/01; H03K 3/012; H03K 4/94; B41J 2/045; B41J 2/04501; B41J 2/04541; B41J 2/04581; H01L 41/02; H01L 41/04; H01L 41/042; H01L 41/044; H01L 41/0926; H01L 41/0973; H01L 41/098
USPC .................................................. 327/108–112
See application file for complete search history.

(56) References Cited

U.S. PATENT DOCUMENTS

| | | | |
|---|---|---|---|
| 7,852,128 B2 | 12/2010 | Kitazawa et al. | |
| 2015/0246530 A1* | 9/2015 | Abe ..................... | B41J 2/04541 347/10 |

FOREIGN PATENT DOCUMENTS

| | | |
|---|---|---|
| JP | 2009-190287 A | 8/2009 |
| JP | 2010-114711 A | 5/2010 |

* cited by examiner

*Primary Examiner* — Lincoln Donovan
*Assistant Examiner* — Diana J Cheng

(57) ABSTRACT

A drive circuit includes a control signal generator configured to generate a control signal based on a drive signal and a source drive signal, and an amplifier including a high-side transistor and a low-side transistor controlled based on the control signal. The amplifier is configured to output the drive signal from an output terminal to drive a capacitive load during a first period in which a voltage of the drive signal changes to be higher than or equal to a first voltage per unit time and a second period in which the voltage changes to be lower than the first voltage or does not change per unit time. The first period includes a period in which one of the high-side and the low-side transistors performs a switching operation. The second period includes a period in which the one of the high-side and the low-side transistors performs a linear operation.

8 Claims, 28 Drawing Sheets

<DECODED CONTENT OF DECODER>

| PRINT DATA SI | T1 Sa | T1 Sb | T2 Sa | T2 Sb |
|---|---|---|---|---|
| LARGE DOT ---▶ (1, 1) | H | L | H | L |
| MEDIUM DOT ---▶ (0, 1) | H | L | L | H |
| SMALL DOT ---▶ (1, 0) | L | L | L | H |
| NO RECORD ---▶ (0, 0) | L | H | L | L |

MSB   LSB

DRIVE CIRCUIT, AND CONTROL METHOD OF DRIVE CIRCUIT

CROSS-REFERENCE TO RELATED APPLICATIONS

This application claims priority to Japanese Patent Application No. 2016-034988 filed on Feb. 26, 2016. The entire disclosure of Japanese Patent Application No. 2016-034988 is hereby incorporated herein by reference.

BACKGROUND

Technical Field

The present invention relates to a drive circuit and a control method of the drive circuit.

Related Art

An ink jet printer which uses a piezoelectric element (for example, a piezo element) and which prints an image or a text by ejecting ink is known. Piezoelectric elements are provided in correspondence with multiple nozzles in a head unit, each of the piezoelectric elements is driven in accordance with a drive signal, and thereby, a predetermined amount of ink (liquid) is ejected from the nozzle at a predetermined timing to form dots. The piezoelectric element is electrically a capacitive element like a capacitor, and needs to receive a sufficient current in order to operate the piezoelectric element of each nozzle.

Accordingly, a source drive signal which is a source signal of a drive signal is amplified by an amplification circuit, is supplied to a head unit as a drive signal, and drives the piezoelectric elements. An amplification circuit uses, for example, a method (linear amplification, refer to JP-A-2009-190287) of amplifying current for the source drive signal in class AB amplification or the like. However, since power consumption increases and energy efficiency decreases in the linear amplification, a class D amplification is also proposed in recent years (refer to JP-A-2010-114711). In short, in a class D amplification, a pulse width modulation or a pulse density modulation of the source drive signal is performed, a high-side transistor and a low-side transistor that are inserted in series between power supply voltages are switched in accordance with the modulated signal, an output signal which is generated by the switching is filtered by a low pass filter, and thus, the source drive signal is amplified.

Energy efficiency of a class D amplification method is higher than that of a linear amplification method, however, power which is consumed by a low pass filter cannot be ignored, and thus, there is room for improvement in terms of reducing power consumption.

SUMMARY

An advantage of some aspects of the invention is to provide a drive circuit which reduces power consumption and a control method of the drive circuit.

A drive circuit according to an aspect of the invention includes a control signal generator and an amplifier. The control signal generator is configured to generate a control signal based on a drive signal, which drives a capacitive load, and a source drive signal which is a source signal of the drive signal. The amplifier includes a high-side transistor and a low-side transistor which are configured to be controlled based on the control signal. The amplifier is configured to output the drive signal from an output terminal of the amplifier to drives the capacitive load during a first period in which a voltage of the drive signal changes to be higher than or equal to a first voltage per unit time, and a second period in which the voltage changes to be lower than the first voltage or does not change per unit time. The first period includes a period in which one of the high-side transistor and the low-side transistor performs a switching operation, and the second period includes a period in which the one of the high-side transistor and the low-side transistor performs a linear operation.

In the drive circuit according to the aspect, the drive signal may have a trapezoidal waveform, the first period may be a period in which the voltage of the drive signal changes, and the second period may be a period in which the voltage of the drive signal is constant.

In addition, in the drive circuit according to the aspect, the drive signal may have a waveform with continuous slope, the first period may be a period having a large voltage change of the drive signal, and the second period may be a period having a small voltage change of the drive signal, which is smaller than the large voltage change of the drive signal.

In the drive circuit according to the aspect, the high-side transistor is configured to perform the switching operation and the low-side transistor is configured to be turned off, while the voltage of the drive signal increases in the first period, and the low-side transistor is configured to perform a switching operation and the high-side transistor is configured to be turned off, while the voltage of the drive signal decreases in the first period.

In addition, in the drive circuit according to the aspect, the high-side transistor is configured to perform a linear operation and the low-side transistor is configured to be turned off, while the drive signal has a voltage higher than or equal to a predetermined threshold value in the second period, and the low-side transistor is configured to perform a linear operation and the high-side transistor is configured to be turned off, while the drive signal has a voltage lower than the threshold value in the second period.

According to another aspect of the invention, a control method for controlling a drive circuit comprises controlling one of a high-side transistor and a low-side transistor of an amplifier of the drive circuit to perform a switching operation in at least a part of a first period by a control signal generator, the drive circuit including the control signal generator and the amplifier, the control signal generator being configured to generate a control signal, based on a drive signal, which drives a capacitive load, and a source drive signal which is a source signal of the drive signal, the amplifier including the high-side transistor and the low-side transistor which are configured to be controlled based on the control signal, the amplifier being configured to output the drive signal from an output terminal of the amplifier to drive the capacitive load during a first period and a second period, the first period being a period in which a voltage changes to be higher than or equal to a first voltage per unit time, the second period being a period in which the voltage changes to be lower than the first voltage per unit time or does not change; and controlling the one of the high-side transistor and the low-side transistor to perform a linear operation in at least a part of the second period by the control signal generator.

BRIEF DESCRIPTION OF THE DRAWINGS

Referring now to the attached drawings which form a part of this original disclosure.

DETAILED DESCRIPTION OF EXEMPLARY EMBODIMENTS

Hereinafter, a printing apparatus according to an exemplary embodiment of the invention will be described with reference to the drawings.

Figure 1:
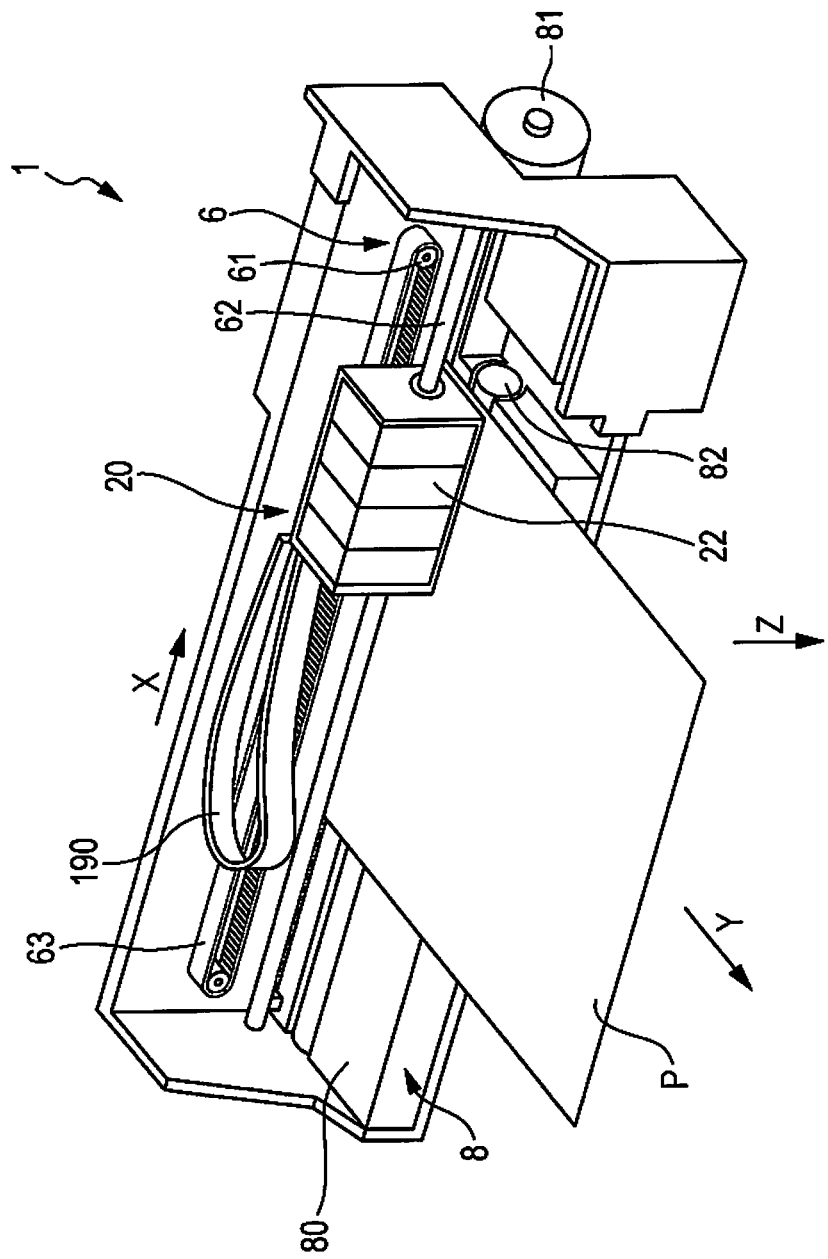
FIG. 1 is a perspective view illustrating a schematic configuration of a printing apparatus (Example 1) according to an embodiment.

FIG. 1 is a perspective view illustrating a schematic configuration of a printing apparatus (Example 1).

The printing apparatus (Example 1) illustrated in this figure is a type of liquid ejecting apparatus which ejects ink that is an example of liquid, thereby, forming an ink dot group on a medium P such as paper, thereby, printing an image (including characters, graphics, or the like).

In the printing apparatus, a symbol is unified by 1 for the sake of convenience, but since there are several aspects as will be describe below, there is a case where parenthesis such as a printing apparatus (Example 1) or a printing apparatus (Example 2) is attached instead of a symbol so that each of them is distinguished.

As illustrated in FIG. 1, the printing apparatus 1 includes a moving mechanism 6 which moves (moves back and forth) a carriage 20 in a main scanning direction (X direction).

The moving mechanism 6 includes a carriage motor 61, which moves the carriage 20, and a carriage guide axis 62 both of which are fixed, and a timing belt 63 which extends substantially parallel to the carriage guide axis 62 and is driven by the carriage motor 61.

The carriage 20 is supported by the carriage guide axis 62 so as to move freely back and forth, and is fixed to a part of the timing belt 63. Accordingly, if the timing belt 63 travels forward and backward by the carriage motor 61, the carriage 20 is guided by the carriage guide axis 62 and moves back and forth.

A printing head 22 is mounted in the carriage 20. The printing head 22 includes multiple nozzles which respectively eject ink in the Z direction onto a portion which faces the medium P. The printing head 22 is divided into approximately four blocks for color printing. The multiple blocks respectively eject black (Bk) ink, cyan (C) ink, magenta (M) ink, and yellow (Y).

There is provided a configuration in which various control signals or the like, which include a drive signal from a main substrate (omitted in FIG. 1) through a flexible flat cable 190, are supplied to the carriage 20.

The printing apparatus 1 includes a transport mechanism 8 which transports the medium P on a platen 80. The transport mechanism 8 includes a transport motor 81 which is a drive source, and a transport roller 82 which is rotated by the transport motor 81 and transports the medium P in a sub-scanning direction (Y direction).

In the configuration, an image is formed on a surface of the medium P by ejecting ink in response to print data from the nozzles of the printing head 22 in accordance with main scanning of the carriage 20, and repeating an operation of transporting the medium P in accordance with the transport mechanism 8.

In the present embodiment, the main scanning is performed by moving the carriage 20, but may be performed by moving the medium P, and may be performed by moving both the carriage 20 and the medium P. The point is that there may be provided a configuration in which the medium P and the carriage 20 (printing head 22) move relatively.

Figure 2A:
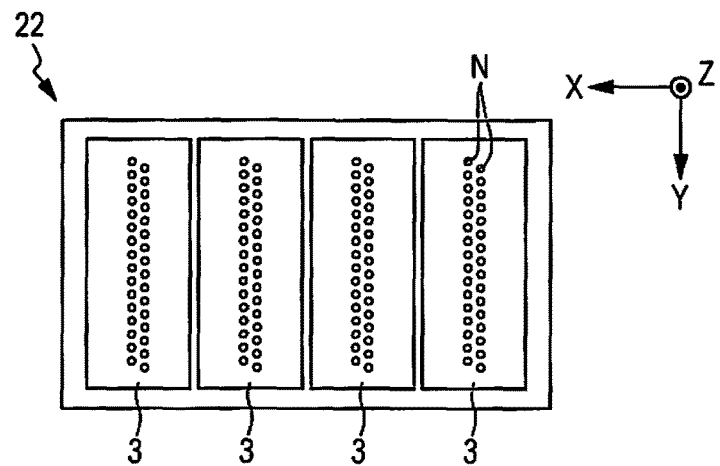
FIG. 2A is a diagram illustrating arrangement or the like of nozzles in a head unit.

FIG. 2A is a diagram illustrating a configuration in a case in which an ejecting surface of ink in the printing head 22 is viewed from the medium P. As illustrated in FIG. 2A, the printing head 22 includes four head units 3. The four head units 3 are arranged in the X direction which is a main scanning direction in correspondence with black (Bk), cyan (C), magenta (M), and yellow (Y), respectively.

Figure 2B:
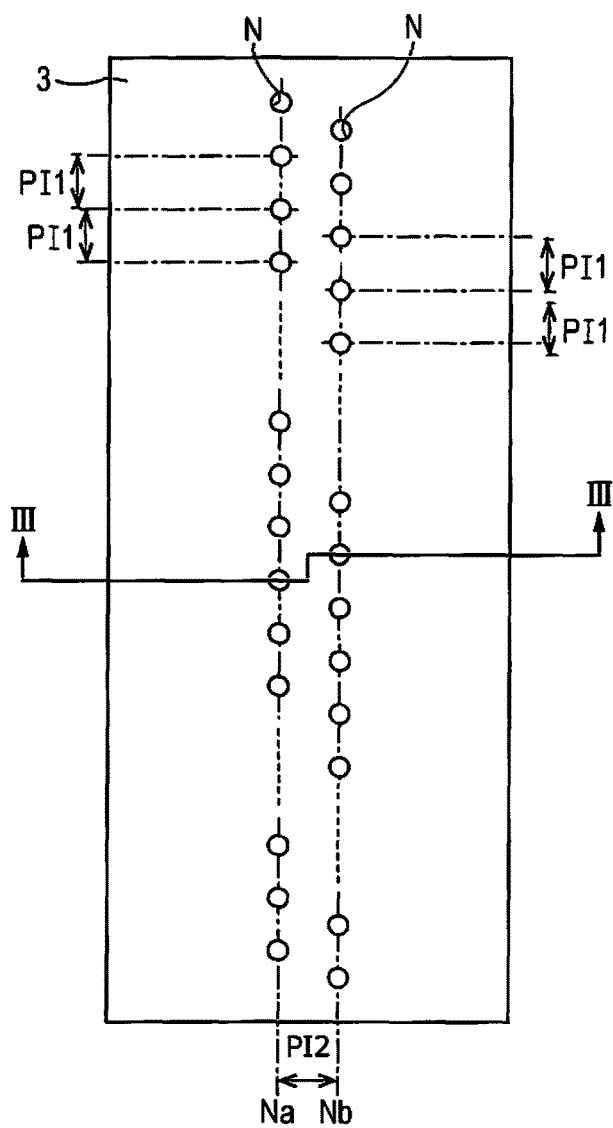
FIG. 2B is a diagram illustrating arrangement or the like of the nozzles in the head unit.

FIG. 2B is a diagram illustrating arrangement of nozzles in one head unit 3.

As illustrated in FIG. 2B, multiple nozzles N are arranged in two columns in one head unit 3. For the sake of convenience, the two columns are respectively referred to as a nozzle column Na and a nozzle column Nb.

Multiple nozzles N are arranged in the Y direction which is a subscan direction by a pitch PI1 in each of the nozzle columns Na and Nb. In addition, the nozzle columns Na and Nb are separated from each other by a pitch PI2 in the X direction. The nozzles N in the nozzle column Na are shifted from the nozzles N in the nozzle column Nb by half of the pitch PI1 in the Y direction.

In this way, the nozzles N are arranged so as to be shifted by half of the pitch PI1 in the two columns of the nozzle columns Na and Nb in the Y direction, and thereby it is possible to increase resolution in the Y direction substantially twice as much as a case of one column.

The number of nozzles N in one head unit 3 is referred to as m (m is an integer greater than or equal to 2) for the sake of convenience.

While not particularly illustrated, the head unit 3 has a configuration in which a flexible circuit board is coupled to an actuator substrate, and a drive IC is mounted on the flexible circuit board. Hence, next, a structure of the actuator substrate will be described.

Figure 3:
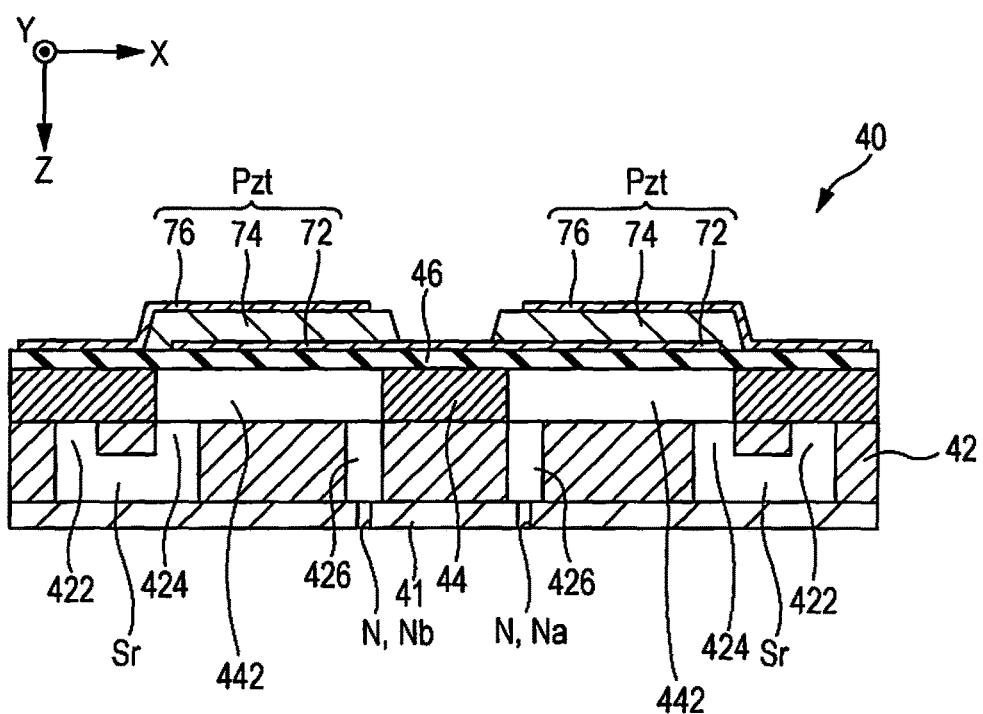
FIG. 3 is a sectional view illustrating a main configuration of the head unit.

FIG. 3 is a sectional view illustrating a structure of the actuator substrate. In detail, FIG. 3 is a view illustrating a cross section taken along line III-Ill of FIG. 2B.

As illustrated in FIG. 3, the actuator substrate 40 has a structure in which a pressure chamber substrate 44 and a vibration plate 46 are provided on a surface of a flow path substrate 42 at a negative side in the Z direction and a nozzle plate 41 is provided on a surface of the flow path substrate 42 at a positive side in the Z direction.

Schematically, each element of the actuator substrate 40 is a member of an approximately flat plate which is long in the Y direction, and is fixed to each other by for example, an adhesive or the like. In addition, the flow path substrate 42 and the pressure chamber substrate 44 are formed by, for example, a single crystal substrate of silicon.

The nozzles N are formed in the nozzle plate 41. A structure corresponding to the nozzles in the nozzle column Na is shifted from a structure corresponding to the nozzles in the nozzle column Nb by half of the pitch PI1 in the Y direction, but the nozzles are formed approximately symmetrically except for that, and thus, the structure of the actuator substrate 40 will be hereinafter described by focusing on the nozzle column Na.

The flow path substrate 42 is a flat member which forms a flow path of ink, and includes an opening 422, a supply flow path 424, and a communication flow path 426. The supply flow path 424 and the communication flow path 426 are formed in each nozzle, and the opening 422 is continuously formed over the multiple nozzles and has a structure in which ink with a corresponding color is supplied. The opening 422 functions as a liquid reservoir chamber Sr, and a bottom surface of the liquid reservoir chamber Sr is configured by, for example, the nozzle plate 41. In detail, the nozzle plate 41 is fixed to the bottom surface of the flow path substrate 42 so as to close the opening 422, the supply flow path 424, and the communication flow path 426 which are in the flow path substrate 42.

The vibration plate 46 is installed on a surface of the pressure chamber substrate 44 at a side opposite to the flow path substrate 42. The vibration plate 46 is a member of an elastically vibratile flat plate, and is configured by stacking an elastic film formed of an elastic material such as a silicon oxide, and an insulating film formed of an insulating material such as a zirconium oxide. The vibration plate 46 and the flow path substrate 42 face each other with an interval in the inner side of each opening 422 of the pressure chamber substrate 44. A space between the flow path substrate 42 and the vibration plate 46 in the inner side of each opening 422 functions as a cavity 442 which provides pressure to ink. Each cavity 442 communicates with the nozzle N through the communication flow path 426 of the flow path substrate 42.

A piezoelectric element Pzt is formed for each nozzle N (cavity 442) on a surface of the vibration plate 46 at a side opposite to the pressure chamber substrate 44.

The piezoelectric element Pzt includes a common drive electrode 72 formed over the multiple piezoelectric elements Pzt formed on a surface of the vibration plate 46, a piezoelectric body 74 formed on a surface of the common drive electrode 72, and individual drive electrodes 76 formed in each piezoelectric element Pzt on a surface of the piezoelectric body 74. In the configuration, a region in which the piezoelectric body 74 is interposed between the common drive electrode 72 and the drive electrode 76 which face each other, functions as the piezoelectric element Pzt.

The piezoelectric body 74 is formed in a process which includes, for example, a heating process (baking). In detail, the piezoelectric body 74 is formed by baking a piezoelectric material which is applied to a surface of the vibration plate 46 on which multiple common drive electrodes 72 are formed, using heating processing of a furnace, and then molding (milling by using, for example, plasma) the baked material for each piezoelectric element Pzt.

In the same manner, the piezoelectric element Pzt corresponding to the nozzle column Nb is also configured to include the common drive electrode 72, the piezoelectric body 74, and the drive electrode 76.

In addition, in this example, in the piezoelectric body 74, the common drive electrode 72 is used as a lower layer and the individual drive electrodes 76 are used as an upper layer, but in contrast to this, a configuration in which the common drive electrode 72 is used as an upper layer and the individual drive electrodes 76 are used as a lower layer, may be provided.

A configuration may be provided in which the drive IC is directly mounted in the actuator substrate 40.

As will be described below, meanwhile a voltage Vout of a drive signal according to the amount of ink to be ejected is individually applied to the drive electrode 76 which is a terminal of the piezoelectric element Pzt, a retention signal of a voltage $V_{BS}$ is commonly applied to the common drive electrode 72 which is the other terminal of the piezoelectric element Pzt.

Accordingly, the piezoelectric element Pzt becomes displaced upwardly or downwardly in accordance with a voltage which is applied to the drive electrodes 72 and 76. In detail, if the voltage Vout of the drive signal which is applied through the drive electrode 76 decreases, the central portion of the piezoelectric element Pzt is bent upwardly with respect to both end portions, and meanwhile, if the voltage Vout increases, the central portion of the piezoelectric element Pzt is bent downwardly.

If the central portion is bent upwardly, an internal volume of the cavity 442 increases (pressure decreases), and thus ink is drawn from the liquid reservoir chamber Sr. Meanwhile, if the central portion is bent downwardly, an internal volume of the cavity 442 decreases (pressure increases), and thus, an ink droplet is ejected from the nozzle N in accordance with the decreased degree. In this way, if a proper drive signal is applied to the piezoelectric element Pzt, ink is ejected from the nozzle N in accordance with the displacement of the piezoelectric element Pzt. Accordingly, an ejecting unit which ejects ink in accordance with at least the piezoelectric element Pzt, the cavity 442, and the nozzle N, is configured.

Next, an electrical configuration of the printing apparatus 1 will be described.

Figure 4:
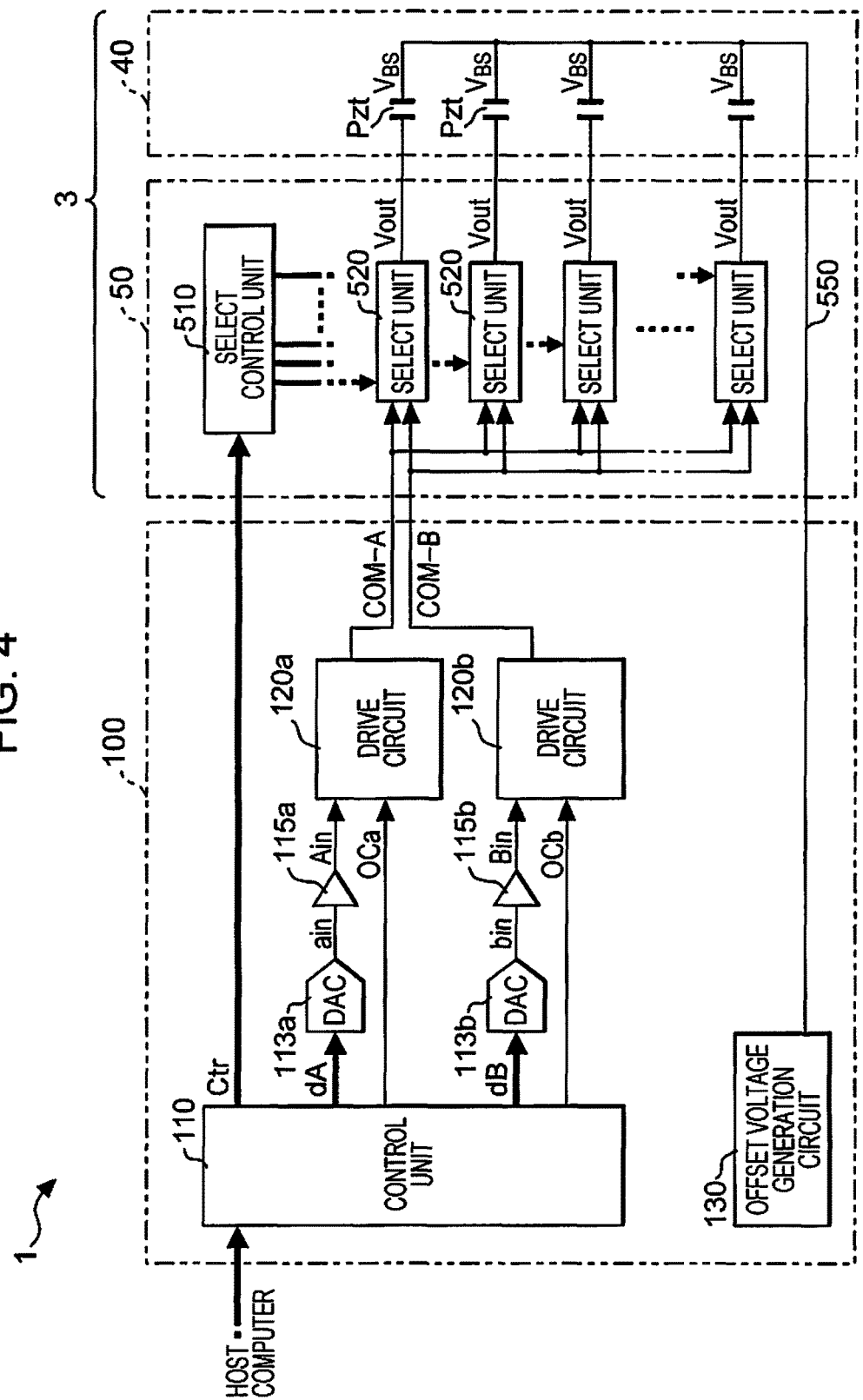
FIG. 4 is a block diagram illustrating an electrical configuration of the printing apparatus (Example 1)

FIG. 4 is a block diagram illustrating an electrical configuration of the printing apparatus 1.

As illustrated in FIG. 4, the printing apparatus 1 has a configuration in which the head unit 3 is coupled to a main substrate 100. The head unit 3 is largely divided into the actuator substrate 40 and a drive IC 50.

The main substrate 100 supplies a control signal Ctr or drive signals COM-A and COM-B to the drive IC 50, and supplies a retention signal of the voltage $V_{BS}$ (offset voltage) to the actuator substrate 40 through a wire 550.

In the printing apparatus 1, four head units 3 are provided, and the main substrate 100 independently controls the four head units 3. The four head units 3 are the same as each other except that the colors of ink to be ejected are different from each other, and thus, hereinafter, one head unit 3 will be representatively described for the sake of convenience.

As illustrated in FIG. 4, the main substrate 100 includes a control unit 110, D/A converters (DAC: Digital Analog Converter) 113a and 113b, voltage amplifiers 115a and 115b, drive circuits 120a and 120b, and an offset voltage generation circuit 130.

Among these, the control unit 110 is a type of a microcontroller having a CPU, a RAM, a ROM, and the like, and outputs various control signals or the like for controlling each unit by executing a predetermined program, when image data which becomes a printing target is supplied from a host computer or the like.

In detail, first, the control unit 110 repeatedly supplies digital data dA to the DAC 113a and the drive circuit 120a, and repeatedly supplies digital data dB to the DAC 113b and the drive circuit 120b, in the same manner. Here, the data dA defines a waveform of the drive signal COM-A which is supplied to the head unit 3, and the data dB defines a waveform of the drive signal COM-B.

The DAC 113a converts the digital data dA into analog signal ain. The voltage amplifier 115a amplifies a voltage of the signal ain by, for example, 10 times and supplies the voltage to the drive circuit 120a as a signal Ain. In the same manner, the DAC 113b converts the digital data dB into analog signal bin, and the voltage amplifier 115b amplifies a voltage of the signal bin by, for example, 10 times and supplies the voltage to the drive circuit 120b as a signal Bin.

The drive circuit 120a, which will be described below in detail, outputs the signal Ain to the piezoelectric element Pzt which is a capacitive load as the drive signal COM-A by increasing drive capability (converting to low impedance). In the same manner, the drive circuit 120b outputs the signal Bin as the drive signal COM-B by increasing drive capability.

The drive signal COM-A and COM-B (signals ain and bin after being analog-converted, signals Ain and Bin before being impedance-converted) have trapezoidal waveforms as will be described below.

The signal ain (bin) which is converted by the DAC 113a (113b) performs a relatively small swing in a range of a voltage of, for example, approximately 0 V to 4 V, and in contrast to this, the drive signal COM-A (COM-B) performs a relatively large swing in a range of a voltage of, for example, approximately 0 V to 40 V. Accordingly, there is provided a configuration in which the voltage amplifier 115a (115b) amplifies a voltage of the signal ain (bin) which is converted by the DAC 113a (113b), and the drive circuit 120a (120b) impedance-converts the signal Ain (Bin) whose voltage is amplified.

Second, the control unit 110 supplies various control signals Ctr to the head unit 3, in synchronization with control for the moving mechanism 6 and the transport mechanism 8. The control signals Ctr which are supplied to the head unit 3 include print data (ejecting control signal) which defines the amount of ink which is ejected from the nozzle N, a clock signal which is used for transmission of the print data, a timing signal which defines a print period or the like, or the like.

The control unit 110 controls the moving mechanism 6 and the transport mechanism 8, but such a configuration is known, and thus, description thereof will be omitted.

The offset voltage generation circuit 130 in the main substrate 100 generates a retention signal of the voltage $V_{BS}$ and commonly applies the signal to the other terminals of the multiple piezoelectric elements Pzt in the actuator substrate 40 through the wires 550. The retention signal of the voltage $V_{BS}$ maintains the other terminals of the multiple piezoelectric elements Pzt in a constant state.

Meanwhile, in the head unit 3, the drive IC 50 includes a select control unit 510 and select units 520 which correspond to the piezoelectric elements Pzt one to one. The select control unit 510 controls selection of each of the select units 520. In detail, the select control unit 510 stores the print data which is supplied in correspondence with a clock signal from the control unit 110 in several nozzles (piezoelectric elements Pzt) of the head unit 3 once, and instructs each select unit 520 to select the drive signals COM-A and COM-B in accordance with the print data at a start timing of a print period which is defined by a timing signal.

Each select unit 520 selects (or does not select any one) one of the drive signals COM-A and COM-B in accordance with instruction of the select control unit 510, and applies the selected signal to one terminal of the corresponding piezoelectric element Pzt as a drive signal of the voltage Vout.

As described above, one piezoelectric element Pzt is provided for each nozzle N in the actuator substrate 40. The other terminals of each piezoelectric element Pzt are coupled in common, and the voltage $V_{BS}$ from the offset voltage generation circuit 130 is applied to the other terminals through the wire 550.

In the present embodiment, ink is ejected from one nozzle N maximum twice by one dot, and thus four gradations of a large dot, a medium dot, a small dot, and no record are represented. In the present embodiment, in order to represent the four gradations, two types of the drive signals COM-A and COM-B are prepared, and each period has a first half pattern and a second half pattern. Then, during one period, the drive signals COM-A and COM-B are selected (or not selected) in accordance with a gradation to be represented in the first half and a second half, and the selected signal is supplied to the piezoelectric element Pzt.

Thus, the drive signals COM-A and COM-B will be first described, and thereafter, a detailed configuration of the select control unit 510 for selecting the drive signals COM-A and COM-B, and the select unit 520 will be described.

Figure 5:
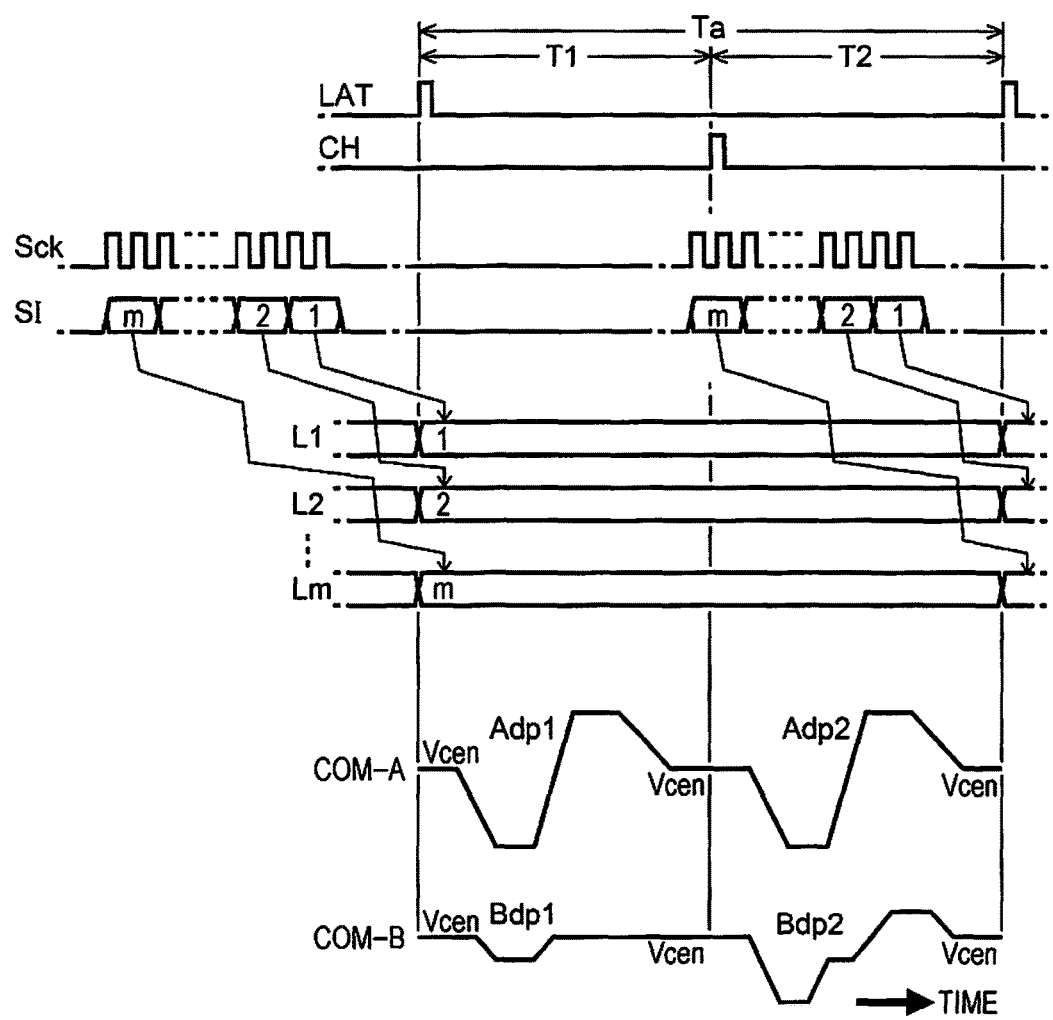
FIG. 5 is a diagram illustrating waveforms and the like of drive signals.

FIG. 5 is a diagram illustrating waveforms or the like of drive signals COM-A and COM-B.

As illustrated in FIG. 5, the drive signal COM-A is configured by a repeated waveform of a trapezoidal waveform Adp1 which is disposed during a period T1 from time when a control signal LAT is output (rises) to time when a control signal CH is output, during a print period Ta, and a trapezoidal waveform Adp2 which is disposed during a period T2 from time when the control signal CH is output and to the control signal LAT is output during the print period Ta.

In the present embodiment, the trapezoidal waveforms Adp1 and Adp2 are approximately the same waveforms as each other, and are waveforms which eject ink of a predetermined amount, specifically, an approximately medium amount from the nozzle N corresponding to the piezoelectric elements Pzt, if each waveform is supplied to the drive electrode 76 which is one terminal of the piezoelectric elements Pzt.

The drive signal COM-B is configured by a repeated waveform of a trapezoidal waveform Bdp1 which is disposed during the period T1 and a trapezoidal waveform Bdp2 which is disposed during the period T2. In the present embodiment, the trapezoidal waveforms Bdp1 and Bdp2 are waveforms different form each other. Among these, the trapezoidal waveform Bdp1 is a waveform for preventing an increase of viscosity of ink by slightly vibrating the ink near the nozzle N. Accordingly, even if the trapezoidal waveform Bdp1 is supplied to the one terminal of the piezoelectric element Pzt, ink is not ejected from the nozzle N corresponding to the piezoelectric element Pzt. In addition, the trapezoidal waveform Bdp2 is a waveform different from the trapezoidal waveform Adp1 (Adp2). If the trapezoidal waveform Bdp2 is supplied to the one terminal of the piezoelectric element Pzt, the trapezoidal waveform Bdp2 becomes a waveform which ejects the amount of ink less than the predetermined amount from the nozzle N corresponding to the piezoelectric element Pzt.

Voltages at a start timing of the trapezoidal waveforms Adp1, Adp2, Bdp1, and Bdp2, and voltages at an end timing of the trapezoidal waveforms Adp1, Adp2, Bdp1, and Bdp2 are all common at a voltage Vcen. That is, the trapezoidal waveforms Adp1, Adp2, Bdp1, and Bdp2 are waveforms which respectively start at the voltage Vcen and ends at the voltage Vcen.

In the present example, since the drive circuit 120a (120b) impedance-converts the signal Ain (Bin), a waveform of the signal Ain (Bin) which is input has some errors, but a waveform of the drive signal COM-A (COM-B) is maintained as it is. Meanwhile, since the signal Ain (Bin) is obtained by amplifying a voltage of the signal ain (bin) by 10 times, the waveform of the signal ain (bin) is 1/10 of the signal Ain (Bin). Since the signal ain (bin) is obtained by analog-converting the data dA (dB), a voltage waveform of the drive signal COM-A (COM-B) is defined by the control unit 110.

The control unit 110 outputs a signal OCa (select signal) having the following logic level with respect to the trapezoidal waveform of the drive signal COM-A (COM-B) to the drive circuit 120a. In detail, the control unit 110 causes the signal OCa to be in a High (H) level during a period in which a voltage of the drive signal COM-A (signal Ain) decreases and a period in which the drive signal COM-A is constant at a voltage lower than a threshold value Vth, and other than that, to be in a Low (L) level during a period in which the voltage of the drive signal COM-A increases and a period in which the drive signal COM-A is constant at a voltage equal to or higher than the threshold value Vth.

In the present example, when a maximum value of the voltage of the drive signal COM-A (signal Ain) is referred to as max and a minimum value thereof is referred to as min, description will be made by assuming that a relationship of max>Vth>Vcen>min is satisfied for the sake of convenience. The relationship may be max>Vcen>Vth>min.

In the same manner, the control unit 110 outputs a signal OCb having the following logic level with respect to the trapezoidal waveform of the drive signal COM-B to the drive circuit 120b. In detail, the control unit 110 causes the signal OCb to be in an H level during a period in which a voltage of the drive signal COM-B (signal Bin) decreases and a period in which the drive signal COM-B is constant at a voltage lower than the threshold value Vth, and other than that, to be in an L level during a period in which the voltage of the drive signal COM-B increases and a period in which the drive signal COM-B is constant at a voltage equal to or higher than the threshold value Vth.

Figure 6:
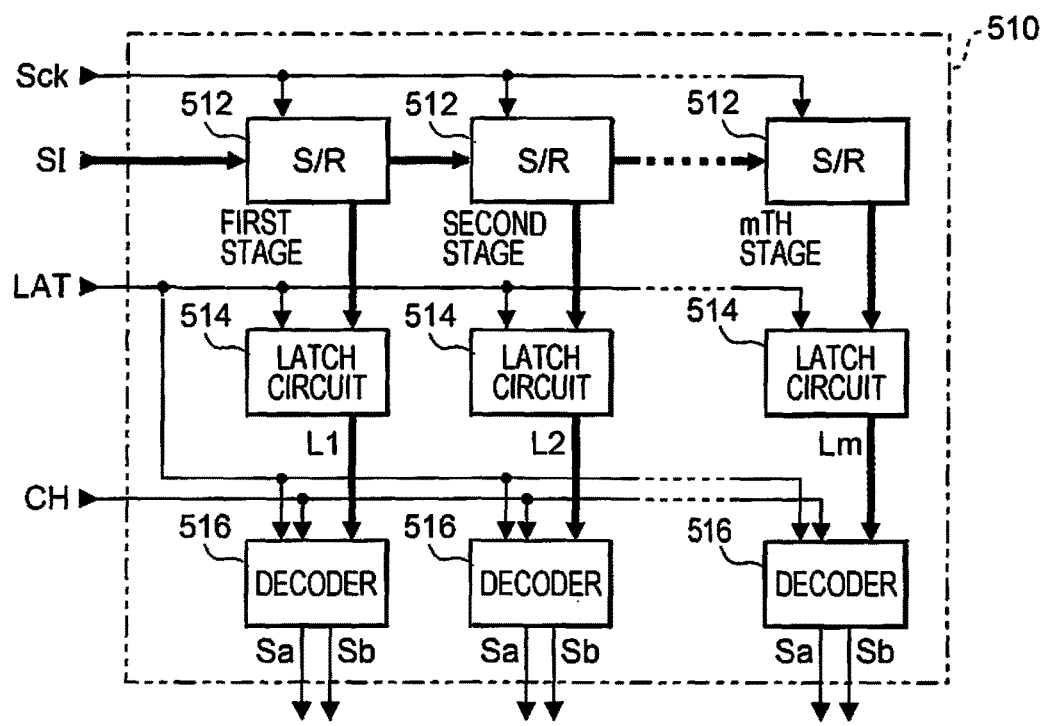
FIG. 6 is a diagram illustrating a configuration of a select control unit.

FIG. 6 is a diagram illustrating a configuration of the select control unit 510 of FIG. 4.

As illustrated in FIG. 6, a clock signal Sck, the print data SI, and the control signals LAT and CH are supplied to the select control unit 510. Each of multiple sets of a shift register (S/R) 512, a latch circuit 514, and a decoder 516 are provided in correspondence with each of the piezoelectric elements Pzt (nozzles N) in the select control unit 510.

The print data SI is data which defines dots to be formed by all the nozzles N in the head unit 3 which is focused during the print period Ta. In the present embodiment, in order to represent the four gradations of no record, a small dot, a medium dot, and a large dot, the print data for one nozzle is configured by two bits of a most significant bit (MSB) and a least significant bit (LSB).

The print data SI is supplied in accordance with transport of the medium P for each nozzle N (piezoelectric element Pzt) in synchronization with the clock signal Sck. The shift register 512 has a configuration in which the print data SI of two bits is retained once in correspondence with the nozzle N.

In detail, shift registers 512 of total m stages corresponding tom piezoelectric elements Pzt (nozzles) are coupled in cascade, and the print data SI which is supplied to the shift register 512 of a first stage located at a left end in FIG. 6 is sequentially transmitted to the rear stage (downstream side) in accordance with the clock signal Sck.

In FIG. 6, in order to separately recognize the shift registers 512, the shift register 512 are sequentially referred to as a first stage, a second stage, . . . , an mth stage from the upstream side to which the print data SI is supplied.

The latch circuit 514 latches the print data SI retained in the shift register 512 at a rising edge of the control signal LAT.

The decoder 516 decodes the print data SI of two bits which are latched in the latch circuit 514, outputs select signals Sa and Sb for each of periods T1 and T2 which are defined by the control signal LAT and the control signal CH, and defines selection of the select unit 520.

Figures 7, 8:
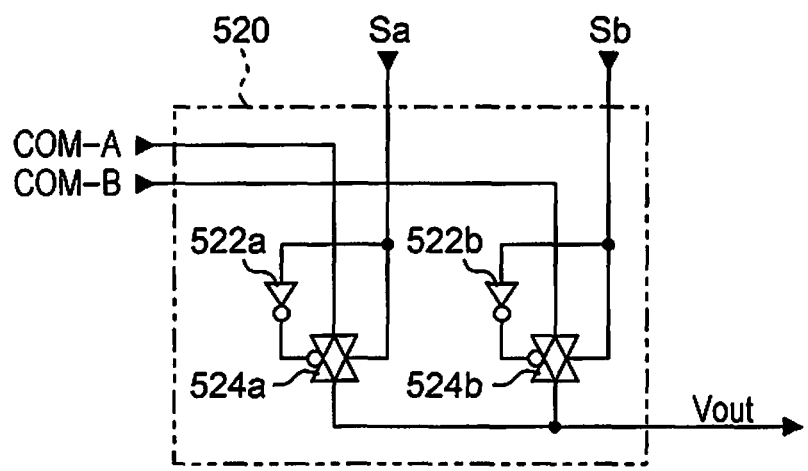
FIG. 7 is a diagram illustrating decoded content of a decoder.
FIG. 8 is a diagram illustrating a configuration of a select unit.

FIG. 7 is a diagram illustrating decoded content of the decoder 516.

In FIG. 7, the print data SI of two bits which are latched is referred to as an MSB and an LSB. In the decoder 516, if the latched print data SI is (0,1), it means that logic levels of the select signals Sa and Sb are respectively output as levels of H and L during the period T1, and levels of L and H during the period T2.

The logic levels of the select signals Sa and Sb are level-shifted by a level shifter (not illustrated) to a higher amplitude logic than the logic levels of the clock signal Sck, the print data SI, and the control signals LAT and CH.

FIG. 8 is a diagram illustrating a configuration of the select unit 520 of FIG. 4.

As illustrated in FIG. 8, the select unit 520 includes inverters (NOT circuit) 522a and 522b, and transfer gates 524a and 524b.

The select signal Sa from the decoder 516 is supplied to a positive control terminal to which a round mark is not attached in the transfer gate 524a, is logically inverted by the inverter 522a, and is supplied to a negative control terminal to which a round mark is attached in the transfer gate 524a. In the same manner, the select signal Sb is supplied to a positive control terminal of the transfer gate 524b, is logically inverted by the inverter 522b, and is supplied to a negative control terminal of the transfer gate 524b.

The drive signal COM-A is supplied to an input terminal of the transfer gate 524a, and the drive signal COM-B is supplied to an input terminal of the transfer gate 524b. The output terminals of the transfer gates 524a and 524b are coupled to each other, and are coupled to one terminal of the corresponding piezoelectric element Pzt.

If the select signal Sa is in an H level, the input terminal and the output terminal of the transfer gate 524a are electrically coupled (ON) to each other. If the select signal Sa is in an L level, the input terminal and the output terminal of the transfer gate 524a are electrically decoupled (OFF) from each other. In the same manner, the input terminal and the output terminal of the transfer gate 524b are also electrically coupled to each other or decoupled from each other in accordance with the select signal Sb.

As illustrated in FIG. 5, the print data SI is supplied to each nozzle in synchronization with the clock signal Sck, and is sequentially transmitted to the shift registers 512 corresponding to the nozzles. Thus, if supply of the clock signal Sck is stopped, the print data SI corresponding to each nozzle is retained in each of the shift registers 512.

If the control signal LAT rises, each of the latch circuits 514 latches all of the print data SI retained in the shift registers 512. In FIG. 5, the number in L1, L2, . . . , Lm indicates the print data SI which is latched by the latch circuits 514 corresponding to the shift registers 512 of the first stage, the second stage, . . . , the mth stage.

The decoder 516 outputs the logic levels of the select signals Sa and Sb in the content illustrated in FIG. 7 in accordance with the size of the dots which are defined by the latched print data SI during the periods T1 and T2.

That is, first, the decoder 516 sets the select signals Sa and Sb to levels of H and L during the period T1 and levels of H and L even during the period T2, if the print data SI is (1,1) and the size of the large dot is defined. Second, the decoder 516 sets the select signals Sa and Sb to levels of H and L during the period T1 and levels of L and H during the period T2, if the print data SI is (0,1) and the size of the medium dot is defined. Third, the decoder 516 sets the select signals Sa and Sb to levels of L and L during the period T1 and levels of L and H during the period T2, if the print data SI is (1,0) and the size of the small dot is defined. Fourth, the decoder 516 sets the select signals Sa and Sb to levels of L and H during the period T1 and levels of L and L during the period T2, if the print data SI is (0,0) and no recode is defined.

Figure 9:
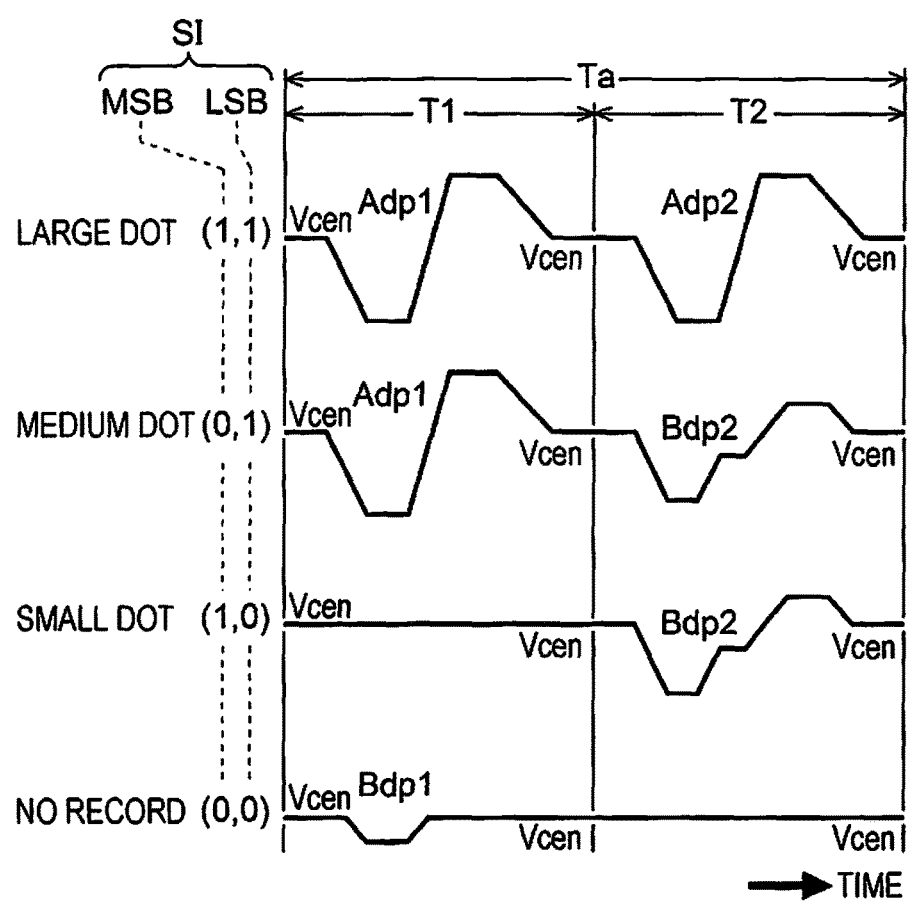
FIG. 9 is a diagram illustrating the drive signals which are supplied from the select unit to a piezoelectric element.

FIG. 9 is a diagram illustrating waveforms of the drive signals which are selected in accordance with the print data SI and are supplied to one terminal of the piezoelectric element Pzt.

When the print data SI is (1,1), the select signals Sa and Sb become H and L levels during the period T1, and thus the transfer gate 524a is turned on, and the transfer gate 524b is turned off. Accordingly, the trapezoidal waveform Adp1 of the drive signal COM-A is selected during the period T1. Since the select signals Sa and Sb are in H and L levels even during the period T2, the select unit 520 selects the trapezoidal waveform Adp2 of the drive signal COM-A.

In this way, if the trapezoidal waveform Adp1 is selected during the period T1, the trapezoidal waveform Adp2 is selected during the period T2, and the selected waveforms are supplied to one terminal of the piezoelectric element Pzt as drive signals, ink of an approximately medium amount is ejected twice from the nozzle N corresponding to the piezoelectric element Pzt. Accordingly, each ink is landed on and combined with the medium P, and as a result, a large dot is formed as defined by the print data SI.

When the print data SI is (0,1), the select signals Sa and Sb become H and L levels during the period T1, and thus the transfer gate 524a is turned on, and the transfer gate 524b is turned off. Accordingly, the trapezoidal waveform Adp1 of the drive signal COM-A is selected during the period T1. Next, since the select signals Sa and Sb are in L and H levels during the period T2, the trapezoidal waveform Bdp2 of the drive signal COM-B is selected.

Hence, ink of an approximately medium amount and an approximately small amount is ejected twice from the nozzle N. Accordingly, each ink is landed on and combined with the medium P, and as a result, a medium dot is formed as defined by the print data SI.

When the print data SI is (1,0), the select signals Sa and Sb become all L levels during the period T1, and thus the transfer gates 524a and 524b are turned off. Accordingly, the trapezoidal waveforms Adp1 and Bdp1 are not selected during the period T1. If the transfer gates 524a and 524b are all turned off, a path from a coupling point of the output terminals of the transfer gates 524a and 524b to one terminal of the piezoelectric element Pzt becomes a high impedance state in which the path is not electrically coupled to any portion. However, both terminals of the piezoelectric element Pzt retain a voltage (Vcen−$V_{BS}$) shortly before the transfer gates are turned off, by capacitance included in the piezoelectric element Pzt itself.

Next, since the select signals Sa and Sb are in L and H levels during the period T2, the trapezoidal waveform Bdp2 of the drive signal COM-B is selected. Accordingly, ink of an approximately small amount is ejected from the nozzle N only during the period T2, and thus small dot is formed on the medium P as defined by the print data SI.

When the print data SI is (0,0), the select signals Sa and Sb become L and H levels during the period T1, and thus the transfer gates 524a is turned off and the transfer gate 524b is turned on. Accordingly, the trapezoidal waveforms Bdp1 of the drive signal COM-B is selected during the period T1. Next, since both the select signals Sa and Sb are in L levels during the period T2, neither of the trapezoidal waveforms Adp2 and Bdp2 is selected.

Accordingly, ink near the nozzle N just slightly vibrates during the period T1, and the ink is not ejected, and thus, as a result, dots are not formed, that is, no record is made as defined by the print data SI.

In this way, the select unit 520 selects (or does not select) the drive signals COM-A and COM-B in accordance with instruction of the select control unit 510, and applies the selected signal to one terminal of the piezoelectric element Pzt. Accordingly, each of the piezoelectric elements Pzt is driven in accordance with the size of the dot which is defined by the print data SI.

The drive signals COM-A and COM-B illustrated in FIG. 5 are just an example. Actually, combinations of various waveforms which are prepared in advance are used in accordance with properties, transport speed, or the like of the medium P.

In addition, here, an example in which the piezoelectric element Pzt is bent upwardly in accordance with a decrease of a voltage is used, but if a voltage which is applied to the drive electrodes 72 and 76 is inverted, the piezoelectric element Pzt is bent downwardly in accordance with a decrease of the voltage. Accordingly, in a configuration in which the piezoelectric element Pzt is bent downwardly in accordance with a decrease of a voltage, the drive signals COM-A and COM-B illustrated in the figure have waveforms which are inverted by using the voltage Vcen as a reference.

Next, the drive circuit 120a and 120b of the main substrate 100 will be described.

In relation to symbols of the drive circuits, a symbol of a side on which the drive signal COM-A is output is unified as 120a, and a symbol of a side on which the drive signal COM-B is output is unified as 120b, but since there are several aspects as will be describe below, there is a case where parenthesis such as a drive circuit (Example 1) or a drive circuit (Example 2) is attached instead of a symbol so that each of them is distinguished in the same manner as in the printing apparatus.

Hence, in relation to the drive circuit (Example 1), the drive circuit 120a on a side on which the drive signal COM-A (COM-B) is output will be first described as an example.

Figure 10:
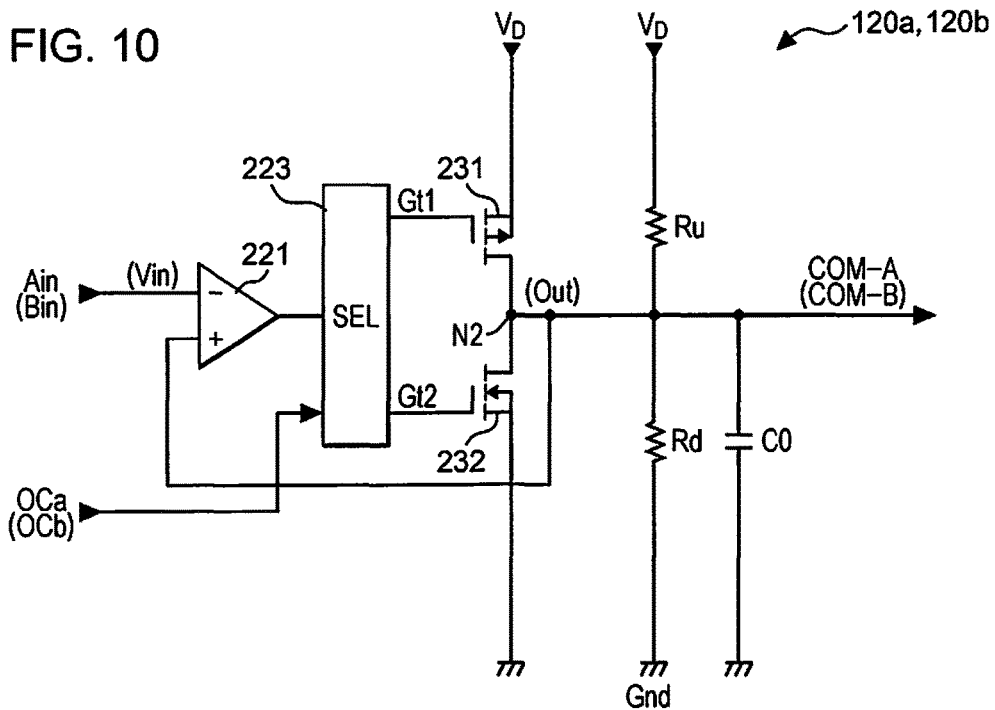
FIG. 10 is a diagram illustrating a configuration of a drive circuit (Example 1) which is applied to the printing apparatus (Example 1)

FIG. 10 is a diagram illustrating the drive circuit (Example 1). As illustrated in this figure, the drive circuit 120a includes a differential amplifier 221, a selector 223, a pair of transistors, resistance elements Ru and Rd, and a capacitor C0.

A negative input terminal (−) of the differential amplifier 221 receives the signal Ain, and the drive signal COM-A (COM-B) which is an output is fed back to a positive input terminal (+) of the differential amplifier 221. Accordingly, the differential amplifier 221 amplifies a difference voltage which is obtained by subtracting a voltage of the negative input terminal (−) from a voltage of the positive input terminal (+), that is, a difference voltage which is obtained by subtracting a voltage Vin of the signal Ain (source drive signal) with a large amplitude that is an input from a voltage Out of the drive signal COM-A which is an output, and outputs the amplified voltage.

However, for example, the differential amplifier 221 uses a high potential side of a power supply as a voltage $V_D$, and uses a low potential side thereof as a ground Gnd, while not particularly illustrated. Accordingly, an output voltage is within a range from the ground Gnd to the voltage $V_D$.

There a case where an output signal of the differential amplifier 221 is also used as a signal for a switching operation which will be described below, but is also used as a signal for a linear operation. In a case where the output signal is used as the signal for the switching operation, an H level indicates the voltage $V_D$, and an L level indicates the ground Gnd of a zero voltage.

In addition, since the output signal of the differential amplifier 221 controls switching operations and linear operations of transistors 231 and 232 after all as will be described below, the output signal can be said to be a control signal for the transistors. In addition, as will be described below, there is also a case where a voltage of a drive signal is decreased and fed back and a source drive signal is voltage-amplified to output as the drive signal, and thus, it may be said that a signal based on the drive signal is fed back to the differential amplifier 221.

If the signal OCa is in an L level, the selector (select unit) 223 selects the output signal of the differential amplifier 221 as a signal Gt1, supplies the selected signal to a gate terminal of a transistor 231, selects an L level as a signal Gt2, and supplies the L level to a gate terminal of a transistor 232. Meanwhile, if the signal OCa is in an H level, the selector 223 selects an H level as the signal Gt1, supplies the signal to the gate terminal of the transistor 231, selects the output signal of the differential amplifier 221 as the signal Gt2, and supplies the selected signal to the gate terminal of the transistor 232.

In other words, there is provided a configuration in which, if the signal OCa is in an L level, the selector 223 selects the transistor 231 and supplies a difference signal which is the output signal of the differential amplifier 221 to the gate terminal of the transistor 231, and if the signal OCa is in an H level, the selector 223 selects the transistor 232, supplies the difference signal to the gate terminal of the transistor 232, and supplies a signal which turns off the transistor to the gate terminal of the unselected transistor as will be described below.

The pair of transistors are configured by transistors 231 and 232. The transistor 231 (high-side transistor) on a high side of these is, for example, a P-channel field effect transistor, and a high-side voltage $V_D$ is applied to a source terminal thereof. The transistor 232 (low-side transistor) on a low side is, for example, an N-channel field effect transistor, and a source terminal thereof is coupled to the ground Gnd which is a low side of the power supply.

Drain terminals of the transistors 231 and 232 are coupled to each other, and become a node N2 which is the output terminal of the drive circuit 120a (the output terminal of the amplifier). That is, the drive signal COM-A is configured to output from the node N2.

A voltage of the node N2 which is an output of the drive circuit 120a is referred to as Out, and a voltage of the signal Ain which is an input is referred to as Vin.

The node N2 is coupled to the positive input terminal (+) of the differential amplifier 221, and voltage of the node is pulled up to the voltage $V_D$ through the resistance element Ru (first resistance element), while being pulled down to the ground through the resistance element Rd (second resistance element). In addition, the capacitor C0 (output capacitor) is provided to prevent abnormal oscillation from occurring, one terminal thereof is coupled to the node N2, and the other terminal thereof is coupled to a constant potential, for example, the ground Gnd.

Since the differential amplifier 221 and the selector 223 generate the control signals of the transistors 231 and 232, both elements can be conceptualized as a control signal generation unit (control signal generator). In addition, in a case where the transistors 231 and 232 and the resistance elements Ru and Rd are considered as one block, a drive signal is output from the node N2, based on the control signal, and thus, the block can be conceptualized as an amplification unit (amplifier).

Here, the drive circuit 120a which outputs the drive signal COM-A will be described, but a configuration of the drive circuit 120b which outputs the drive signal COM-B is the same as the configuration of the drive circuit 120a, and only the input and output signals are different from each other. That is, in the drive circuit 120b which is denoted by a parenthesis of FIG. 10, the negative input terminal (−) of the differential amplifier 221 receives the signal Bin and the selector 223 receives the signal OCb, while the drive signal COM-B is output from the node N2.

Next, operations of the drive circuits 120a and 120b will be described by using the drive circuit 120a which outputs the drive signal COM-A as an example.

Figure 11:
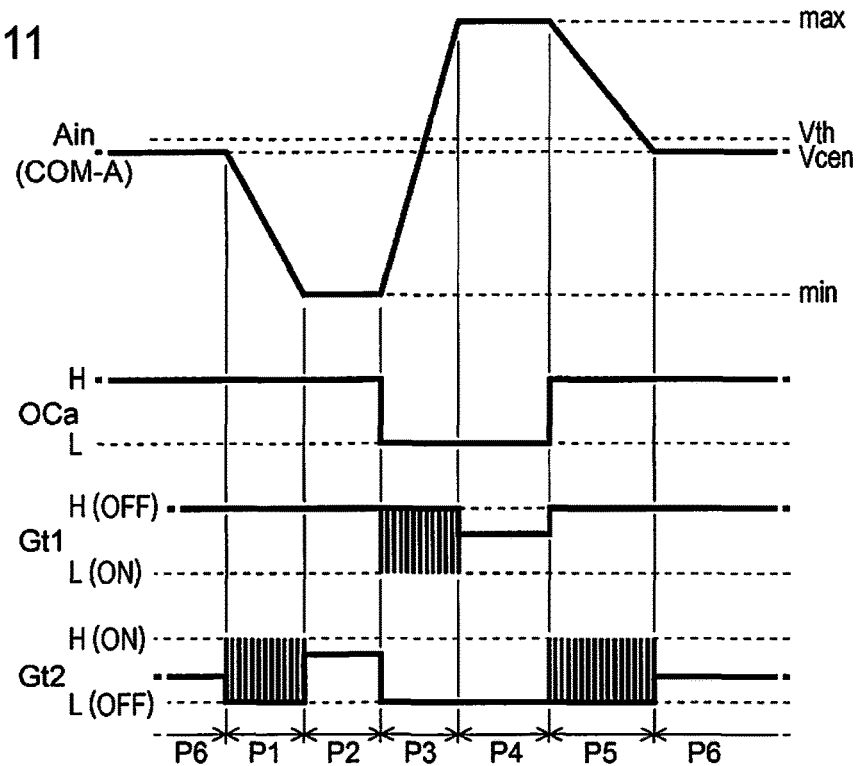
FIG. 11 is a diagram illustrating an operation of the drive circuit (Example 1)

FIG. 11 is a diagram illustrating the operation of the drive circuit 120a.

In this figure, the signal Ain is a signal into which the drive signal COM-A is not impedance-converted, thus, having approximately the same waveform as the drive signal COM-A. In addition, as described above, the drive signal COM-A has a waveform in which two trapezoidal waveforms Adp1 and Adp2 which are the same are repeated during a print period Ta, and thus, the signal Ain also has the same waveform which is repeated.

FIG. 11 illustrates one trapezoidal waveform of the repeating waveforms. In addition, in the figure, a period P1 is a period in which the voltage Vin of the signal Ain decreases from the voltage Vcen to the minimum value min, a period P2 subsequent to the period P1 is a period in which the voltage Vin is constant at the minimum value min, a period P3 subsequent to the period P2 is a period in which the voltage Vin increases from the minimum value min to the maximum value, a period P4 subsequent to the period P3 is a period in which the voltage Vin is constant at the maximum value max, and a period P5 subsequent to the period P4 is a period in which the voltage Vin decreases from the maximum value max to the voltage Vcen.

In relation to each voltage waveform of FIG. 11, a vertical scale denoting a voltage is not necessarily assigned for the sake of convenient description.

First, the period P1 is a voltage decrease period of the drive signal COM-A (Ain). Accordingly, since the signal OCa is in an H level during the period P1, the selector 223 selects an H level as the signal Gt1, and selects the output signal of the differential amplifier 221 as the signal Gt2.

Since the signal Gt1 is in an H level during the period P1, the P-channel transistor 231 is turned off.

Meanwhile, first, the voltage Vin of the signal Ain decreases ahead of the voltage Out of the node N2 during the period P1. In other words, the voltage Out becomes a voltage higher than or equal to the voltage Vin. Accordingly, a voltage of the output signal of the differential amplifier 221 which selected as the signal Gt2 increases in accordance with the difference voltage between two voltages, and swings to an H level. If the signal Gt2 is in an H level, the transistor 232 is turned on, and thus, the voltage Out decreases. Actually, the voltage Out is not decreased to the ground Gnd immediately, and is decreased slowly by the capacitor C0, the piezoelectric element Pzt with capacitance, or the like.

If the voltage Out decreases to be lower than the voltage Vin, the signal Gt2 is in an L level, and the transistor 232 is turned off, but since the voltage Vin is low, the voltage Out increases to be higher than or equal to the voltage Vin again.

Accordingly, the signal Gt2 is in an H level, and thereby, the transistor 232 is turned on again.

During the period P1, the signal Gt2 is alternately switched between an H level and an L level, and thereby, the transistor 232 performs an operation of repeating turn-on and turn-off, that is, a switching operation. By the switching operation, control of causing the voltage Out to follow a decrease of the voltage Vin is performed.

Next, the period P2 is a period in which the drive signal COM-A (Ain) is constant at the minimum value min of a voltage lower than the threshold voltage Vth. Accordingly, the signal OCa is in an H level subsequent to the period P1 during the period P2, and thus, the selector 223 selects an H level as the signal Gt1 and selects the output signal of the differential amplifier 221 as the signal Gt2.

The voltage Out is controlled to follow the voltage Vin during the period P1, but content of the control is the switching operation of the transistor 232 as described above. Accordingly, there is a case where, shortly after the period P2 starts, that is, shortly after the voltage Vin turns to be constant at the minimum value min, the voltage Out does not coincide with the voltage Vin.

In this case, if the voltage Out is higher than the voltage Vin, the voltage of the signal Gt2, that is, the output voltage of the differential amplifier 221 also increases, and thus, resistance between a source and a drain of the transistor 232 decreases, thereby, decreasing the voltage Out of the node N2. Meanwhile, if the voltage Out is lower than the voltage Vin, the voltage of the signal Gt2 also decreases, and thus, the resistance between the source and the drain of the transistor 232 increases, thereby, increasing the voltage Out.

Hence, during the period P2, the voltage Out becomes constant at a point where a direction in which the voltage Out decreases and a direction in which the voltage increases balance each other, that is, a point where the voltage Out coincides with the voltage Vin (minimum value min). At this time, the transistor 232 performs a linear operation, and the signal Gt2 is constant at a voltage in which the voltage Out that is determined by the resistance between the source and the drain of the transistor 232 and the resistance elements Ru and Rd becomes the voltage Vin.

FIG. 11 illustrates a state where the voltage of the signal Gt2 changes briefly from the period P1 to the period P2 thereby becoming immediately constant.

The period P3 is a voltage increase period of the drive signal COM-A (Ain). Accordingly, the signal OCa is in an L level during the period P3, and thus, the selector 223 selects the output signal of the differential amplifier 221 as the signal Gt1, and selects an L level as the signal Gt2.

The signal Gt2 is in an L level during the period P3, and thus, the N-channel transistor 232 is turned off.

Meanwhile, first, the voltage Vin increases ahead of the voltage Out during the period P3. In other words, the voltage Out decreases to be lower than the voltage Vin. Accordingly, the voltage of the output signal of the differential amplifier 221 which is selected as the signal Gt1 decreases in accordance with the difference voltage between two voltages, and approximately swings to an L level. If the signal Gt1 is in an L level, the transistor 231 is turned on, and thus, the voltage Out increases. Actually, the voltage Out is not increased to the voltage $V_D$ immediately, and is increased slowly by the capacitor C0, the piezoelectric element Pzt with capacitance, or the like.

If the voltage Out is a voltage higher than or equal to the voltage Vin, the signal Gt2 is in an H level, and the transistor 231 is turned off. If the transistor 231 is turned off, an increase of the voltage Out is stopped, but since the voltage Vin increases, the voltage Out decreases to be lower than the voltage Vin again. Accordingly, the signal Gt1 is in an L level, and the transistor 231 is turned on again.

The signal Gt1 is alternately switched between an H level and an L level during the period P3, and thereby, the transistor 231 performs a switching operation. By the switching operation, control of causing the voltage Out to follow an increase of the voltage Vin is performed.

The period P4 is a period in which the drive signal COM-A (Ain) is constant at a voltage higher than or equal to the threshold voltage Vth. Accordingly, during the period P2, the signal OCa is in an L level subsequent to the period P3, and thus, the selector 223 selects the output signal of the differential amplifier 221 as the signal Gt1, and selects an L level as the signal Gt2.

The voltage Out is controlled to follow the voltage Vin during the period P3, but content of the control is the switching operation of the transistor 231 as described above, and thus, there is a case where, shortly after the voltage Vin turns to be constant at the maximum value max during the period P4, the voltage Out does not coincide with the voltage Vin of the signal Ain.

In this case, if the voltage Out is higher than the voltage Vin, the voltage of the signal Gt1, that is, the output voltage of the differential amplifier 221 also increases, and thus, resistance between a source and a drain of the transistor 231 increases, thereby, decreasing the voltage Out of the node N2. Meanwhile, if the voltage Out is lower than the voltage Vin, the voltage of the signal Gt1 also decreases, and thus, the resistance between the source and the drain of the transistor 231 decreases, thereby, increasing the voltage Out.

Hence, during the period P4, the voltage Out becomes constant at a point where a direction in which the voltage Out decreases and a direction in which the voltage increases balance each other, that is, a point where the voltage Out coincides with the voltage Vin (maximum value max). At this time, the transistor 232 performs a linear operation, and the signal Gt2 is constant at a voltage in which the voltage Out that is determined by the resistance between the source and the drain of the transistor 232 and the resistance elements Ru and Rd becomes the voltage Vin (maximum value max).

FIG. 11 illustrates a state where the voltage of the signal Gt2 changes briefly from the period P3 to the period P4 thereby becoming immediately constant.

The period P5 is a voltage decrease period of the drive signal COM-A (Ain). Accordingly, an operation in the period P5 is the same as in the period P1. That is, the signal Gt2 is alternately switched between an H level and an L level, and thereby, the transistor 232 performs a switching operation, and control of causing the voltage Out of the node N2 to follow a decrease of the voltage Vin is performed. In relation to the period P4, the signal OCa is switched to an H level during the period P5, and thus, the selector 223 selects an H level as the signal Gt1, and selects the output signal of the differential amplifier 221 as the signal Gt2.

A period P6 subsequent to the period P5 is a period in which the drive signal COM-A (Ain) is constant at the voltage Vcen lower than the threshold voltage Vth. Accordingly, the signal OCa is in an H level subsequent to the period P5 during the period P6, and thus, the selector 223 selects an H level as the signal Gt1 and selects the output signal of the differential amplifier 221 as the signal Gt2.

The control of causing the voltage Out to follow the voltage Vin of the signal Ain is performed during the period P5, but there is a case where, shortly after the voltage Vin turns to be constant at the voltage Vcen during the period P6, the voltage Out does not coincide with the voltage Vin of the signal Ain. However, the voltage Out is constant at a point in which the voltage coincides with the voltage Vin (Vcen), in the same manner shortly after being turned to the period P2. At this time, the transistor 232 performs a linear operation, and the signal Gt2 is constant at a voltage in which the voltage Out that is determined by the resistance between the source and the drain of the transistor 232 and the resistance elements Ru and Rd becomes the voltage Vin (Vcen).

FIG. 11 illustrates a state where the voltage of the signal Gt2 changes briefly from the period P5 to the period P6 thereby being immediately balanced.

According to the drive circuit 120a illustrated in FIG. 10, the control of causing the voltage Out of the drive signal COM-A to follow the voltage Vin of the signal Ain is performed by the following operation for each of the periods P1 to P6.

That is, the controls of causing the voltage Out to follow the voltage Vin are performed, by the switching operation of the transistor 232 during the periods P1 and P5 in which the voltage Vin decreases, by the linear operation of the transistor 232 during the period P2 and P6 in which the voltage Vin is constant at a value lower than the threshold voltage Vth, by the switching operation of the transistor 231 during the period P3 in which the voltage Vin increases, and by the linear operation of the transistor 231 during the period P4 in which the voltage Vin is constant at a value higher than the threshold voltage Vth, respectively.

According to the drive circuit 120a, the transistors 231 and 232 do not perform an switching operation during the periods P2, P4, and P6 in which the voltage Vin is constant, compared with class D amplification in which switching is continuously performed. In addition, the class D amplification requires a low pass filter (LPF) which demodulates a switching signal, particularly, an inductor such as a coil, but the drive circuit 120a does not require the LPF. Accordingly, according to the drive circuit 120a, it is possible to reduce power which is consumed in the switching operation or the LPF, compared with the class D amplification, and to simplify and miniaturize a circuit.

Description is made in which, in the drive circuit (Example 1), the transistor 231 performs a switching operation during the period P3 in which the output voltage VOUT (the voltage Vin of the signal Ain) of the drive signal COM-A increases, and the transistor 232 performs a switching operation during the periods P1 and P5 in which the output voltage VOUT decreases, but in a case where the number of piezoelectric elements Pzt to be coupled is large, a linear operation can also be performed in a relationship of a time constant which is determined by ON-resistance of a transistor and a load capacitance.

In addition, description is made in which, in the drive circuit (Example 1), the transistor 231 performs a linear operation during the period P4 in which the voltage Vout is constant at a voltage higher than or equal to the threshold voltage Vth, and the transistor 232 performs a linear operation during the periods P2 and P6 in which the voltage Vout is constant at a voltage lower than the threshold voltage Vth, but a switching operation can also be performed by the same reason.

The drive signal COM-A (COM-B) is not limited to a trapezoidal waveform, and may be a waveform with a continuous slope, such as a sine wave. In the drive circuit (Example 1), in a case where the waveform is output, if a change of the voltage Vout (voltage Vin of the signal Ain) of the drive signal COM-A is relatively large, specifically, one of the transistors 231 and 232 performs a switching operation during a period (first period) in which a voltage changes to a predetermined voltage or higher per unit time. Meanwhile, if the change of the voltage Vout is relatively small, specifically, one of the transistors 231 and 232 performs a linear operation during a period (second period) in which the voltage changes to a voltage lower than the predetermined voltage per unit time or the voltage is constant without a change.

In addition, in the drive circuit (Example 1), a destination of pull-up of the resistance element Ru may be a voltage higher than or equal to a maximum voltage of the drive signal COM-A, and thus, the destination is a power supplying line of the voltage $V_D$ in this example. In addition, a destination of pull-down of the resistance element Rd may be a voltage lower than or equal to a minimum voltage of the drive signal COM-A, and thus, the destination is the ground Gnd in this example.

Here, the drive circuit 120a which outputs the drive signal COM-A is described as an example, but the drive circuit 120b which outputs the drive signal COM-B also performs the same operation. A waveform of the drive signal COM-B is the same as the waveform illustrated in FIG. 5, the signal OCb is the same as described above, and thus, a waveform thereof is not illustrated. The drive circuit 120b also outputs the drive signal COM-B of the voltage Vout following the voltage of the signal Bin.

However, in the configuration illustrated in FIG. 10, the resistance elements Ru and Rd are coupled electrically and directly between the voltage $V_D$ of the power supply and the ground Gnd, and thus, a through-current flows continuously, and there is room for reducing power consumption. Hence, next, a drive circuit (Example 2) having a different configuration whose power consumption is reduced will be described.

Figure 12A:
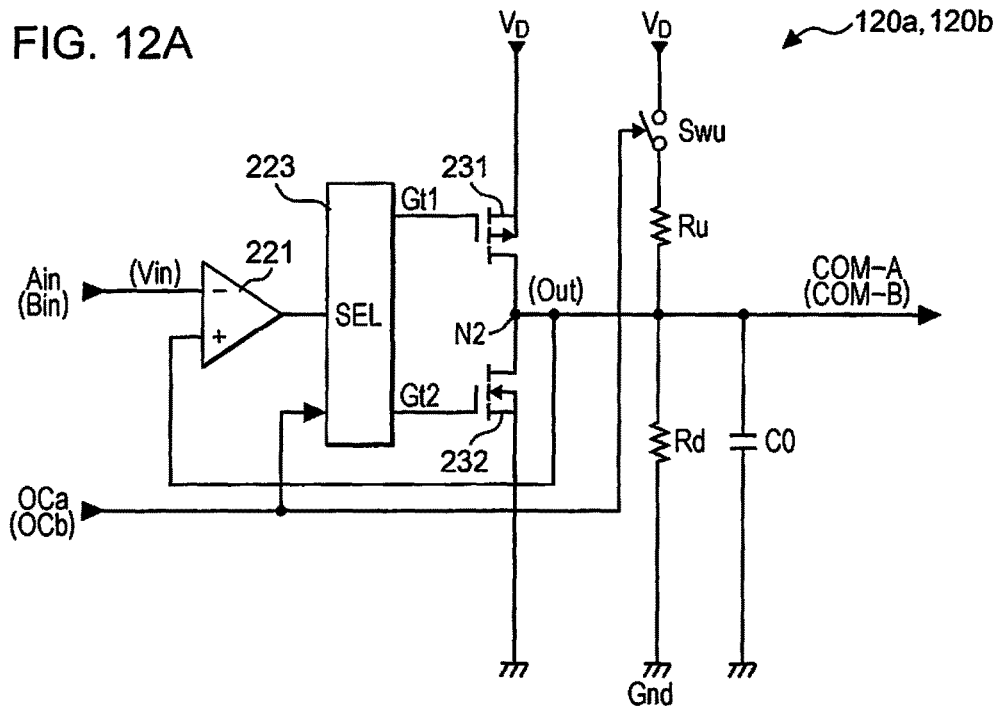
FIG. 12A is a diagram illustrating a drive circuit (Example 2)

FIG. 12A is a diagram illustrating a configuration of the drive circuit (Example 2). The drive circuit (Example 2) illustrated in the figure is different from the drive circuit (Example 1) illustrated in FIG. 10 in that the drive circuit (Example 2) includes a switch Swu. The switch Swu (first switch) is electrically coupled to the resistance element Ru in series between the power supplying line of the voltage $V_D$ on a high side of the power supply voltage and the node N2, is turned on if the signal OCa is in an H level, and is turned off if the signal OCa is in an L level. Accordingly, in a case where the output signal of the differential amplifier 221 is selected by the selector 223 as the signal Gt1, that is, during the periods P1, P2, P5, and P6, the switch Swu is turned on. Meanwhile, in a case where the output signal of the differential amplifier 221 is selected by the selector 223 as the signal Gt2, that is, during the periods P3 and P4, the switch Swu is turned off. Accordingly, the drive circuit (Example 2) can reduce power which is consumed by the through-current, compared with the drive circuit (Example 1) illustrated in FIG. 10.

In the drive circuit (Example 2), the switch Swu is provided on a side of the resistance element Ru for pull-up, but another switch may also be provided on a side of the resistance element Rd for pull-down.

Figure 12B:
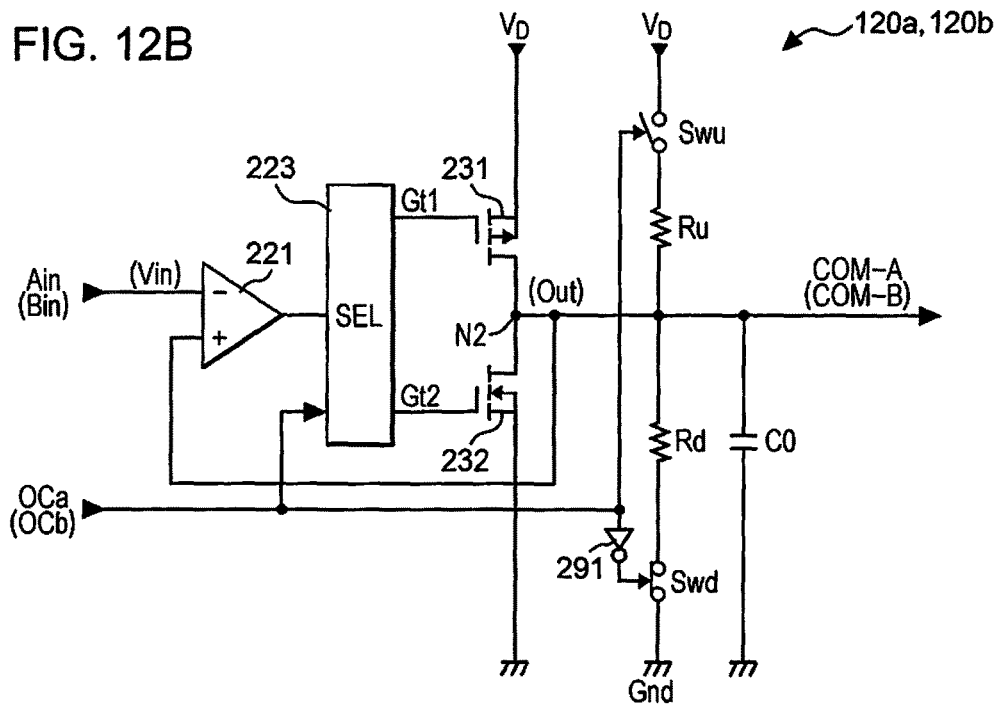
FIG. 12B is a diagram illustrating a drive circuit (Example 3)

FIG. 12B is a diagram illustrating a drive circuit (Example 3) including a switch Swd on a side of the resistance element Rd. In this figure, a NOT circuit 291 inverts a logic level of the signal OCa, and controls ON and OFF of the switch Swd. The switch Swd (second switch) is turned on if an output signal of the NOT circuit 291 is in an H level, and is turned off if the output signal is in an L level.

Accordingly, the switches Swu and Swd are turned on and off respectively and exclusively, and thereby, the through-current does not flow from the voltage $V_D$ on a high side of the power supply toward the ground Gnd through the resistance elements Ru and Rd. Accordingly, the drive circuit (Example 3) further reduces power consumption, compared with the drive circuit (Example 2).

As will be described below, the switch Swu may be configured to be turned off even during the periods P1 and P5, and the switch Swd may be configured to be turned off even during the period P3, but an independent signal which is the signal OCa is required, and thus, the control unit 110 or the like is complicated. In other words, the control unit 110 is used for the drive circuit (Example 2 or Example 3) in the same manner as for the drive circuit (Example 1), and thus, it is possible to reduce power consumption.

Here, functions of pull-up and pull-down of the node N2 will be described.

A case where pull-up is required is a case where the transistor 232 performs a linear operation during the periods P2 and P6 in which the signal Ain (the drive signal COM-A) is constant at a voltage lower than the threshold value Vth. In this case, the transistor 231 on a high side is turned off, and thus, it is necessary for the node N2 to be pulled up on a high side such that the voltage Out of the node N2 follows the signal Ain by the transistor 232.

Meanwhile, a case where pull-down is required is a case where the transistor 231 performs a linear operation during the period P4 in which the signal Ain (the drive signal COM-A) is constant at a voltage higher than the threshold value Vth. In this case, the transistor 232 on a low side is turned off, and thus, it is necessary for the node N2 to be pulled down on a low side such that the voltage Out of the node N2 follows the signal Ain by the transistor 231.

The signal OCa (OCb) can be generated by another circuit without being output from the control unit 110, by analyzing the data dA (dB) as follows.

For example, in relation to the data dA (dB), discrete values (data) which are temporally adjacent to each other are compared to each other, and if the discrete values are equal, the values are in a voltage-constant period, and by determining the discrete values in the constant period, it is possible to determine whether or not a voltage in the constant period is higher than or equal to the threshold voltage Vth. In addition, if, when voltage conversion is performed, the discrete value which is temporally later is larger than the discrete value which is temporally prior among the discrete values, the value is in a voltage increase period, and if, when voltage conversion is performed, the discrete value which is temporally later is smaller than the discrete value which is temporally prior, the value is in a voltage decrease period.

A signal which is obtained by performing analog conversion may be analyzed in the same manner as above, while not in the data dA (dB).

Hence, in the drive circuits (Example 1, Example 2, Example 3), a pair of transistors 231 and 232 operate with a power supply voltage ($V_D$-Gnd) in accordance with an amplitude of the drive signal COM-A (COM-B). As described above, since the voltage of the drive signal COM-A is approximately maximum 40 volts, the selector 223 and the differential amplifier 221 require high breakdown voltages. The reason is that the signal Gt1 is needs to be supplied to the gate terminal of the transistor 231 and the signal Gt2 is needs to be supplied to the gate terminal of the transistor 232.

Hence, a drive circuit (Example 4) having a different configuration in which the aforementioned problem is solved will be described hereinafter.

Figure 13:
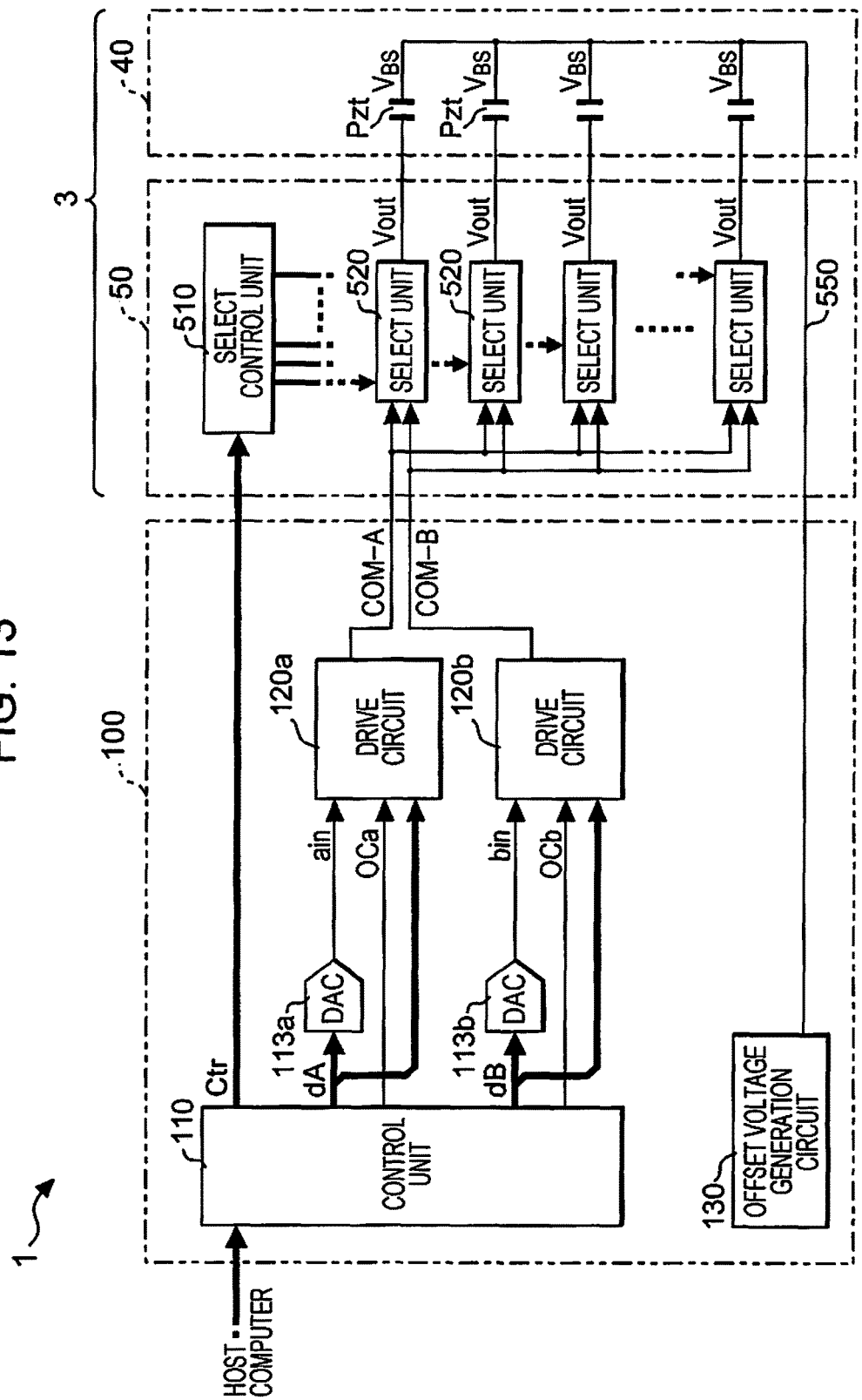
FIG. 13 is a block diagram illustrating an electrical configuration of a printing apparatus (Example 2)

FIG. 13 is a block diagram illustrating an electrical configuration of a printing apparatus (Example 2) including the drive circuit (Example 4). A first difference between the printing apparatus (Example 2) illustrated in FIG. 13 and the printing apparatus (Example 1) illustrated in FIG. 4 is that the printing apparatus (Example 2) does not include voltage amplifiers 115a and 115b. Accordingly, the signal ain with a small amplitude which is an output of the DAC 113a is supplied to the drive circuit 120a, and the signal bin with a small amplitude which is an output of the DAC 113b is supplied to the drive circuit 120b. In addition, a second difference is that the data dA is supplied to the drive circuit 120a and the data dB is supplied to the drive circuit 120b.

Figure 14A:
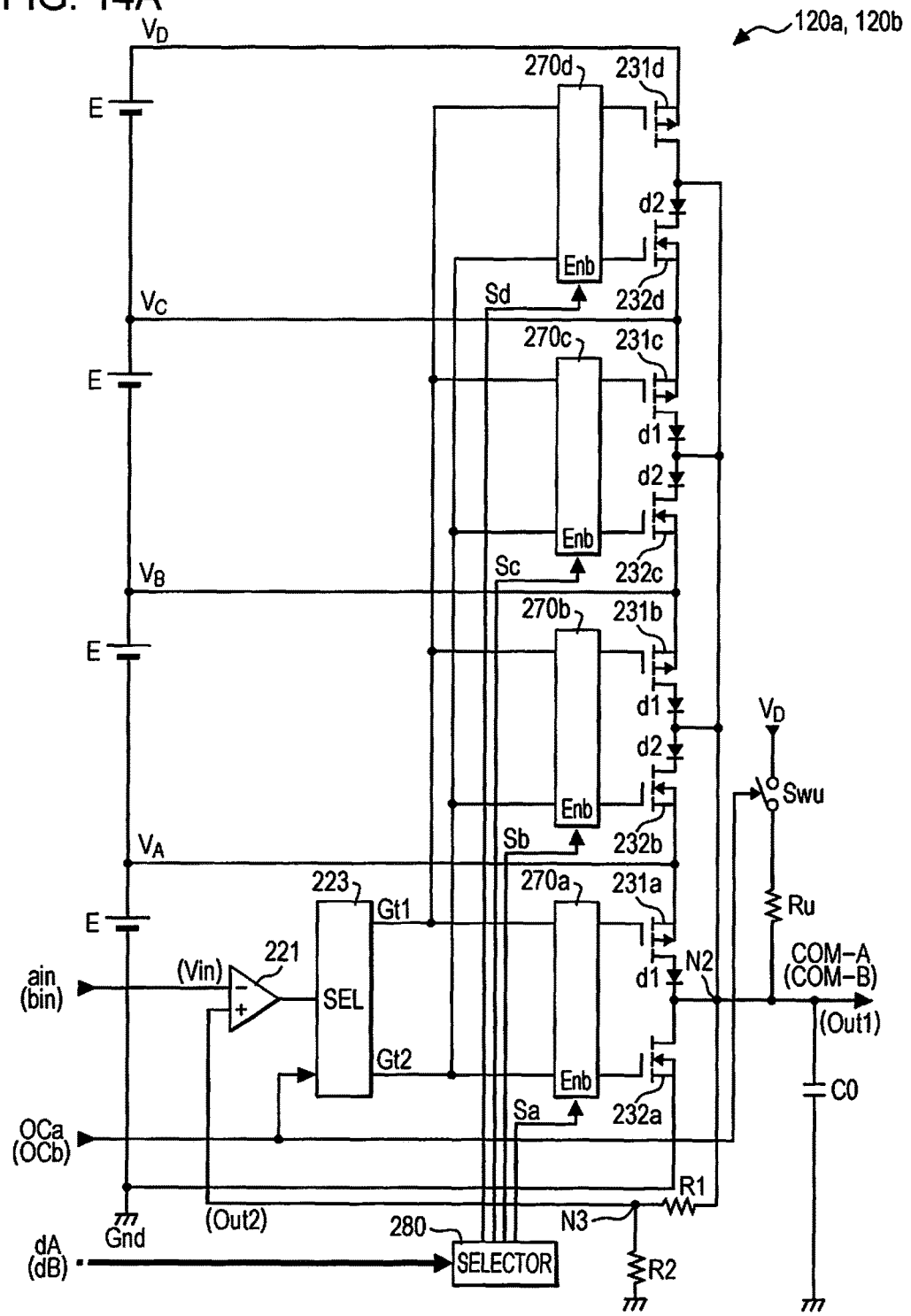
FIG. 14A is a diagram illustrating a drive circuit (Example 4) which is applied to the printing apparatus (Example 2)

FIG. 14A is a diagram illustrating a configuration of the drive circuit (Example 4).

As illustrated in the figure, the drive circuit 120a includes gate selectors 270a, 270b, 270c, and 270d, a selector 280, four pairs of transistors, resistance elements R1 and R2, the switch Swu, and the capacitor C0, in addition to four reference power supplies E, the differential amplifier 221, and the selector 223.

In the drive circuit (Example 4), voltages E, 2E, 3E, and 4E are respectively output as voltages $V_A$, $V_B$, $V_C$, and $V_D$ by the reference power supplies of four stages which are coupled in series, each reference power supply outputs a voltage E.

Figure 15:
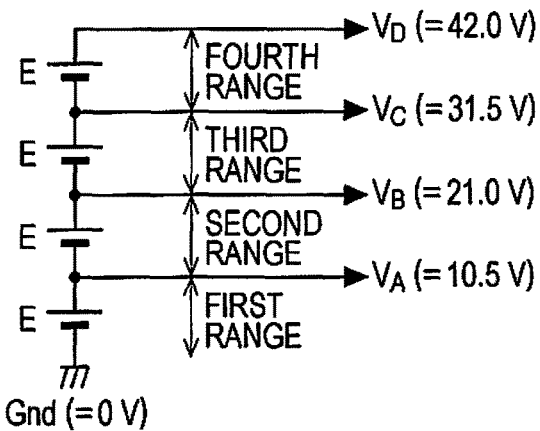
FIG. 15 is a diagram illustrating a voltage range of the drive circuit (Example 4)

FIG. 15 is a diagram illustrating voltages $V_A$, $V_B$, $V_C$, and $V_D$.

As illustrated in the figure, when the voltage E is set to, for example, 10.5 V, $V_A$, $V_B$, $V_C$, and $V_D$ are respectively 10.5 V, 21.0 V, 31.5 V, and 42.0 V. In the present embodiment, the following voltage ranges are defined in accordance with the voltages $V_A$, $V_B$, $V_C$, and $V_D$. That is, a range higher than or equal to the ground Gnd of zero volts and lower than the voltage $V_A$ is defined as a first range, a range higher than or equal to the voltage $V_A$ and lower than the voltage $V_B$ is defined as a second range, a range higher than or equal to the voltage $V_B$ and lower than the voltage $V_C$ is defined as a third range, and a range higher than or equal to the voltage $V_C$ and lower than the voltage $V_D$ is defined as a fourth range.

Returning to the description of FIG. 14A, the signal ain with a small amplitude is supplied to a negative input terminal (−) of the differential amplifier 221, and a voltage Out2 of a node N3 is applied to a positive input terminal (+) thereof. Accordingly, the differential amplifier 221 amplifies a difference voltage which is obtained by subtracting the voltage Vin of the signal ain which is an input from the voltage Out2, and outputs the amplified voltage.

In the differential amplifier 221 in the drive circuit (Example 4), a high side of the power supply is referred to as $V_A$, in a different manner from the drive circuit (Example 1). Accordingly, the output voltage of the differential amplifier 221 is within a range from the ground Gnd to the voltage $V_A$.

The selector 280 discriminates a range of the voltage Vin of the signal ain (bin) from the data dA (dB) which is supplied from the control unit 110 (refer to FIG. 13), and outputs select signals Sa, Sb, Sc, and Sd in accordance with the discrimination result as follows.

In detail, in a case where the voltage Vin which is defined by the data dA (dB) is discriminated to be higher than or equal to 0 V and lower than 1.05 V, that is, in a case where a voltage at the time of amplifying the voltage Vin 10 times is included in the first range, the selector 280 sets only the select signal Sa to an H level, and sets the other select signals Sb, Sc, and Sd to an L level. In addition, in a case where the voltage Vin which is defined by the data dA (dB) is discriminated to be higher than or equal to 1.05 V and lower than 2.10 V, that is, in a case where a voltage at the time of amplifying the voltage Vin 10 times is included in the second range, the selector 280 sets only the select signal Sb to an H level, and sets the other select signals Sa, Sc, and Sd to an L level. In the same manner, in a case where the voltage Vin which is defined by the data dA (dB) is discriminated to be higher than or equal to 2.10 V and lower than 3.15 V, that is, in a case where a voltage at the time of amplifying the voltage Vin 10 times is included in the third range, the selector 280 sets only the select signal Sc to an H level, and sets the other select signals Sa, Sb, and Sd to an L level. In case where the voltage Vin is discriminated to be higher than or equal to 3.15 V and lower than 4.20 V, that is, in a case where a voltage at the time of amplifying the voltage Vin 10 times is included in the fourth range, the selector 280 sets only the select signal Sd to an H level, and sets the other select signals Sa, Sb, and Sc to an L level.

Here, for the sake of convenient description, four pairs of transistors will be described.

In the example, the four pairs of transistors are configured by a pair of transistors 231a and 232a, a pair of transistors 231b and 232b, a pair of transistors 231c and 232c, and a pair of transistors 231d and 232d.

Among the respective pairs of transistors, the transistors 231a, 231b, 231c, an 231d on a high side are, for example, P-channel field effect transistors, and the transistors 232a, 232b, 232c, an 232d on a low side are, for example, N-channel field effect transistors.

In the transistor 231a, the voltage $V_A$ is applied to a source terminal thereof, and a drain terminal thereof is coupled to the node N2. In the transistor 232a, a source terminal thereof is coupled to the ground Gnd, and a drain terminal thereof is coupled to the node N2 in common.

In the same manner, in the transistor 231b (231c, 231d), the voltage $V_B$ ($V_C$, $V_D$) is applied to a source terminal thereof, and a drain terminal thereof is coupled to the node N2. In the transistor 232b (232c, 232d), the voltage $V_A$ ($V_B$, $V_C$) is applied to a source terminal thereof, and a drain terminal thereof is coupled to the node N2 in common.

For example, in a case where the transistor 231a is referred to as a first high-side transistor, the transistor 232a is referred to as a first low-side transistor, and the transistors 231a and 232a are referred to as a first pair of transistors, the transistor 231b is referred to as a second high-side transistor, the transistor 232b is referred to as a second low-side transistor, and the transistors 231b and 232b are referred to as a second pair of transistors.

While detailed description will be made below, when the gate selector 270a is enabled, the transistors 231a and 232a output drive signals by using the voltage $V_A$ and the ground Gnd as power supply voltages, and when the gate selector 270b is enabled, the transistors 231b and 232b output drive signals by using the voltage $V_B$ and the voltage $V_A$ as power supply voltages. In the same manner, when the gate selector 270c is enabled, the transistors 231c and 232c output drive signals by using the voltage $V_C$ and the voltage $V_B$ as power supply voltages, and when the gate selector 270d is enabled, the transistors 231d and 232d output drive signals by using the voltage $V_D$ and the voltage $V_C$ as power supply voltages.

In this configuration, the power supply voltage of the transistors 231a and 232a, the power supply voltage of the transistors 231b and 232b, the power supply voltage of the transistors 231c and 232c, and the power supply voltage of the transistors 231d and 232d are all 10.5 V.

When the select signal Sa supplied to an input terminal Enb is enabled to an H level, the gate selector 270a level-shifts the signals Gt1 and Gt2 which are output from the selector 223, and supplies the shifted signals to gate terminals of the transistors 231a and 232a, respectively. In detail, when being enabled, the gate selector 270a level-shifts a range from a minimum voltage to a maximum voltage of the signal Gt1 into the first range from the ground Gnd to the voltage $V_A$, supplies the shifted voltage to the gate terminal of the transistor 231a, level-shifts a range from a minimum voltage to a maximum voltage of the signal Gt2 into the first range, and supplies the shifted voltage to the gate terminal of the transistor 232a.

If description is made to be limited to the gate selector 270a, a range from minimum voltages to maximum voltages of the signals Gt1 and Gt2 coincides with the first range, and thus, when being enabled, the signals Gt1 and Gt2 are supplied to the gate terminals of the transistors 231a and 232a as it is.

When being enabled, the gate selector 270b level-shifts a range from a minimum voltage to a maximum voltage of the signal GO into the second range from the voltage $V_A$ to the voltage $V_B$, supplies the shifted voltage to the gate terminal of the transistor 231b, level-shifts a range from a minimum voltage to a maximum voltage of the signal Gt2 into the second range, and supplies the shifted voltage to the gate terminal of the transistor 232b. That is, if description is made to be limited to the gate selector 270b, when being enabled, the signals Gt1 and Gt2 to which 10.5 V is added are supplied to the gate terminals of the transistors 231b and 232b.

In the same manner, when being enabled, the gate selector 270c level-shifts a range from a minimum voltage to a maximum voltage of the signal Gt1 into the third range from the voltage $V_B$ to the voltage $V_C$, supplies the shifted voltage to the gate terminal of the transistor 231c, level-shifts a range from a minimum voltage to a maximum voltage of the signal Gt2 into the third range, and supplies the shifted voltage to the gate terminal of the transistor 232c. That is, if description is made to be limited to the gate selector 270c, when being enabled, the signals Gt1 and Gt2 to which 21.0 V is added are supplied to the gate terminals of the transistors 231c and 232c.

In the same manner, when being enabled, the gate selector 270d level-shifts a range from a minimum voltage to a maximum voltage of the signal Gt1 into the fourth range from the voltage $V_C$ to the voltage $V_D$, supplies the shifted voltage to the gate terminal of the transistor 231d, level-shifts a range from a minimum voltage to a maximum voltage of the signal Gt2 into the fourth range, and supplies the shifted voltage to the gate terminal of the transistor 232d. That is, if description is made to be limited to the gate selector 270d, when being enabled, the signals Gt1 and Gt2 to which 31.5 V is added are supplied to the gate terminals of the transistors 231d and 232d.

When the select signals supplied to the input terminals Enb are disabled to an L level, the gate selectors 270a, 270b, 270c, and 270d respectively output signals which turn off two transistors corresponding thereto. That is, if being disabled, the gate selectors 270a, 270b, 270c, and 270d forcibly convert the signal Gt1 to an H level, and forcibly convert the signal Gt2 to an L level.

Here, the H level and the L level are respectively a high-side voltage and a low-side voltage of the power supply voltage of each of the gate selectors 270a, 270b, 270c, and 270d. For example, the gate selector 270b uses the voltage $V_B$ and the voltage $V_A$ as a power supply voltage thereof, and thus, the voltage $V_B$ on a high side is an H level, and a voltage $V_A$ on a low side is an L level.

The node N2 is fed back to the positive input terminal (+) of the differential amplifier 221 through the resistance element R1. In this example, for the sake of convenience, the positive input terminal (+) of the differential amplifier 221 is referred to as the node N3, and a voltage of the node N3 is referred to as Out2.

The node N3 is coupled to the ground Gnd through the resistance element R2. Accordingly, the voltage Out2 of the node N3 is obtained by dividing a voltage of the voltage Out by a ratio which is defined by resistance values of the resistance elements R1 and R2, that is, R2/(R1+R2). In the present embodiment, a drop ratio is set to 1/10. In other words, the voltage Out2 is 1/10 of the voltage Out.

In addition, in the same manner as in the drive circuit (Example 2) illustrated in FIG. 12A, in the drive circuit (Example 4) of FIG. 14A, the switch Swu is electrically coupled to the resistance element Ru in series between the power supplying line of the voltage $V_D$ on a high side of the power supply voltage and the node N2. Meanwhile, pull-down of the node N2 is performed by the resistance elements R1 and R2 which drops the voltage Out of the node N2 and feeds back the dropped voltage to the differential amplifier 221, in the drive circuit (Example 4) illustrated in FIG. 14A. In other words, the resistance elements R1 and R2 of the drive circuit (Example 4) have both a function of pulling down the node N2 and a function of feeding back the voltage Out to the differential amplifier 221.

Diodes d1 and d2 are used for blocking reverse currents. A forward direction of the diode d1 is a direction toward the node N2 from the drain terminals of the transistors 231a, 231b, and 231c, and a forward direction of the diode d2 is a direction toward the drain terminals of the transistors 232b, 232c, and 232d from the node N2.

The voltage Out of the node N2 is not higher than the voltage $V_D$, and thus, it is not necessary to consider a reverse current. Accordingly, the diode d1 is not provided for the transistor 231d. In the same manner, the voltage Out of the node N2 is not lower than the ground Gnd of zero volts, and thus, the diode d2 is not provided for the transistor 232a.

Next, an operation of the drive circuit (Example 4) will be described by using a case where the drive signal COM-A is output as an example.

Figure 16:
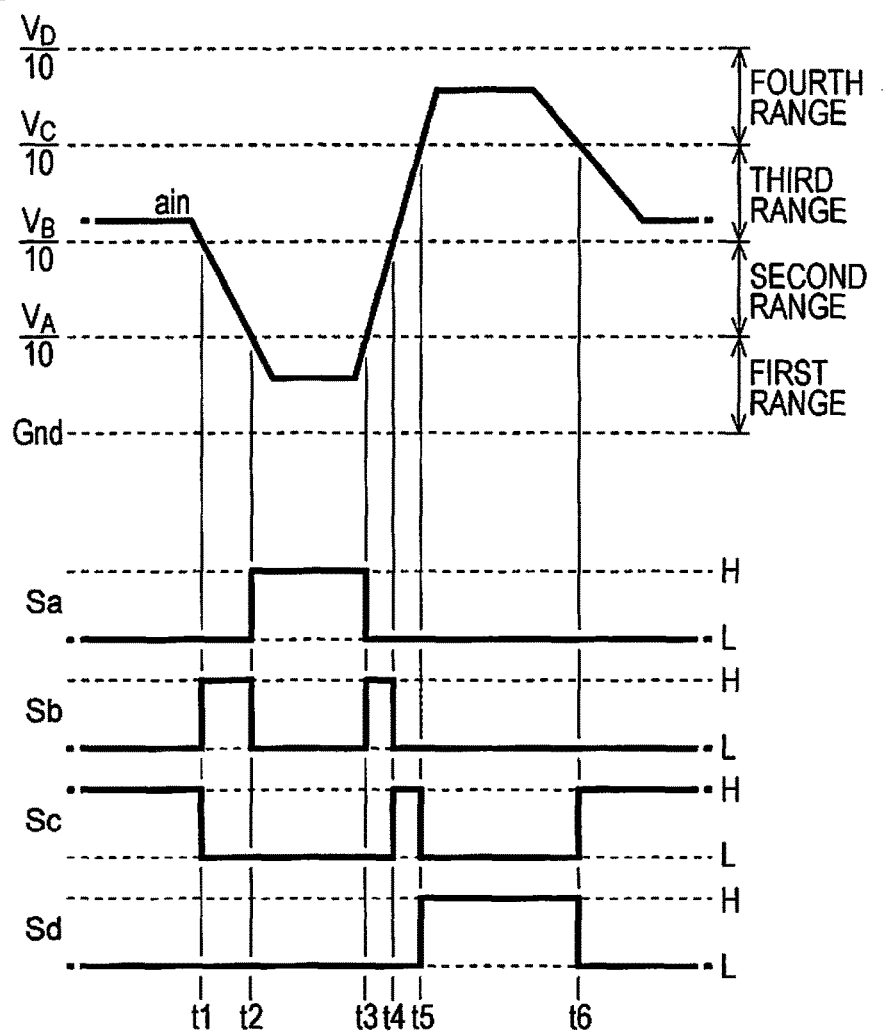
FIG. 16 is a diagram illustrating an operation of the drive circuit (Example 4)

FIG. 16 is a diagram illustrating the operation of the drive circuit (Example 4). As illustrated in the figure and described above, the signal ain is similar to the drive signal COM-A, but the signal ain has a small amplitude shortly after being converted by analog conversion of the DAC 113a, and is 1/10 of the voltage of the drive signal COM-A.

Accordingly, in a case where the first range to the fourth range which are defined by the voltages $V_A$, $V_B$, $V_C$, and $V_D$ are converted into a voltage range of the signal ain, the ranges are defined by the voltages $V_A/10$, $V_B/10$, $V_C/10$, and $V_D/10$. In detail, in the signal ain, a range higher than or equal to 0 V and lower than $V_A/10$ (=1.05 V) corresponds to the first range, a range higher than or equal to $V_A/10$ and lower than $V_B/10$ (=2.10 V) corresponds to the second range, a range higher than or equal to $V_B/10$ and lower than $V_C/10$ (=3.15 V) corresponds to the third range, and a range higher than or equal to $V_C/10$ and lower than $V_D/10$ (=4.20 V) corresponds to the fourth range.

First, in a case where it is discriminated from the data dA that the voltage Vin is in the third range during a period prior to timing t1, the selector 280 sets only the select signal Sc to an H level, and sets the other select signals Sa, Sb, and Sd to an L level, and thereby the gate selector 270c is enabled, and the other gate selectors 270a, 270b, and 270d are disabled. Hence, in this case, the transistors 231c and 232c output the drive signal COM-A by using the voltages $V_C$ and $V_B$ as power supply voltages.

Next, when the voltage Vin is in the second range during a period from timing t1 to timing t2, the selector 280 sets only the select signal Sb to an H level, and sets the other select signals Sa, Sc, and Sd to an L level, and thereby the gate selector 270b is enabled, and the other gate selectors 270a, 270c, and 270d are disabled. Hence, in this case, the transistors 231b and 232b output the drive signal COM-A by using the voltages $V_B$ and $V_A$ as power supply voltages.

When the voltage Vin is in the first range during a period from timing t2 to timing t3, the selector 280 sets only the select signal Sa to an H level, and as a result, only the gate selector 270a is enabled, and thereby the transistors 231a and 232a output the drive signal COM-A by using the voltages $V_A$ and the ground Gnd as power supply voltages.

The subsequent operations will be briefly described. Since only the gate selector 270b is enabled during a period from timing t3 to timing t4, the transistors 231b and 232b use the voltages $V_B$ and $V_A$ as power supply voltages. Since only the gate selector 270c is enabled during a period from timing t4 to timing t5, the transistors 231c and 232c use the voltages $V_C$ and $V_B$ as power supply voltages. Since only the gate selector 270d is enabled during a period from timing t5 to timing t6, the transistors 231d and 232d use the voltages $V_D$ and $V_C$ as power supply voltages. Since only the gate selector 270c is enabled from timing t6, the transistors 231c and 232c use the voltages $V_C$ and $V_B$ as power supply voltages. Thus, each transistors outputs the drive signal COM-A.

Meanwhile, the voltage Out2 of the node N3 is 1/10 of the voltage Out, and thus, in order to obtain the difference voltage, both scales are aligned.

In the drive circuit (Example 4), any one of the gate selectors 270a, 270b, 270c, and 270d is enabled in response to the voltage Vin of the signal ain, and thereby, an operation in which the voltage Out2 that is obtained by dropping the voltage Out by 1/10 follows the voltage Vin, in other words, an operation in which the voltage Out is amplified by 10 times the voltage Vin is performed by the pair of transistors corresponding to the enabled gate selector.

For example, in a case where the voltage Vin corresponds to the first range, the gate selector 270a is enabled, and thereby, the operation in which the voltage Out2 follows the voltage Vin is performed by the transistors 231a and 232a. In the same manner, in a case where the voltage Vin corresponds to the second range, the gate selector 270b is enabled, and thereby, the operation in which the voltage Out2 follows the voltage Vin is performed by the transistors 231b and 232b. In a case where the voltage Vin corresponds to the third range, the gate selector 270c is enabled, and thereby, the operation in which the voltage Out2 follows the voltage Vin is performed by the transistors 231c and 232c. In a case where the voltage Vin corresponds to the fourth range, the gate selector 270d is enabled, and thereby, the operation in which the voltage Out2 follows the voltage Vin is performed by the transistors 231d and 232d.

There is a case where the voltage Vin of the signal ain crosses (transition) adjacent regions in the first range to the fourth range. For example, referring to FIG. 16, transition of the voltage Vin from the third range to the second range is performed at timing t1. If the voltage Vin is in the third range, the gate selector 270c is enabled, and thereby, the voltage Out is controlled to be 10 times the voltage Vin by the transistors 231c and 232c. When transition of the voltage Vin from the third range to the second range is performed at the timing t1, the gate selector 270c is disabled, the gate selector 270b is enabled, and thereby, the voltage Out2 is controlled to follow the voltage Vin by the transistors 231b and 232b.

Here, a case where the transition of the voltage Vin from the third range to the second range is performed is described as an example, but other cases are the same, and for example, if transition from the second range to the first range is performed, the gate selector 270b is disabled, the gate selector 270a is enabled, and thereby, the subsequent voltage Out2 is controlled to follow the voltage Vin by the transistors 231a and 232a.

Although the drive circuit (Example 4) includes four pairs of transistors, only one pair of transistors operate continuously, and the other pairs of transistors are turned off. Thus, it is possible to reduce power consumption. In addition, according to the drive circuit (Example 4), the differential amplifier 221 and the selector 223 operate with relatively low voltages ($V_A$-Gnd) as power supply, and thus, it is possible to prevent sizes of elements or the like from increasing.

Figure 14B:
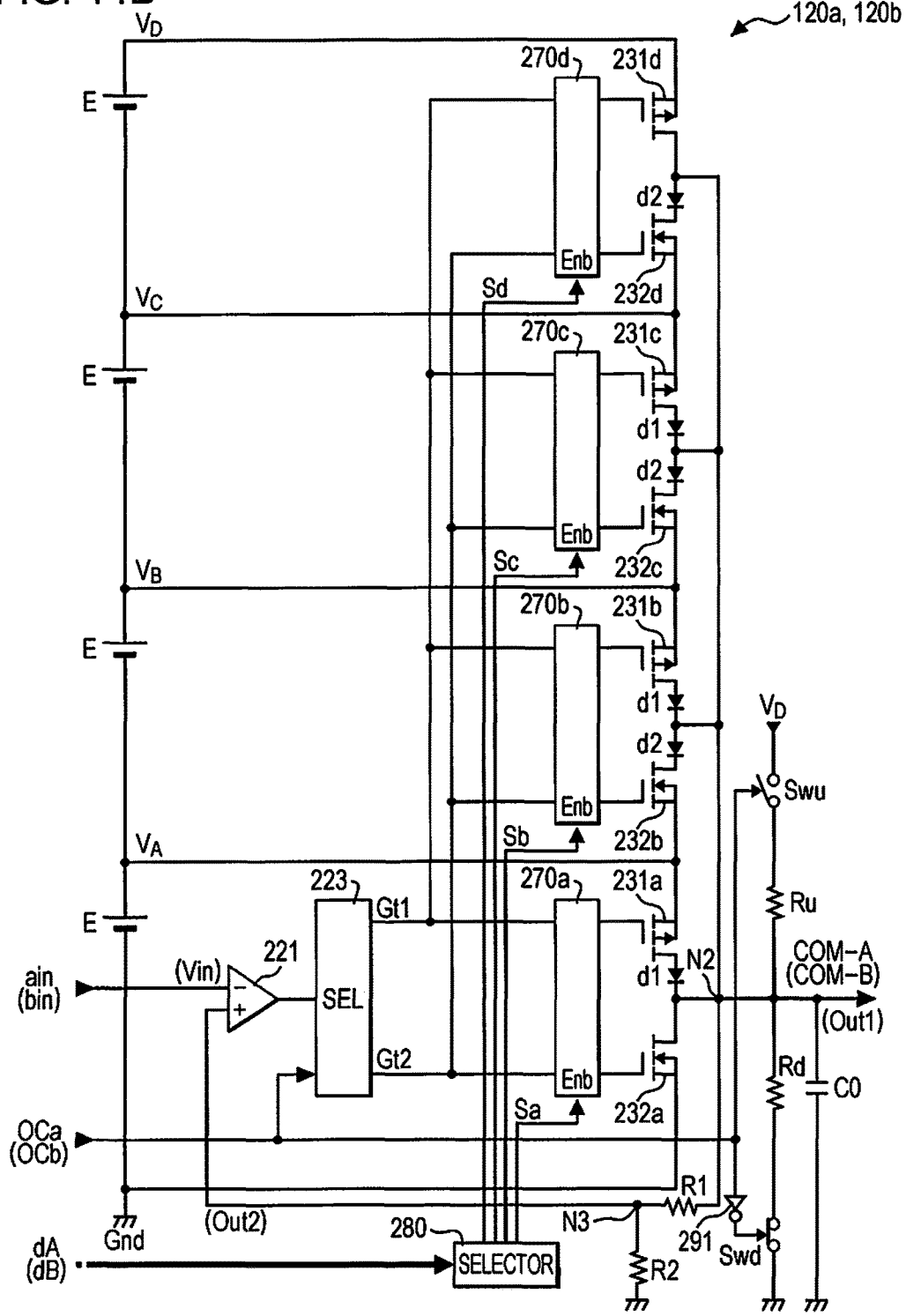
FIG. 14B is a diagram illustrating a drive circuit (Example 5) which is applied to the printing apparatus (Example 2)

FIG. 14B is a diagram illustrating a drive circuit (Example 5). In the same manner as the drive circuit (Example 3), the drive circuit (Example 5) is configured to include the switch Swd which disables pull-down, in addition to the switch Swu which disables pull-up. According to the drive circuit (Example 5), a through-current does not flow, and thus, it is possible to further reduce power consumption, compared with the drive circuit (Example 4).

If the differential amplifier 221 and the selector 223 in the drive circuit (Example 4) of FIG. 14A or the drive circuit (Example 5) of FIG. 14B are allowed to operate with a relative high voltage, the following drive circuit (Example 6) may be used.

Figure 17:
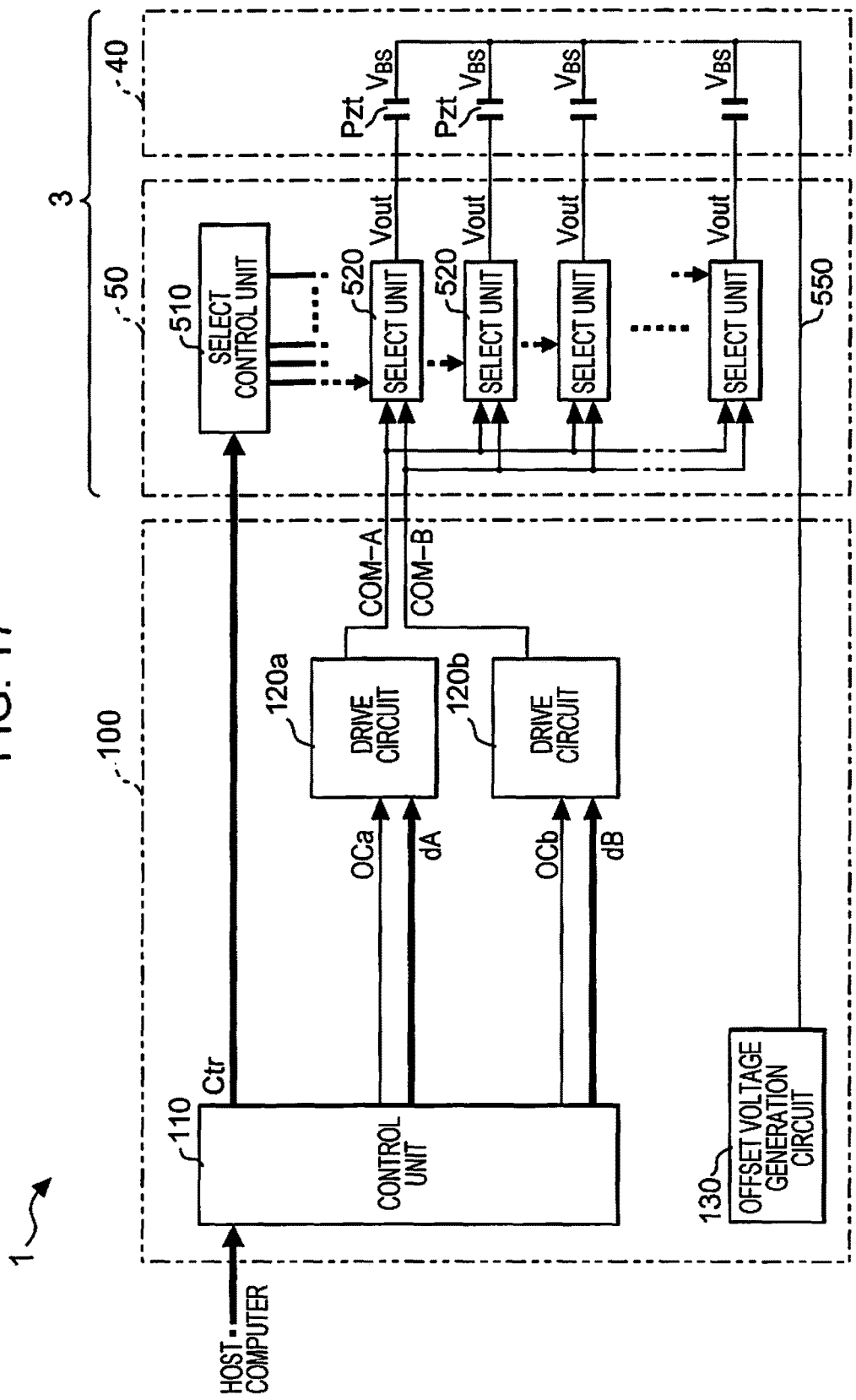
FIG. 17 is a block diagram illustrating an electrical configuration of a printing apparatus (Example 3)

FIG. 17 is a block diagram illustrating an electrical configuration of a printing apparatus (Example 3) including the drive circuit (Example 6). The printing apparatus (Example 3) illustrated in this figure is different from the printing apparatus (Example 2) illustrated in FIG. 13 in that the printing apparatus (Example 3) does not include the DACs 113a and 113b. However, as will be described below, a circuit corresponding to the DAC and the voltage amplifier is provided on the drive circuit 120a (120b) side.

Figure 18:
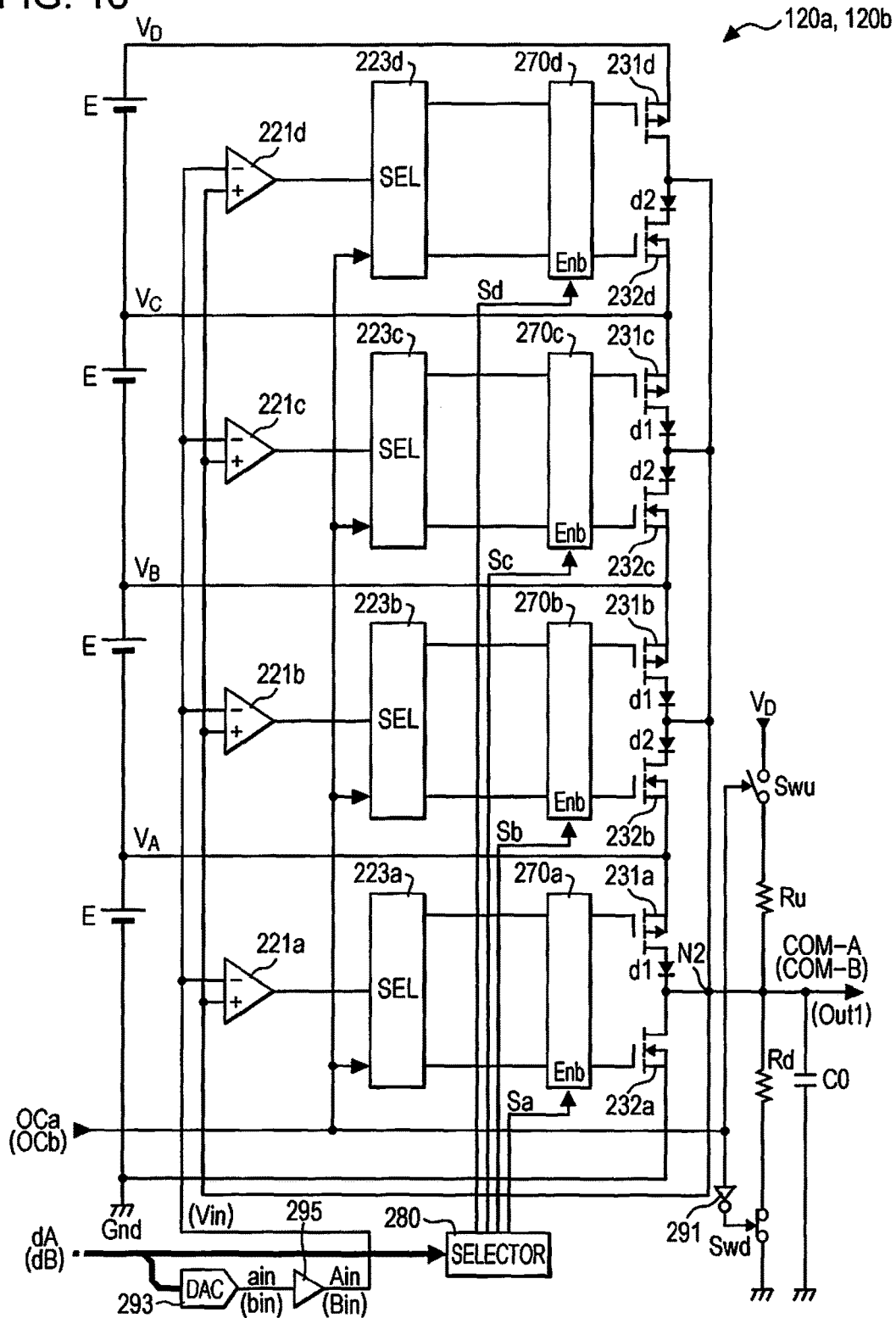
FIG. 18 is a diagram illustrating a drive circuit (Example 6) which is applied to the printing apparatus (Example 3)

FIG. 18 is a diagram illustrating a configuration of the drive circuit (Example 6). A first difference between the drive circuit (Example 6) illustrated in this figure and the drive circuit (Example 5) illustrated in FIG. 14B is that, referring to the drive circuit 120a which outputs the drive signal COM-A, the drive circuit (Example 6) includes a DAC 293 which converts the data dA into the analog signal ain with a small amplitude, and a voltage amplifier 295 which amplifies a voltage of the signal ain by, for example, 10 times and outputs the amplified voltage as the signal Ain with a large amplitude. A second difference therebetween is that the drive circuit (Example 6) includes a set of a differential amplifier and a selector corresponding to each of the pairs of transistors. A third difference therebetween is that the drive circuit (Example 6) does not include the resistance elements R1 and R2.

The first difference will be described. As described above, the DAC 293 corresponds to the DAC 113a of FIG. 4, the voltage amplifier 295 corresponds to the voltage amplifier 115a of FIG. 4.

Accordingly, the DAC 293 converts the digital data dA into the analog signal ain with a small amplitude, and the voltage amplifier 295 amplifies the voltage of the signal ain by, for example, 10 times and outputs the amplified signal as the signal Ain with a large amplitude.

The second difference will be described. The differential amplifier 221a and the selector 223a corresponding to the pair of transistors 231a and 232a are provided, the differential amplifier 221b and the selector 223b corresponding to the pair of transistors 231b and 232b are provided, the differential amplifier 221c and the selector 223c corresponding to the pair of transistors 231c and 232c are provided, and the differential amplifier 221d and the selector 223d corresponding to the pair of transistors 231d and 232d are provided.

In the same manner as the differential amplifier 221 of FIG. 10, each of the differential amplifiers 221a, 221b, 221c, and 221d amplifies a difference voltage which is obtained by subtracting the voltage Vin of the signal Ain with a large amplitude which is an input from the voltage Out of the drive signal COM-A which is an output by using the voltage $V_D$ as a high side of the power supply voltage and by using the ground Gnd as a low side thereof, and outputs the amplified voltage.

It is not necessary for the drive circuit (Example 6) to drop the voltage Out of the node N2 to feed back, and thus, the resistance elements R1 and R2 of the drive circuit (Example 4) illustrated in FIG. 14A are removed. However, in order to pull down the node N2, the resistance element Rd and the switch Swd are provided.

In the same manner as the selector 223 of FIG. 10, if the signal OCa is in an L level, each of the selectors 223a, 223b, 223c, and 223d selects an output signal of the differential amplifier, outputs the selected signal to a high-side transistor side, and outputs a signal which turns off a low-side transistor to the low-side transistor side. Meanwhile, if the signal OCa is in an H level, each of the selectors selects the output signal of the differential amplifier, outputs the selected signal to the low-side transistor side, and outputs a signal which turns off the high-side transistor to the high-side transistor side.

Each of the gate selectors 270a, 270b, 270c, and 270d in the drive circuit (Example 6) does not have a function of level shifting compared with the drive circuit (Example 4, Example 5), supplies an output signal of the corresponding selector to a gate terminal of the corresponding transistor, when being simply enabled, and supplies a signal which turns off the transistor to a gate terminal of the corresponding transistor, when being disabled.

In addition, the drive circuit (Example 6) includes the NOT circuit 291 and the switch Swd, in the same manner as the drive circuit (Example 5). The switch Swd is electrically coupled in series to the resistance element Rd between the node N2 and the ground Gnd, is turned on, if a signal which is obtained by logically inverting the signal OCa using the NOT circuit 291 is in an H level, and is turned off, if the signal is in an L level. Accordingly, the switches Swu and Swd are turned on and off respectively and exclusively.

According to the drive circuit (Example 6), the voltage Out is controlled to follow a voltage of the signal Ain. At the time of this control, although the drive circuit (Example 6) includes four pairs of transistors, only one pair of transistors operate continuously, and the other pairs of transistors are turned off, in the same manner as the drive circuit (Example 4, Example 5). Thus, it is possible to reduce power consumption.

In addition, according to the drive circuit (Example 6), the switches Swu and Swd are turned on and off respectively and exclusively, and thereby, a through-current does not flow between the high-side voltage $V_D$ of a power supply and the ground Gnd. Accordingly, it is possible to further reduce power consumption.

The selector 280 in the drive circuit (Example 4, Example 5, Example 6) has a configuration in which a range that the voltage Vin is included among the first range to the fourth range is discriminated by the data dA (dB) prior to analog conversion, but may be discriminated by the signal ain (bin) which is converted by analog conversion, although accuracy decreases or delay occurs.

Accordingly, in a case where the pair of transistors is selected by a signal based on a source drive signal, the signal may be the data dA (dB), or may be the signal ain (bin) which is obtained by converting the data dA (dB) by using analog conversion, or may be a signal which is obtained by weighting the data dA (dB) and the signal ain (bin).

The four pairs of transistors are selected by the selector 280 in response to the signal based on the source drive signal, and the drive signal COM-A is output from the selected pair of transistors. Meanwhile, the unselected pairs of transistors are turned off by the gate selectors, and thereby, the selector 280 and the gate selectors 270a, 270b, 270c, and 270d can be conceptualized as a transistor pair switching unit.

In the drive circuit (Example 4, Example 5, Example 6), the set number of pairs of transistors is "4", but may be "2" or higher. As the set number increases, a voltage of each reference power supply E can be reduced.

In addition, the drive circuit (Example 4, Example 5, Example 6) has a configuration in which $V_A$, $V_B$, $V_C$, and $V_D$ are output from four stages that output the voltage E and are coupled in series (refer to FIG. 15), and a difference between a high-side voltage and a low-side voltage of each voltage set is set as the voltage E (=10.5 V), but a configuration in which the difference is not set as the voltage E may be provided.

In relation to the voltage range, an adjacent range among the first range to the fourth range may partially overlap.

The configuration in which the selector 280 may perform discrimination using the signal ain (bin) which is converted by using analog conversion, or the configuration in which the set number of the pairs of transistors is "2" or higher, or the like can also be applied to a drive circuit (Example 10, Example 11, Example 12) which will be described below, in the same manner as above.

Hence, the drive circuit (Example 4, Example 5, Example 6) has a configuration in which one of the four pairs of transistors is selected in response to the data dA (dB) or the like, but may have a configuration in which power supply voltages are switched by one pair of transistors in response to the data dA (dB) or the like as described in the next drive circuit (Example 7, Example 8).

A block diagram illustrating an electrical configuration of a printing apparatus including the drive circuit (Example 7) is the same as the block diagram of the printing apparatus (Example 3) of FIG. 17. That is, the printing apparatus has a configuration in which the data dA and the signal OCa are supplied from the control unit 110 to the drive circuit 120a and the data dB and the signal OCb are supplied from the control unit 110 to the drive circuit 120b.

Figure 19:
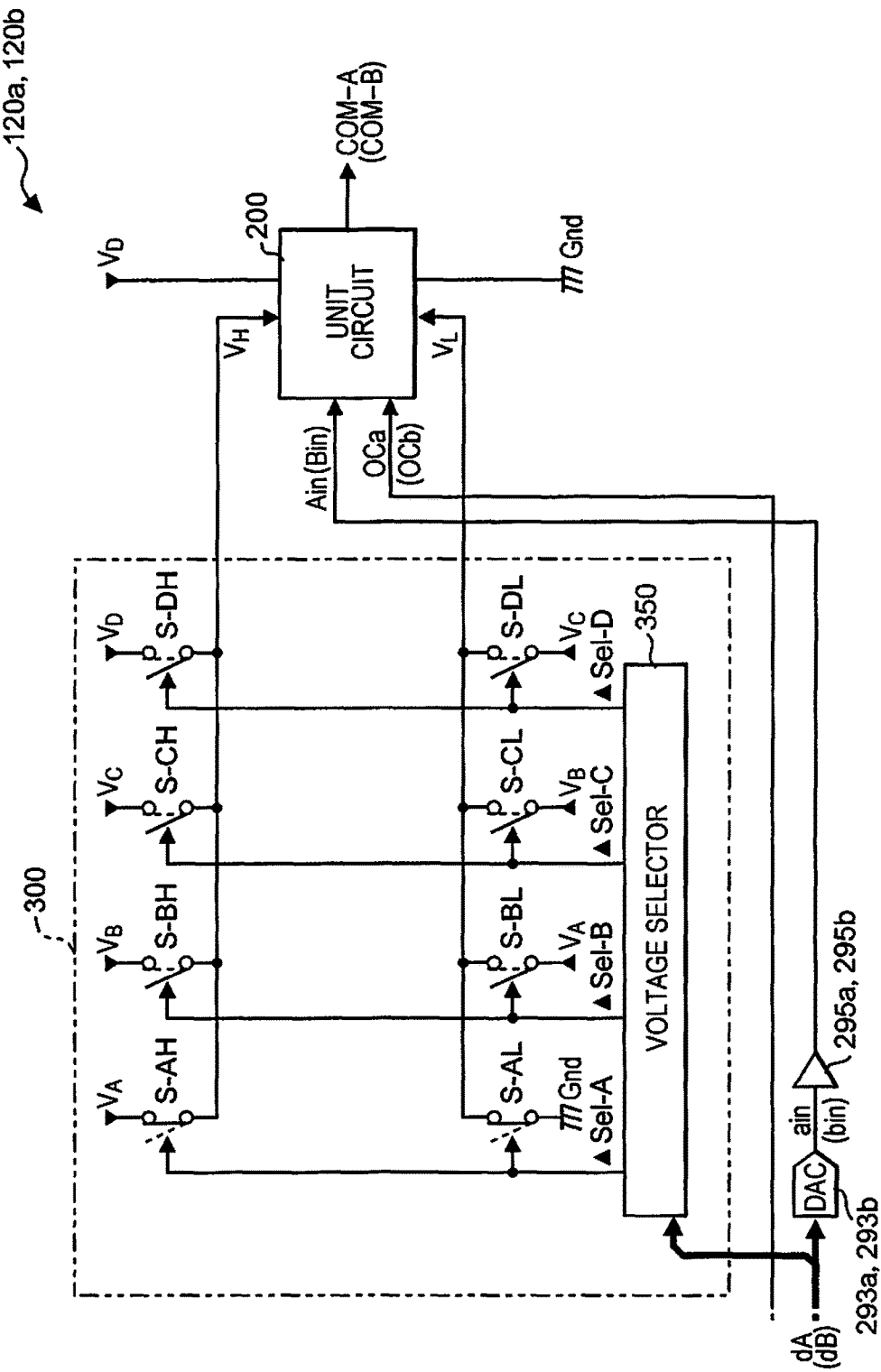
FIG. 19 is a diagram illustrating a drive circuit (Example 7) which is applied to the printing apparatus (Example 3)

FIG. 19 is a diagram illustrating a configuration of the drive circuit (Example 7). As described in this figure, the drive circuit (Example 7) which outputs the drive signal COM-A includes a unit circuit 200, the DAC 293a, the voltage amplifier 295a, and a voltage switching unit 300.

Among these, the DAC 293a converts the digital data dA into the analog signal ain with a small amplitude, and the voltage amplifier 295a amplifies a voltage of the signal ain by, for example, 10 times and outputs the amplified voltage as the signal Ain with a large amplitude.

The voltage switching unit (power supply voltage switching unit) 300 selects one set of voltages among the voltages ($V_A$, Gnd), ($V_B$, $V_A$), ($V_C$, $V_B$), and ($V_D$, $V_C$) in response to data dA, and supplies the selected set of voltages as power supply voltages ($V_H$, $V_L$) of the unit circuit 200.

In detail, the voltage switching unit 300 includes a voltage selector 350, a set of switches S-AH and S-AL, a set of switches S-BH and S-BL, a set of switches S-CH and S-CL, and a set of switches S-DH and S-DL. The voltage selector 350 outputs select signals Sel-A, Sel-B, Sel-C, and Sel-D in response to the data dA as follows.

That is, in a case where a voltage of the signal Ain which is obtained by performing analog conversion of the data dA and performing voltage amplification of the converted signal is in the first range, the voltage selector 350 causes the select signal Sel-A to be in an H level and the select signals Sel-B, Sel-C, and Sel-D to be in an L level. In a case where the voltage of the signal Ain is in the second range, the voltage selector 350 causes the select signal Sel-B to be in an H level and the select signals Sel-A, Sel-C, and Sel-D to be in an L level. In a case where the voltage of the signal Ain is in the third range, the voltage selector 350 causes the select signal Sel-C to be in an H level and the select signals Sel-A, Sel-B, and Sel-D to be in an L level. In a case where the voltage of the signal Ain is in the fourth range, the voltage selector 350 causes the select signal Sel-D to be in an H level and the select signals Sel-A, Sel-B, and Sel-C to be in an L level.

The switches S-AH and S-AL are turned on when the select signal Sel-A is in an H level, $V_A$ is applied to one terminal of the switch S-AH, and one terminal of the switch S-AL is coupled to the ground Gnd of zero volts. The switches S-BH and S-BL are turned on when the select signal Sel-B is in an H level, Vs is applied to one terminal of the switch S-BH, and $V_A$ is applied to one terminal of the switch S-BL. The switches S-CH and S-CL are turned on when the select signal Sel-C is in an H level, $V_C$ is applied to one terminal of the switch S-CH, and $V_B$ is applied to one terminal of the switch S-BL. The switches S-DH and S-DL are turned on when the select signal Sel-D is in an H level, $V_D$ is applied to one terminal of the switch S-DH, and $V_C$ is applied to one terminal of the switch S-BL.

The other terminals of the switches S-AH, S-BH, S-CH, and S-DH are coupled in common, and a voltage selected by turn-on of any one of the switches is supplied to the unit circuit 200 as a high-side voltage $V_H$ of a power supply. In the same manner, the other terminals of the switches S-AL, S-BL, S-CL, and S-DL are coupled in common, and a voltage selected by turn-on of any one of the switches is supplied to the unit circuit 200 as a low-side voltage $V_L$ of a power supply.

Hence, the power supply voltages $V_H$ and $V_L$ of the unit circuit 200 become the following voltages in response to a voltage of the signal Ain. That is, the power supply voltages $V_H$ and $V_L$ become the set of voltages $V_A$ and Gnd in a case where the voltage of the signal Ain is in the first range, become the set of voltages $V_B$ and $V_A$ in a case where the voltage of the signal Ain is in the second range, become the set of voltages $V_C$ and $V_B$ in a case where the voltage of the signal Ain is in the third range, and become the set of voltages $V_D$ and $V_C$ in a case where the voltage of the signal Ain is in the fourth range.

Figure 20:
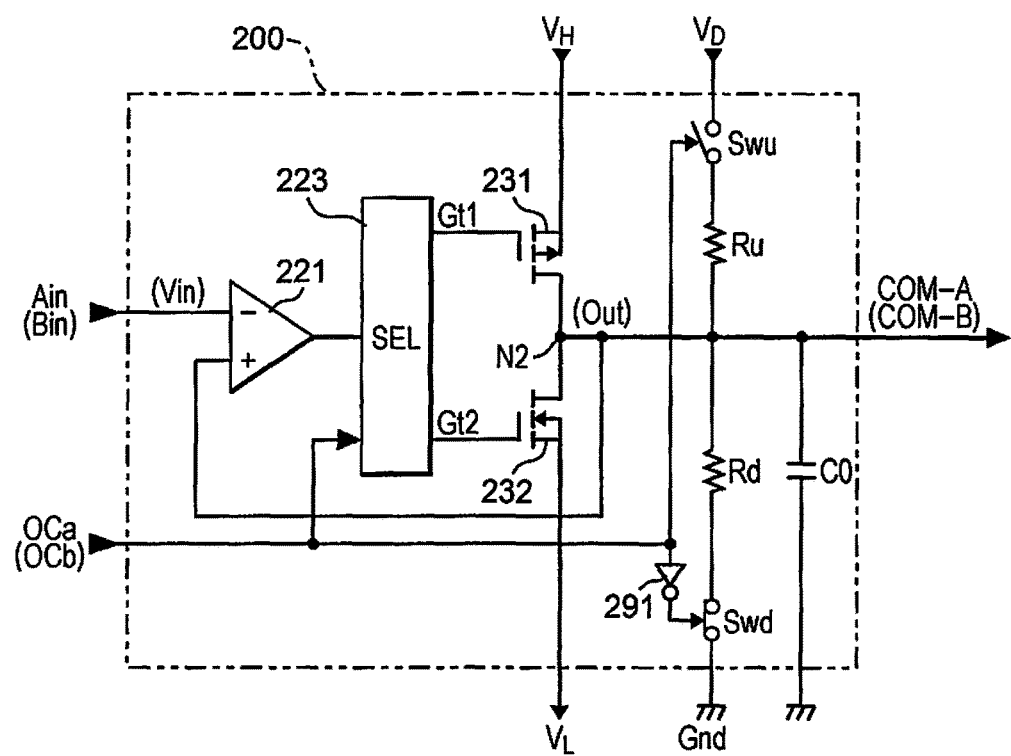
FIG. 20 is a diagram illustrating a unit circuit of the drive circuit (Example 7)

FIG. 20 is a diagram illustrating a configuration of the unit circuit 200 in the drive circuit (Example 7). The unit circuit 200 illustrated in this figure is approximately the same as the drive circuit (Example 3) illustrated in FIG. 12B, and a difference therebetween is that the high-side voltage $V_H$ is applied to a source terminal of the transistor 231 and the low-side voltage $V_L$ is applied to a source terminal of the transistor 232.

That is, only the power supply voltages of the pair of transistors are different from each other, and that the transistors 231 and 232 performs control such that the voltage Out of the node N2 follows the voltage Vin in a range of the power supply voltage is the same as each other. Here, in a case where the voltage Vin is higher than or equal to the current voltage $V_H$, the voltage Vin is switched to a set higher by one stage as the voltages $V_H$ and $V_L$. Meanwhile, in a case where the voltage Vin is lower than or equal to the voltage $V_L$, the voltage Vin is switched to a set lower by one stage as the voltages $V_H$ and $V_L$. Accordingly, according to the drive circuit (Example 7), in a case where the voltage Vin of the signal Ain is within a range from the ground Gnd to the voltage $V_D$, the set of the voltages $V_H$ and $V_L$ according to the voltage Vin is switched by the voltage switching unit 300, and thus, the voltage Out of the node N2 is controlled to follow the voltage Vin by the unit circuit 200.

In addition, according to the drive circuit (Example 7), the switches Swu and Swd are turned on and off respectively and exclusively, and thereby, a through-current is suppressed flowing between the high-side voltage $V_D$ of the power supply and the ground Gnd. Thus, it is possible to reduce power consumption.

The voltage Out of the drive signal COM-A swings between approximately 0 to 40 V, and thus, if the voltage set is configured not to be switched, the power supply voltage of the unit circuit 200 needs approximately 40 V. Accordingly, a cost increases and a size of a circuit increases.

In contrast to this, according to the drive circuit (Example 7), the voltage set is switched in response to the data dA (voltage Vin), and is supplied as the power supply voltage of the unit circuit 200. Accordingly, in the present embodiment, although the voltage Out of approximately 0 to 40 V is output, the power supply voltage of the unit circuit 200 is suppressed to 10.5 V. Thus, it is possible to prevent a cost from increasing and a size of a circuit from increasing.

Figure 21:
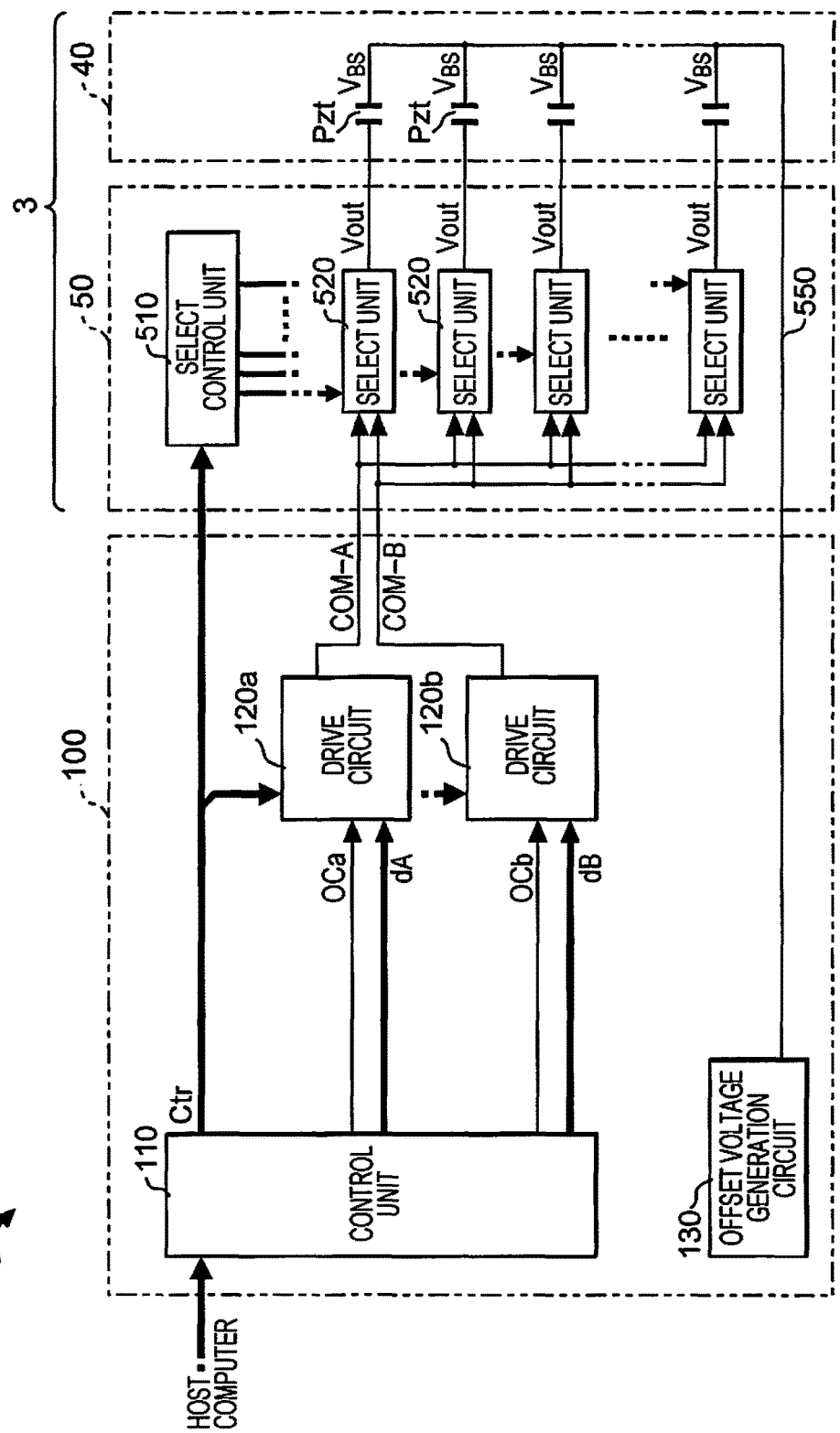
FIG. 21 is a block diagram illustrating an electrical configuration of a printing apparatus (Example 4)

FIG. 21 is a block diagram illustrating an electrical configuration of a printing apparatus (Example 4) including a drive circuit (Example 8). A difference between the printing apparatus (Example 4) illustrated in this figure and the printing apparatus (Example 3) illustrated in FIG. 17 is that the control signal Ctr including print data SI is supplied to the drive circuits 120a and 120b.

Figure 22:
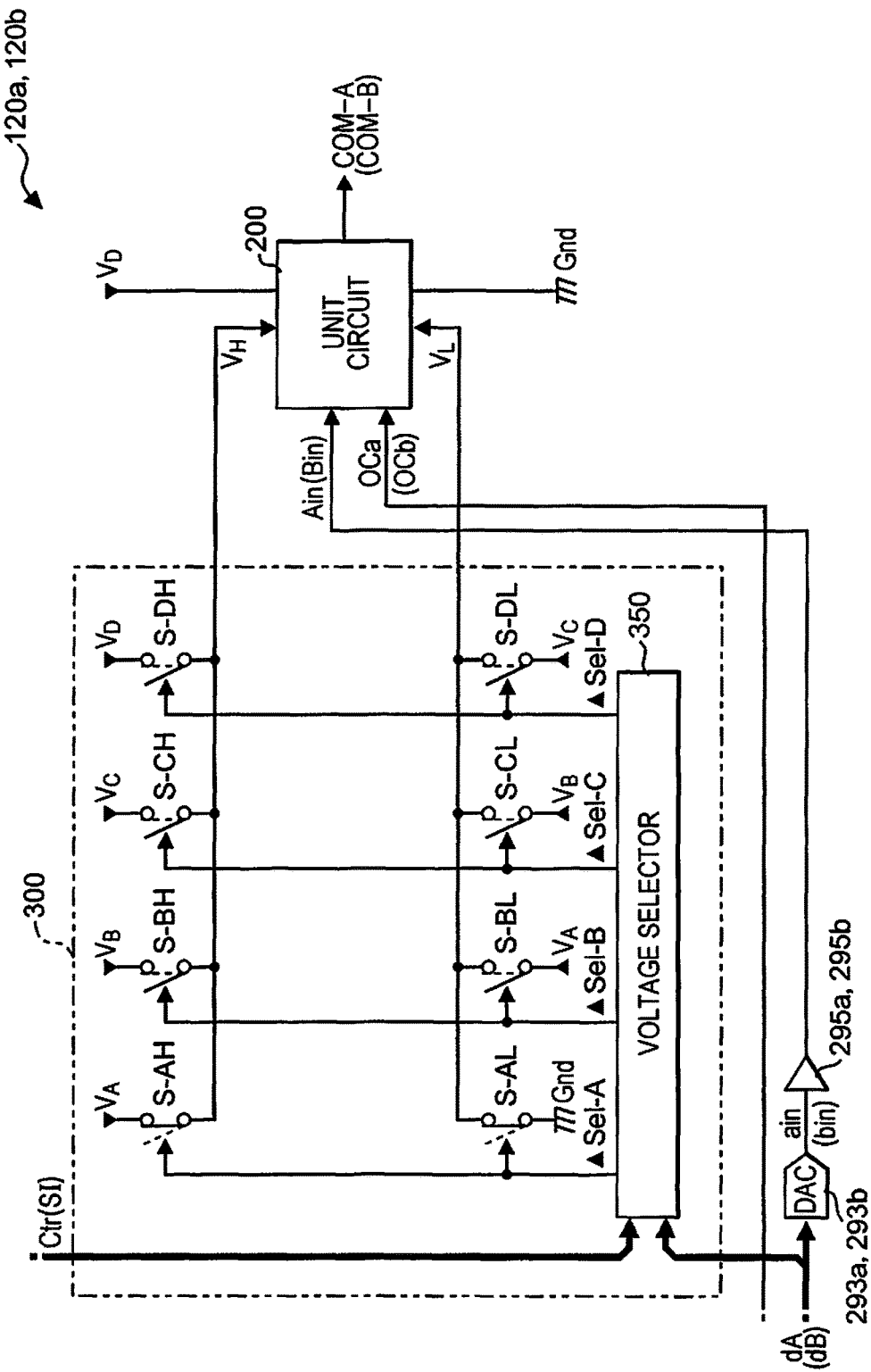
FIG. 22 is a diagram illustrating a drive circuit (Example 8) which is applied to the printing apparatus (Example 4)

FIG. 22 is a diagram illustrating a configuration of the drive circuit (Example 8). A difference between the drive circuit (Example 8) illustrated in this figure and the drive circuit (Example 7) illustrated in FIG. 19 is that the print data SI is supplied to a voltage selector 350 in the voltage switching unit 300.

This point will be described hereinafter. The voltage selector 350 in the drive circuit (Example 8) is the same as that of the drive circuit (Example 7) in that one of the select signals Sel-A, Sel-B, Sel-C, and Sel-D is output as an H level in response to the data dA (voltage Out), but the voltage selector 350 estimates a magnitude of capacitive load from the print data SI, and switches the select signals Sel-A, Sel-B, Sel-C, and Sel-D in accordance with the amount of delay according to the magnitude of the estimated capacitive load.

The estimation of the voltage selector 350 is performed as follows, for example. That is, the voltage selector 350 latches the print data SI included in the control signal Ctr from the control unit 110 by using the same circuit as the shift register 512 and the latch circuit 514 in the select control unit 510 (refer to FIG. 6), analyzes the latched print data SI, and estimates the magnitude of the capacitive load by obtaining the number of piezoelectric elements Pzt having one terminal receiving the drive signal COM-A in each of the periods T1 and T2 of the print period Ta.

In addition, the aforementioned amount of delay indicates delay time at a timing when a logic level of a select signal is switched.

In the drive circuit 120a which outputs the drive signal COM-A, for example, in a case where all nozzles of the head unit 3 form a large dot and a medium dot during the period T1 of the print period Ta, the drive signal COM-A is applied to one terminal of each piezoelectric element Pzt, and thereby, a load has a maximum value. Meanwhile, if all the nozzles form a small dot or no record is performed, the drive signal COM-A is not selected, and thereby, the load has a minimum value (zero). The drive circuit 120b which outputs the drive signal COM-B performs the same operation as above.

That is, the capacitive load in the drive circuit 120a (120b) changes much in accordance with print content which is defined by the print data SI.

A path from the node N2 to one terminal of the piezoelectric element Pzt includes the flexible flat cable 190 (refer to FIG. 1) or the transfer gates 524a and 524b (refer to FIG. 8) of the select unit 520, and thereby, inductance components, resistance components, or the like exist.

Accordingly, a waveform of the drive signal COM-A (COM-B) which is finally applied to one terminal of the piezoelectric element Pzt is blunted by an integral circuit which is formed by capacitance of the piezoelectric element Pzt, the inductance components, the resistance component, or the like. A degree of bluntness of the waveform becomes severe (becomes larger) as the number of the piezoelectric elements Pzt increases, that is, the capacitive load increases, and thereby, the drive signal COM-A (COM-B) which is applied to one terminal of the piezoelectric element Pzt is delayed more than the signal Ain (Bin).

Accordingly, in a configuration in which the delay of the drive signal COM-A (COM-B) is not assumed, a target voltage of the drive signal COM-A (COM-B) is not matched a voltage which is selected by the voltage switching unit 300, and thus, there is a high possibility that the waveform is distorted.

In the drive circuit (Example 8), the first layer of the voltage selector 350 increases the amount of delay of the select signals Sel-A, Sel-B, Sel-C, and Sel-D, as a capacitive load which is estimated from the print data SI included in the control signals Ctr increases. Accordingly, the voltage set is switched in accordance with the delay of the drive signal COM-A (COM-B), and thus, the mismatch is removed, and as a result, it is possible to prevent the waveform from being distorted.

A case where the voltage set is switched is used as an example with respect to the delay of switching, and this can also be applied to the drive circuit (Example 4, Example 5, Example 6) which switches the pair of transistors. In a case where the switching is applied to the drive circuit (Example 4, Example 5, Example 6), for example, a configuration in which the print data SI is supplied to the selector 280, the selector 280 estimates a magnitude of a capacitive load from the print data SI, and timing when a gate selector which is enabled is switched is delayed may be provided, while not illustrated in particular.

As described above, the capacitive load in the drive circuit 120a (120b) is changed much by print content which is defined by the print data SI. Meanwhile, the drive circuit 120a (120b) has a configuration in which the voltage Out of the node N2 is fed back to the positive input terminal (+) of the differential amplifier 221, and thus, the amount of phase rotation changes much in accordance with a change of the load, and abnormal oscillation occurs depending on conditions. Accordingly, stability is reduced.

Therefore, the drive circuit (Example 9) which resolves the point will be described. A printing apparatus to which the drive circuit (Example 9) is applied is the printing apparatus (Example 4) illustrated in FIG. 21, and has a configuration in which the control signals Ctr including the print data SI is supplied to the drive circuits 120a and 120b.

Figure 23:
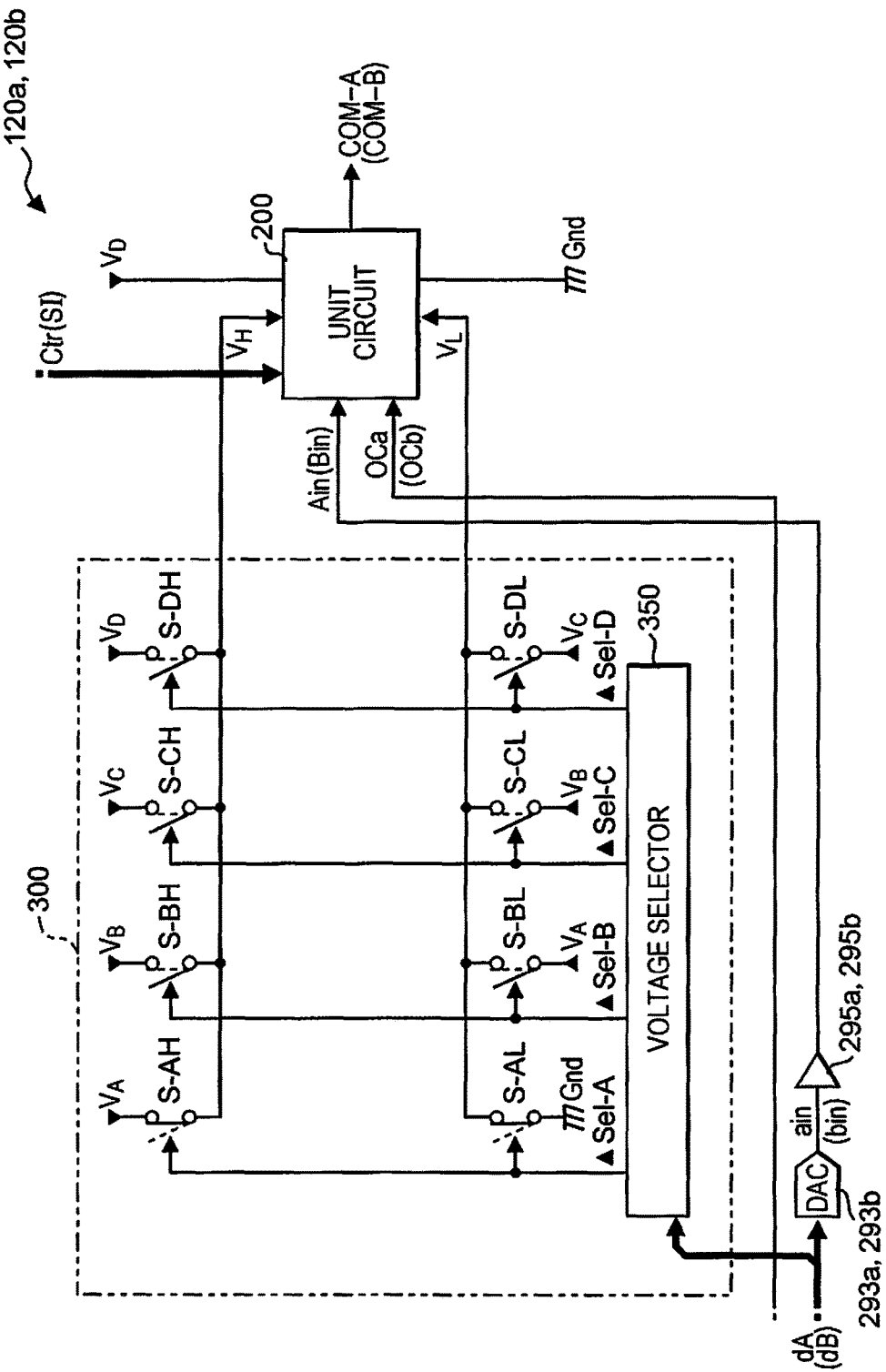
FIG. 23 is a diagram illustrating a drive circuit (Example 9) which is applied to the printing apparatus (Example 4)

FIG. 23 is a diagram illustrating a configuration of the drive circuit (Example 9). A difference between a configuration of the drive circuit (Example 9) illustrated in this figure and a configuration of the drive circuit (Example 8) illustrated in FIG. 22 is that the control signals Ctr including the print data SI is supplied to the unit circuit 200, not to the voltage switching unit 300.

Figure 24:
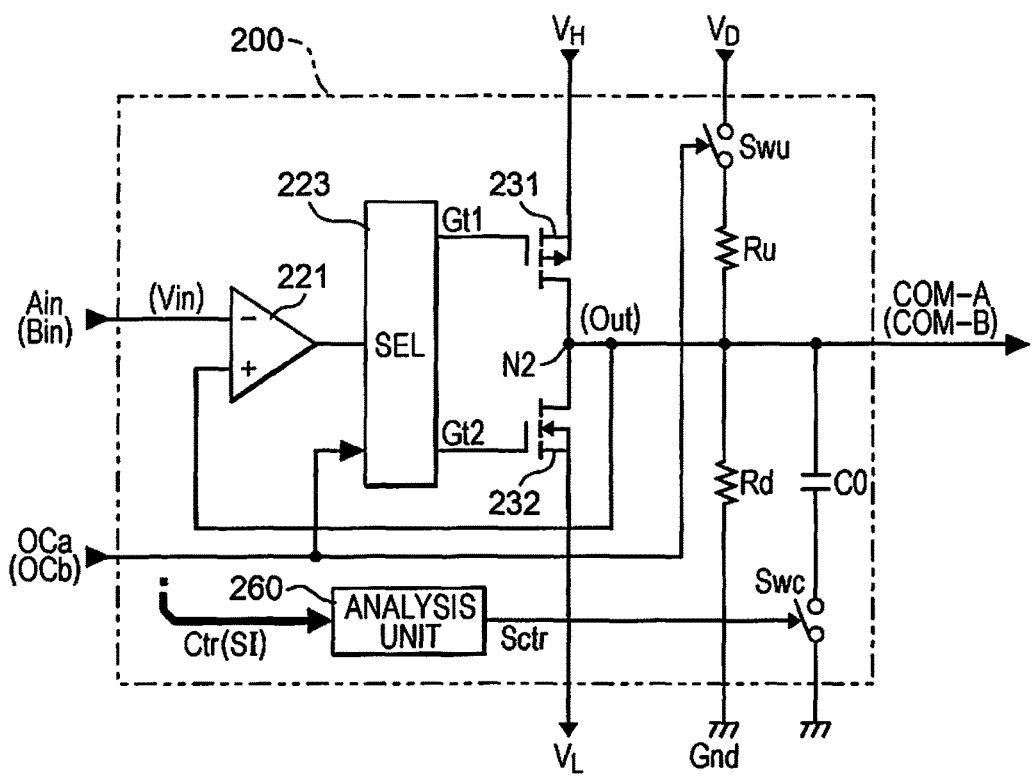
FIG. 24 is a diagram illustrating a unit circuit of the drive circuit (Example 9)

FIG. 24 is a diagram illustrating a configuration of the unit circuit 200 of the drive circuit (Example 9). A difference between the unit circuit illustrated in this figure and the unit circuit illustrated in FIG. 22 is that the unit circuit 200 illustrated in this figure includes an analysis unit 260 and a switch Swc.

The switch Swc is inserted between the other terminal of the capacitor C0 and the ground Gnd, is turned on if a signal Sctr which is output from the analysis unit 260 is in an H level, and is turned off if the signal Sctr is in an L level. The switch Swc may be inserted between the node N2 and one terminal of the capacitor C0.

First, the analysis unit 260 latches the print data SI included in the control signals Ctr from the control unit 110. Second, the analysis unit 260 analyzes the latched print data SI, obtains the number of the piezoelectric elements Pzt, each having one terminal receiving the drive signal COM-A, during each of the periods T1 and T2 of the print period Ta, and outputs the signal Sctr in accordance with the number. Specifically, for example, the analysis unit 260 outputs the signal Sctr with an H level during the period T1 (T2) which is defined by a timing signal, if the number of the piezoelectric elements Pzt, each having one terminal receiving the drive signal COM-A, is within a range, for example, from "0" to "m/2" (half of m) during the period T1 (T2), and outputs the signal Sctr with an L level, if the number of the piezoelectric elements Pzt is in other ranges.

Here, if the signal Sctr is in an H level, the switch Swc is turned on, and thereby, the other terminal of the capacitor C0 is electrically coupled to (enabled) to the ground Gnd and is parallel with the piezoelectric element Pzt. Meanwhile, if the signal Sctr is in an L level, the switch Swc is turned off, and thereby, the other terminal of the capacitor C0 is decoupled from the ground Gnd and the capacitor C0 is disabled.

If capacitances at the time when m piezoelectric elements Pzt in one head unit 3 are all coupled in parallel are referred to as 10 C, the number of the piezoelectric elements Pzt, each having one terminal coupled to the node N2, changes from "0" to "m" in accordance with the print data SI. At this time, when viewing from the node N2, capacitance of the piezoelectric element Pzt functioning as a capacitive load changes within a range from 0 C to 10 C.

Here, the capacitance of the capacitor C0 in the drive circuit (Example 9) is regarded as 5 C for the sake of convenience.

For example, if viewing from the drive circuit 120a which outputs the drive signal COM-A, in a case where the number of the piezoelectric elements Pzt, each having one terminal receiving the drive signal COM-A is within a range from 0 to m/2 (half of m) during the period T1 of the print period Ta, the capacitances of the piezoelectric elements Pzt change from 0 C to 5 C. In this case, the analysis unit 260 outputs the signal Sctr with an H level, and thereby, the switch Swc is turned on and the capacitor C0 with the capacitance 5 C is coupled in parallel to the piezoelectric element Pzt. Accordingly, a total sum of capacitive loads when viewed from the node N2 is within a range from 5 C to 10 C.

Meanwhile, in a case where the number of the piezoelectric elements Pzt, each having one terminal receiving the drive signal COM-A, the capacitances of the piezoelectric elements Pzt change from 5 C to 10 C during the period T1 is within a range from m/2 to m. In this case, the analysis unit 260 outputs the signal Sctr with an L level, and thereby, the switch Swc is turned off and the capacitor C0 is not coupled in parallel to the piezoelectric element Pzt. Accordingly, a total sum of capacitive loads when viewed from the node N2 is within a range from 5 C to 10 C.

Hence, according to the drive circuit (Example 9), although the number of the piezoelectric elements Pzt, each having one terminal receiving the drive signal COM-A, changes from 0 to m during a certain period, the capacitive load viewed from the node N2 changes only within a range from 5 C to 10 C, and thus, effects of a change of the amount of phase rotation is reduced and it is easy to realize a stable drive circuit.

Although being viewed with respect to the drive circuit 120a herein, but the same thing can be applied to the drive circuit 120b in the same manner as above, that is, even if the number of the piezoelectric elements Pzt receiving the drive signal COM-B changes, it is possible to prevent the capacitive load viewed from the node N2 from changing.

In setting a capacitance value of the capacitor C0, not only a capacitance value or the number m of the piezoelectric element Pzt, but also resistances between sources and drains of transistors 231 and 232, wire resistance, inductance components, a frequency of the drive signal COM-A (COM-B), or the like are considered.

In the example of FIG. 24, one capacitor C0 is used, but two or more capacitors C0 may be used. Specifically, a configuration may be provided in which each of a plurality of capacitors is coupled in parallel to the piezoelectric element Pzt through a switch, and the number of switches Sw which are turned off is gradually increased, as the number of the piezoelectric elements Pzt, each having one terminal receiving the drive signal, increases.

A technology of enabling or disabling the capacitor C0 can also be applied to the configurations illustrated in FIG. 10, FIG. 12A, FIG. 12B, FIG. 14A, FIG. 14B, FIG. 18, and FIG. 20, in addition to configuration illustrated in FIG. 25, FIG. 29, FIG. 31, and FIG. 32 which will be described below.

In the drive circuit (Example 7, Example 8, Example 9), the set number of the power supply voltages is "4", but may be "2" or higher. In addition, the drive circuit (Example 7, Example 8, Example 9) has a configuration in which the power supply voltages of each set may be irregular, a part of the voltage ranges may overlap each other in an adjacent range, or the voltage selector 350 is discriminated by the signal ain (bin) is obtained by performing analog conversion, not by the data dA (dB).

However, the differential amplifier 221 or the selector 223 in the drive circuit (Example 4) illustrated in FIG. 14A and the drive circuit (Example 5) illustrated in FIG. 14B can use a relatively low voltage as a power supply voltage. Accordingly, breakdown voltages of transistors or the like configuring the differential amplifier 221 or the selector 223 can also be designed to be decreased in accordance with a power supply voltage with a small amplitude. Meanwhile, a voltage Out1 of the node N2 is approximately 40 V and has a large amplitude. Hence, the voltage Out1 with a large amplitude cannot be directly fed back to the differential amplifier 221 with a low breakdown voltage, and thus, the drive circuit (Example 4, Example 5) has a configuration in which the voltage Out1 is divided by the resistance elements R1 and R2 and the divided voltage Out1 is fed back to the differential amplifier 221.

A circuit configuration of the differential amplifier 221 is well known. Briefly speaking, an input terminal (+) thereof is configured to be coupled to a gate of one transistor of the transistors which are configuration elements. Accordingly, not a little capacitance components are parasitic on the input terminal (+), and thereby, a CR filter is formed by the parasitic capacitance components and the resistance element R1, and a first delay occurs in a feedback path. Accordingly, as the delay becomes temporally long, a switching frequency of the pair of transistors decreases and waveform reproducibility of the drive signal COM-A (COM-B) is degraded.

Hence, a drive circuit (Example 10) which resolves the point will be described hereinafter. A block diagram illustrating an electrical configuration of a printing apparatus including the drive circuit (Example 10) is the same as the printing apparatus (Example 2) of FIG. 13.

Figure 25:
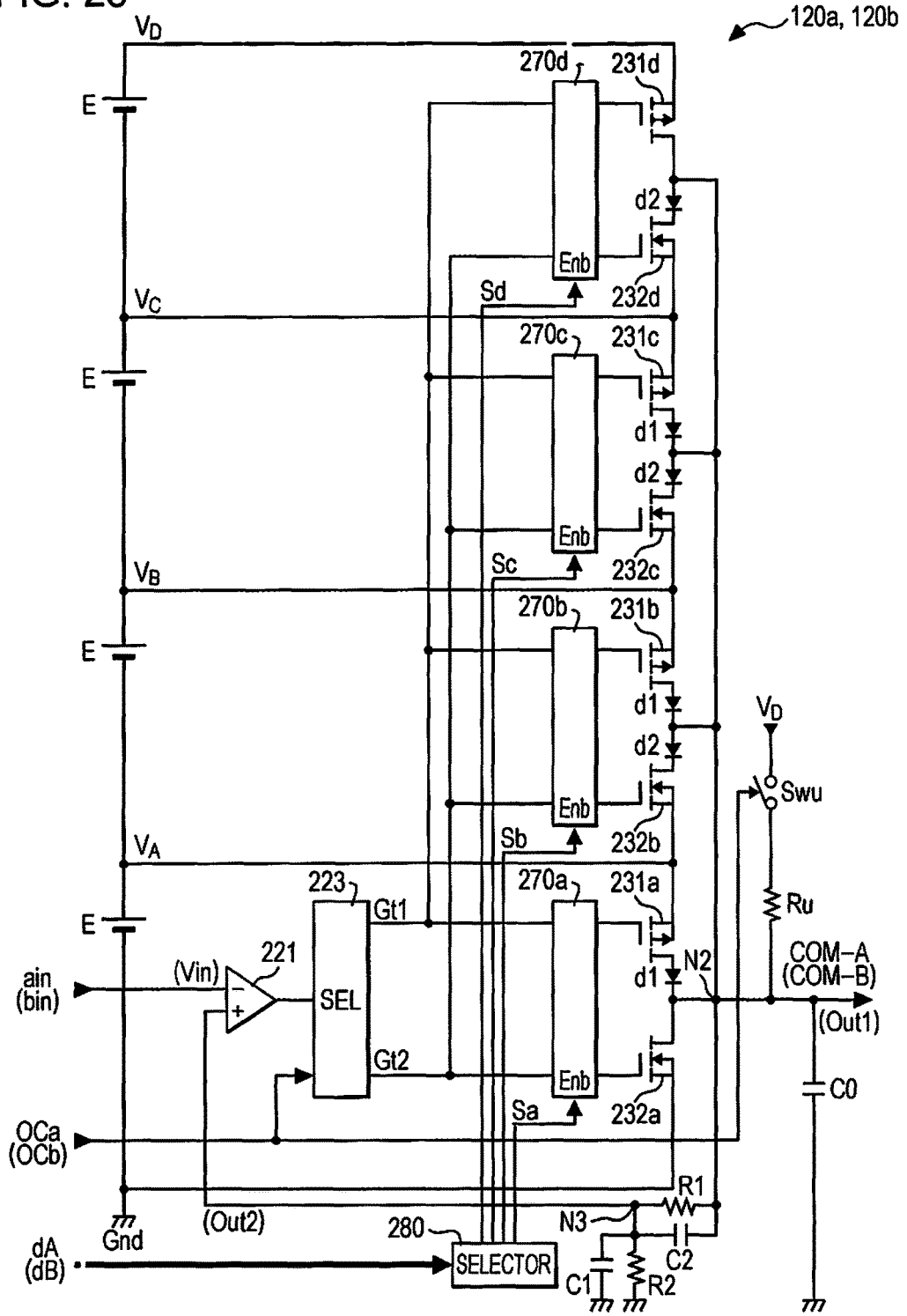
FIG. 25 is a diagram illustrating a drive circuit (Example 10) which is applied to the printing apparatus (Example 3)

FIG. 25 is a diagram illustrating a configuration of the drive circuit (Example 10). A difference between the drive circuit (Example 10) illustrated in this figure and the drive circuit (Example 5) illustrated in FIG. 14B is that the drive circuit (Example 10) includes capacitors C1 and C2. In detail, the drive circuit (Example 10) has a configuration of a differentiation and integration circuit in which the capacitor C1 is coupled in parallel to the resistance element R2 and the capacitor C2 is coupled in parallel to the resistance element R1. That is, a configuration is provided in which the phase delay of the feedback path is compensated for by the differentiation and integration circuit that uses the resistance elements R1 and R2 for dividing a voltage and includes the capacitors C1 and C2.

A specific example of characteristics of the differentiation and integration circuit will be described.

Figure 26:
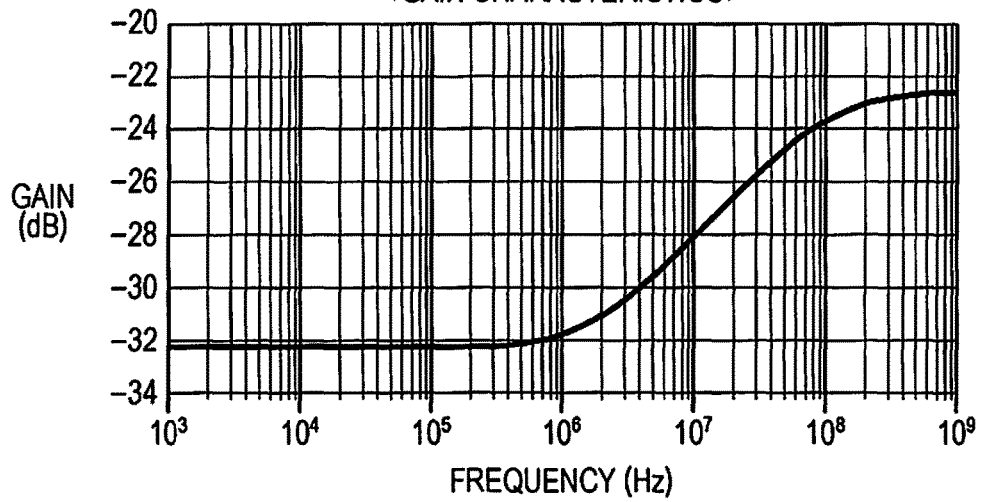
FIG. 26 is a diagram illustrating gain characteristics of a differentiation and integration circuit of the drive circuit (Example 10)
Figure 27:
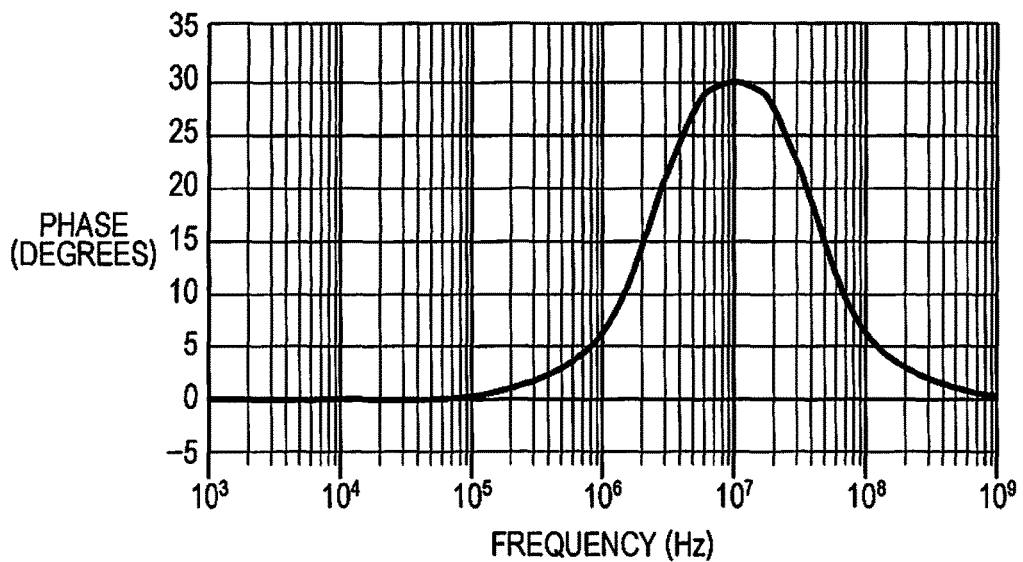
FIG. 27 is a diagram illustrating phase characteristics of a differentiation and integration circuit of the drive circuit (Example 10)

FIG. 26 is a diagram illustrating an example of frequency-gain characteristics of the differentiation and integration circuit, and FIG. 27 is a diagram illustrating an example of frequency-phase characteristics of the differentiation and integration circuit.

In FIG. 27, a vertical axis denotes a phase (degrees), and FIG. 27 illustrates that the phase relatively advances by using the periphery of a frequency of 10 MHz as a peak value. Hence, in the differentiation and integration circuit, a phase advances over a frequency band in which the pair of transistors are switched, and thus, the phase delay in the feedback path is compensated for.

In the aforementioned example, the voltage Out1 of the terminal N2 is fed back to the node N3 by being dropped to 1/10 times, and thereby, a resistance ratio between the resistance elements R1 and R2 are 9:1, but in the description on characteristics thereof, a resistance ratio is 40:1, as will be described below. Accordingly, a gain of the differentiation and integration circuit is −32.25 dB (0.0244 times) at a time period in which the pair of transistors are not switched.

Next, characteristics of the differentiation and integration circuit will be described.

Figure 28:
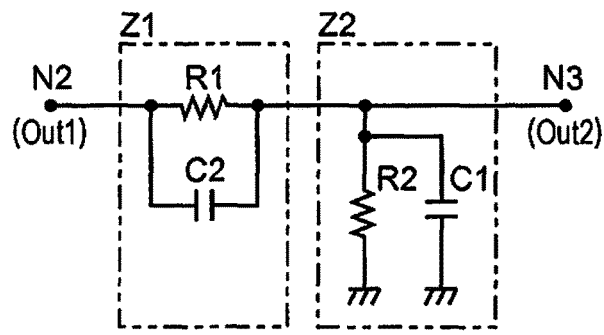
FIG. 28 is a diagram illustrating the differentiation and integration circuit of the drive circuit (Example 10)

If the differentiation and integration circuit of FIG. 25 is illustrated again such that an input side thereof is located on the left side and an output side thereof is located on the right side, the differentiation and integration circuit can be represented by parallel coupling of the resistance element R1 and the capacitor C2 and a parallel coupling of the resistance element R2 and the capacitor C1, as illustrated in FIG. 28.

A parallel impedance Z1 of the resistance element R1 and the capacitor C2 can be represented by the following Formula (1).

$$Z1 = \frac{1}{\frac{1}{R1} + j\omega C2} \qquad (1)$$
$$= \frac{1}{1 + j\omega R1 C2}$$

In addition, a parallel impedance Z2 of the resistance element R2 and the capacitor C1 can be represented by the following Formula (2).

$$Z2 = \frac{1}{\frac{1}{R2} + j\omega C1} \qquad (2)$$
$$= \frac{1}{1 + j\omega R2 C1}$$

A gain G of the differentiation and integration circuit having the terminal N2 as an input and having the terminal N3 as an output can be represented by the following Formula (3).

$$G = \frac{Out2}{Out1} = \frac{Z2}{Z1 + Z2} = \frac{1}{\frac{Z1}{Z2} + 1} \qquad (3)$$
$$= \frac{1}{\frac{R1(1 + j\omega R2 C1)}{R2(1 + j\omega R2 C1)} + 1}$$

An imaginary part of Formula (3) is removed in R2C1=R1C2, and thereby the following Formula (4) can be obtained.

$$\text{If } R2C1 = R1C2 \qquad (4)$$
$$G = \frac{R2}{R1 + R2}$$

The gain G which is represented by Formula (4) is obtained by dividing a voltage using the resistance elements R1 and R2, and in order to decrease the voltage Out1 more than the voltage Out2, the resistance elements need to be set to R1>R2.

According to the drive circuit (Example 10), the delay which occurs by a feedback path from the node N2 to the node N3 through the resistance element R1, and the capacitance components that are parasitic in the differential amplifier 221 is compensated for by the differentiation and integration circuit which is configured by the resistance element R1, the resistance element R2, and the capacitors C1 and C2. Therefore, an operation frequency of the pair of transistors is not reduced. Accordingly, it is possible to prevent the waveform reproducibility of the drive signal COM-A (COM-B) from being degraded.

In addition, the capacitor C0 for preventing abnormal oscillation is coupled to the node N2, but the capacitor C0 becomes a load when viewed from the node N2, and thus, the capacitor C0 becomes one of causes of wasteful power consumption. If capacitance of the capacitor C0 decreases, wasteful power consumption can be reduced, but there is a high possibility that abnormal oscillation occurs in a configuration in which the capacitors C1 and C2 do not exist. In contrast to this, according to the present embodiment, the abnormal oscillation is prevented from occurring by the differentiation and integration circuit including the capacitors C1 and C2, and thereafter, the capacitance of the capacitor C0 can be decreased. Accordingly, it is possible to reduce power consumption.

Next, the drive circuit (Example 11) which is an application and modification example of the drive circuit (Example 10) will be described.

Figure 29:
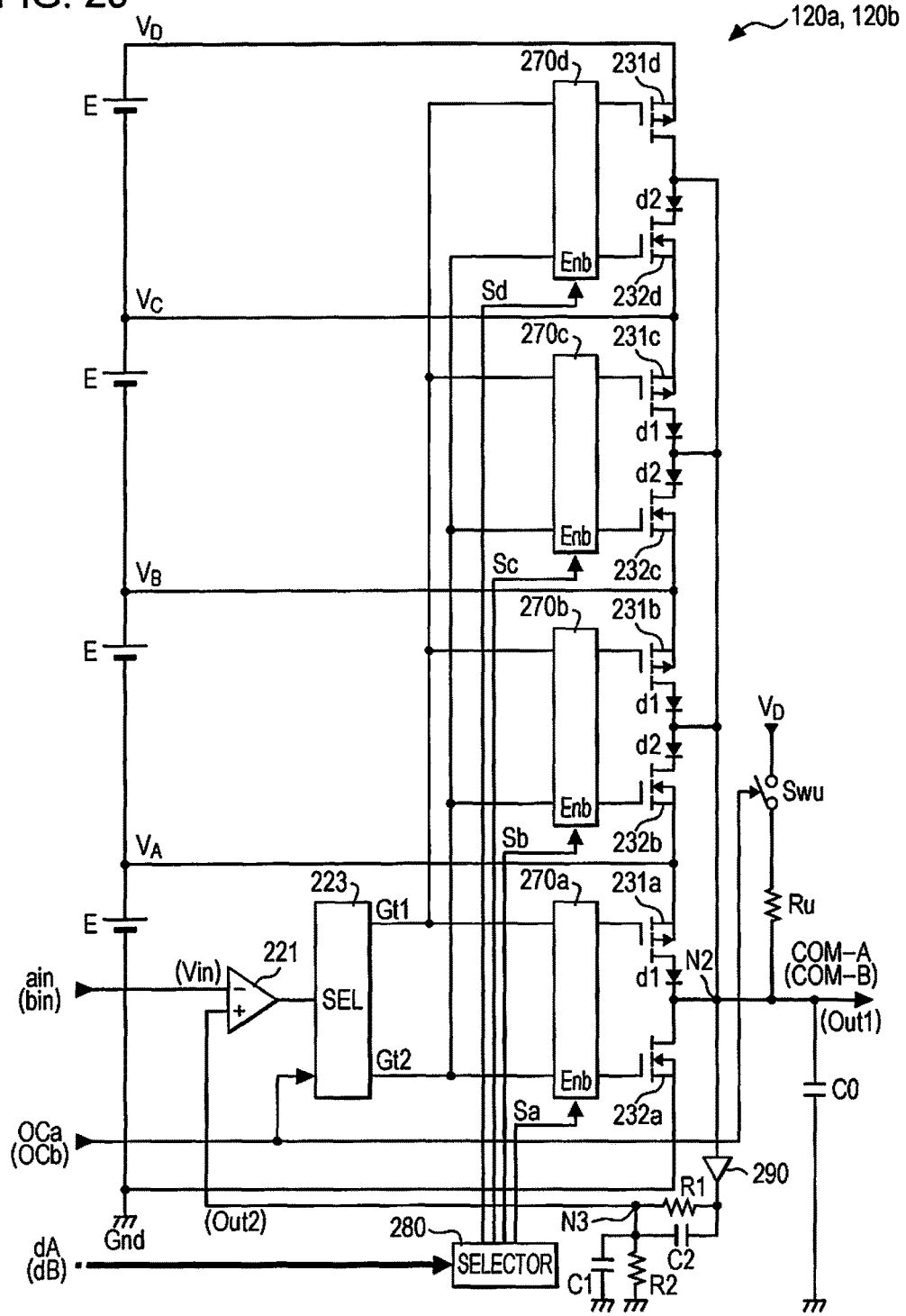
FIG. 29 is a diagram illustrating the drive circuit (Example 11) which is applied to the printing apparatus (Example 3)

FIG. 29 is a diagram illustrating the drive circuit (Example 11). As illustrated in this figure, the drive circuit (Example 11) includes an operational amplifier 290 which is coupled between the node N2 and the resistance element R1 and multiplies the voltage Out2 by a predetermined coefficient. According to a configuration in which the operational amplifier 290 (buffer amplifier) is provided as such, it is possible to prevent the voltage Out2 of the node N2 from decreasing due to a leakage current flowing through the resistance elements R1 and R2.

As described above, a through-current flows in the configuration in which the node N2 is pulled up by the resistance element Ru and is pulled down by the resistance element Rd, and thus, the switch Swu which disables the resistance element Ru is provided in the configurations illustrated in FIG. 12A, FIG. 14A, and FIG. 25. In addition, the switch Swd which disables the resistance element Rd is further provided in the configurations illustrated in FIG. 12B, FIG. 14B, FIG. 18, and FIG. 20. Meanwhile, a configuration is provided in which ON and OFF of the switch Swu is controlled by the signal OCa, and ON and OFF of the switch Swd are controlled by a signal which is obtained by inverting a logic level of the signal OCa by using the NOT circuit 291.

However, an original function of the signal OCa is to instruct the selector 223 to perform selection, and is not to control ON and OFF of the switches Swu and Swd. In addition, if delay occurs due to the switches Swu and Swd, the NOT circuit 291, or the like, there is also a possibility that through-currents flows simultaneously.

Hence, a drive circuit (Example 12) which resolves the point will be described hereinafter.

Figure 30:
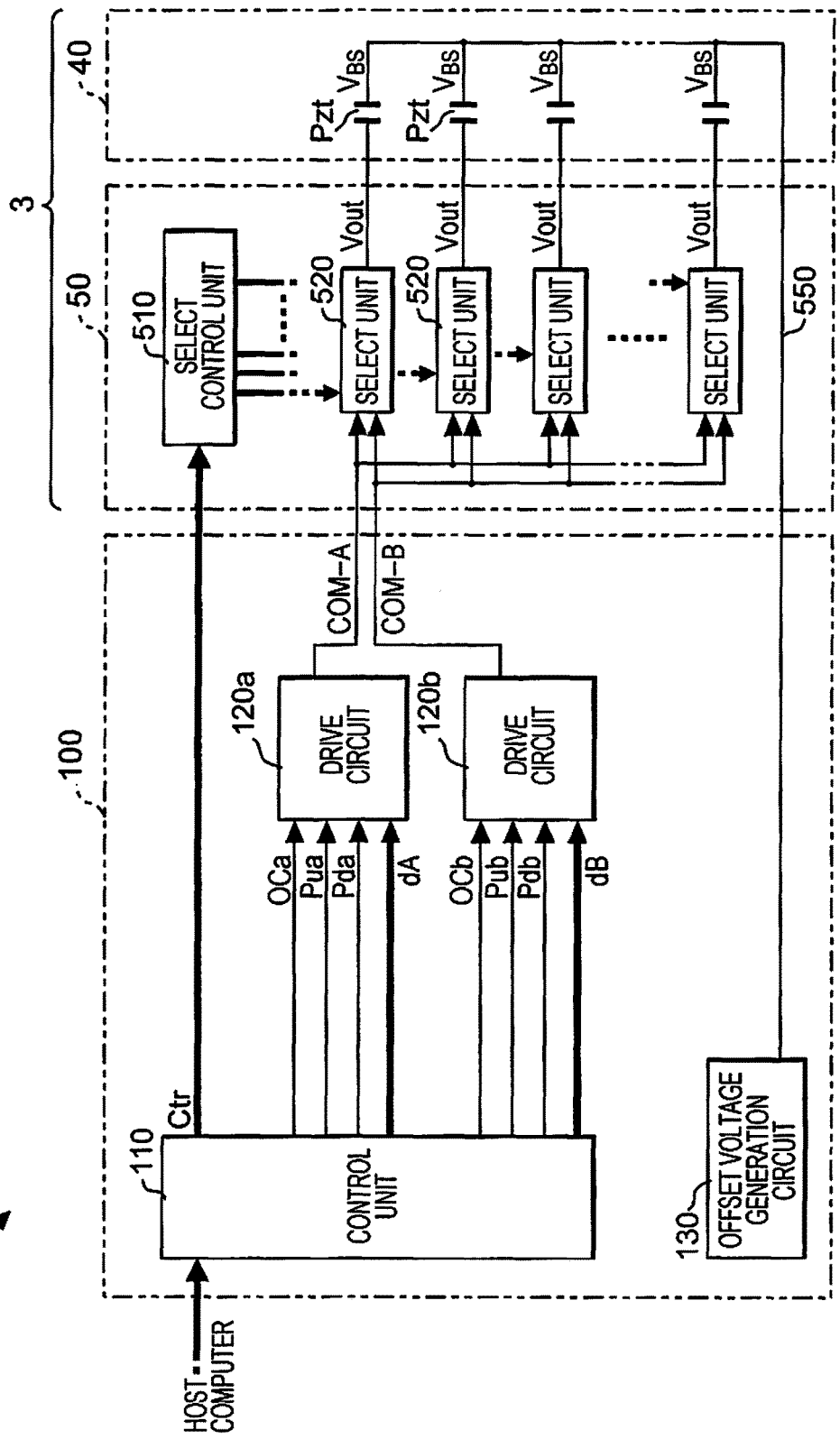
FIG. 30 is a block diagram illustrating an electrical configuration of a printing apparatus (Example 5)

FIG. 30 is a block diagram illustrating an electrical configuration of a printing apparatus (Example 5) including the drive circuit (Example 11). A difference between the printing apparatus (Example 5) illustrated in this figure and the printing apparatus (Example 2) illustrated in FIG. 13 is that the control unit 110 supplies signals Pua and Pda to the drive circuit 120*a* and supplies signals Pub and Pdb to the drive circuit 120*b*.

The signal Pua is in an H level, for example, during the periods P2 and P6 (refer to FIG. 11) in which the drive signal COM-A (signal ain) has a voltage lower than the threshold value Vth, and is in an L level during other periods P1, and P3 to P5. In addition, the signal Pda is in an H level during the period P4 in which the drive signal COM-A has a voltage higher than or equal to the threshold value Vth, and is in an L level during other periods P1 to P3, and P5.

The signal Pub is in an H level during the period in which the drive signal COM-B (signal bin) has a voltage lower than the threshold value Vth, and is in an L level during other periods. In addition, the signal Pdb is in an H level during the period in which the drive signal COM-A has a voltage higher than or equal to the threshold value Vth, and is in an L level during other periods.

Figure 31:
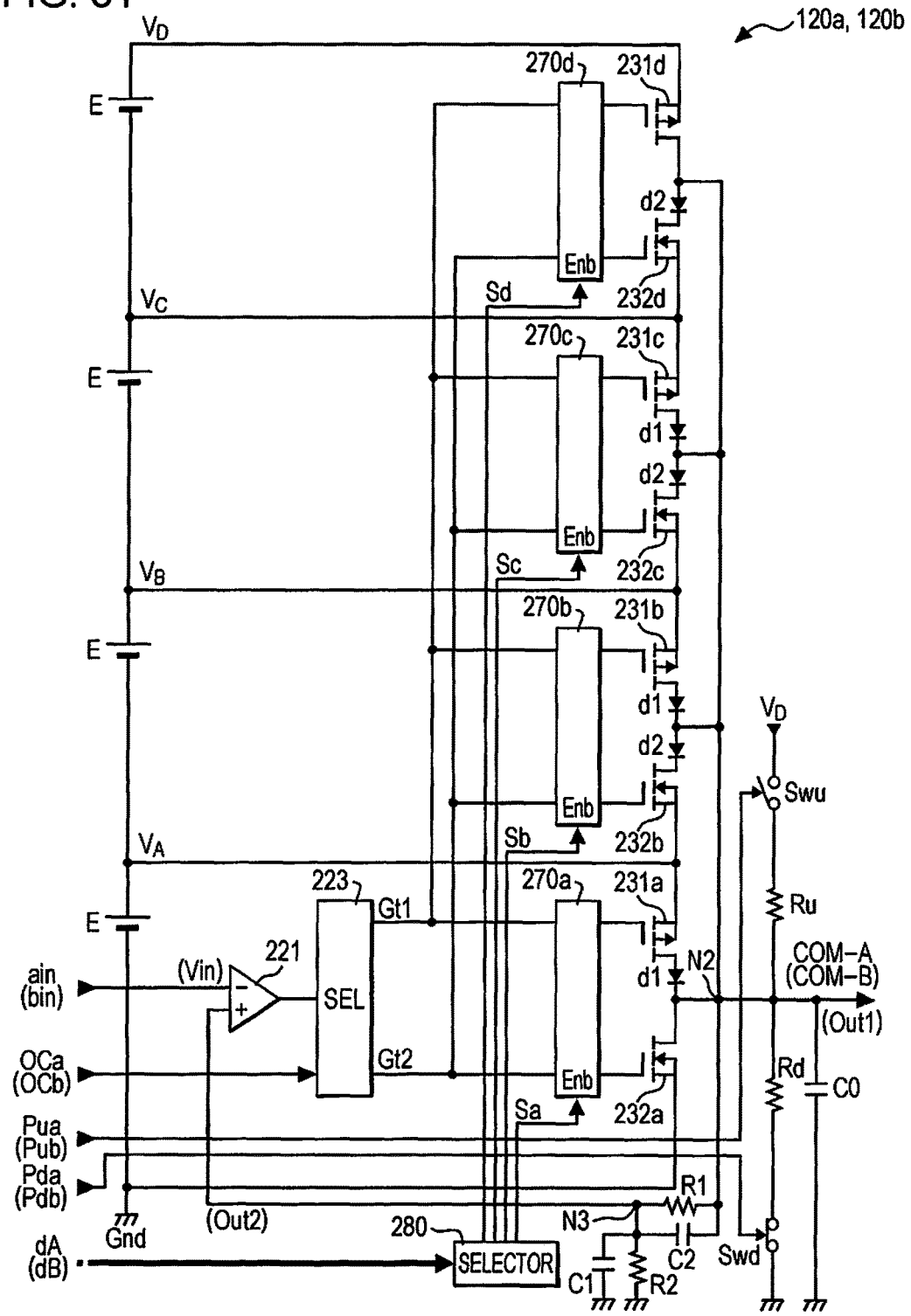
FIG. 31 is a diagram illustrating a drive circuit (Example 12) which is applied to the printing apparatus (Example 5)

FIG. 31 is a diagram illustrating a configuration of the drive circuit (Example 12). A difference between the drive circuit (Example 12) illustrated in this figure and the drive circuit (Example 5) illustrated in FIG. 14B is that ON and OFF of the switch Swu are controlled by the signal Pua and ON and OFF of the switch Swd are controlled by the signal Pda.

According to the drive circuit (Example 12), when viewed from a side outputting the drive signal COM-A, the switch Swu is turned on only during the periods P2 and P6, and the switch Swd is turned on only during the period P4. Accordingly, it is possible to prevent a through-current from flowing through the resistance elements Ru and Rd.

In the drive circuit which outputs the drive signal COM-A, the periods P2 and P6 correspond to periods in a case where the transistor 232 performs a linear operation as described above. In this case, the transistor 231 is turned off, and thus, in order to cause the voltage Out of the node N2 to follow the voltage Vin by the transistor 232, the node N2 needs to be pulled up by the resistance element Ru, but the node N2 need not be pulled up during other periods P1, and P3 to P5 in particular.

Meanwhile, the period P4 corresponds to a period in a case where the transistor 231 performs a linear operation. In this case, the transistor 232 is turned off, and thus, in order to cause the voltage Out of the node N2 to follow the voltage Vin by the transistor 231, the node N2 needs to be pulled down by the resistance element Rd, but the node N2 need not be pulled down during other periods, P1 to P3, and P5 in particular.

Hence, it can be said that the drive circuit (Example 12) has a configuration in which pull-up by the resistance element Ru and pull-down by the resistance element Rd can be performed only during a necessary period.

Figure 32:
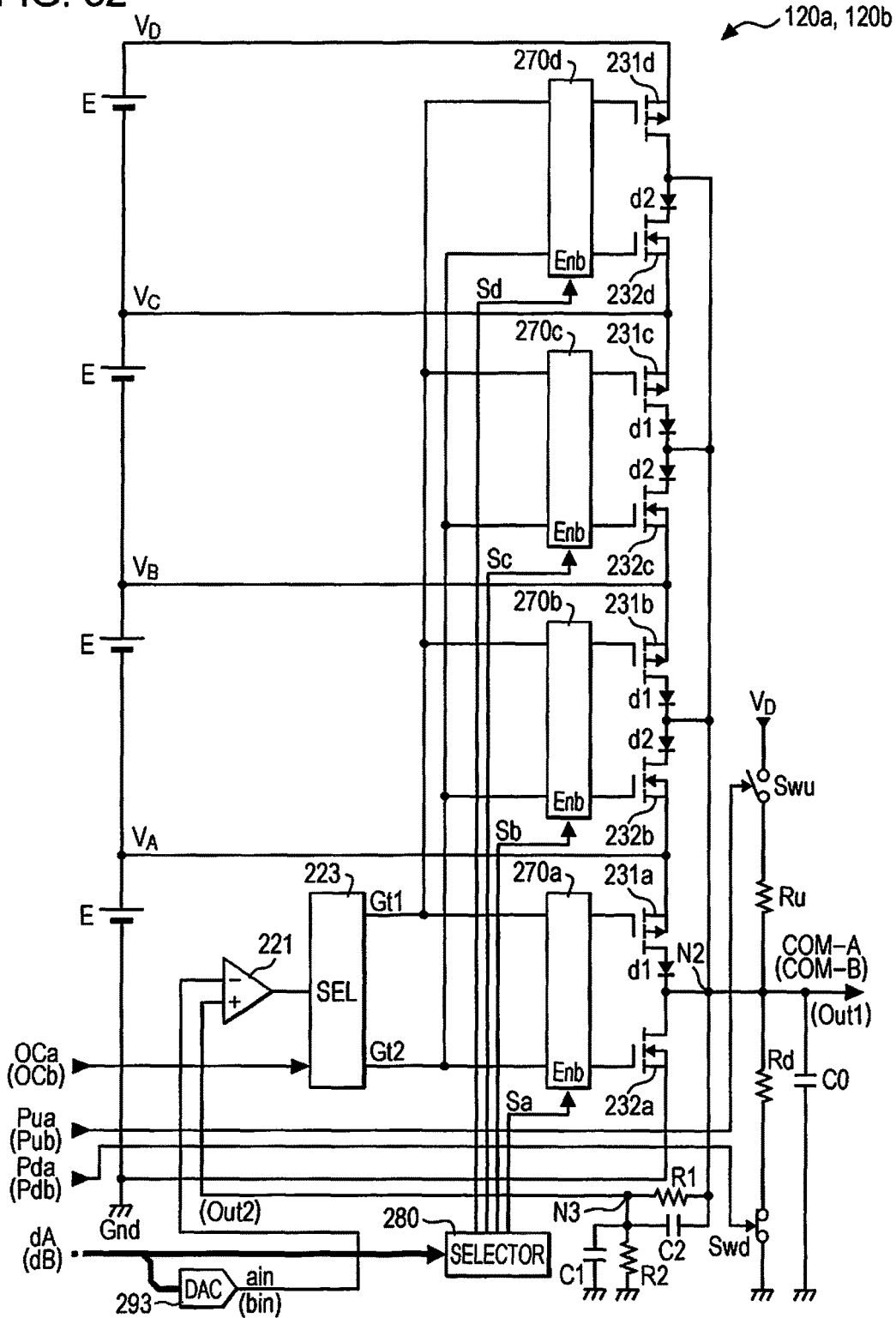
FIG. 32 is a diagram illustrating a drive circuit (Example 13).

In addition, a case where a side outputting the drive signal COM-A is used as the drive circuit (Example 12) is described as an example herein, but, in a case of the drive circuit 120b which outputs the drive signal COM-B, a configuration is provided in which ON and OFF of the switch Swu are controlled by the signal Pub and ON and OFF of the switch Swd are controlled by the signal Pdb, as denoted by parentheses of FIG. 32.

The signals Pua (Pub) and Pda (Pdb) can be generated by a configuration other than the control unit 110 by analyzing discrete values with respect to the data dA (dB) and temporal continuity of the discrete values, in the same manner as the signal OCa (OCb).

In addition, in the drive circuit (Example 10) of FIG. 25, the drive circuit (Example 11) of FIG. 29, and the drive circuit (Example 12) of FIG. 31, a DAC 293 may be provided which converts the data dA (dB) by using analog conversion, and supplies the converted signal to the negative input terminal (−) of the differential amplifier 221 as the signal air (bin).

FIG. 32 is a diagram illustrating a drive circuit (Example 13) which includes the DAC 293 for the drive circuit (Example 12). An example in which the drive circuit (Example 10, Example 11) includes the DAC 293 is not illustrated.

In the aforementioned description, the transistor 231 of the pair of transistors is configured by a P-channel transistor and the transistor 232 thereof is configured by an N-channel transistor, but both the transistors 231 and 232 may be P-channel transistors or N-channel transistors. However, an output signal of the differential amplifier 221, a gate signal at the time of being deactivated by the signal OCa (OCb), and the like need to be appropriately combined.

In addition, the drive circuit (Example 1, Example 2, Example 3) or the unit circuit 200 of the drive circuit (Example 7, Example 8, Example 9) may include a diode for blocking a current flowing from the node N2 toward a drain terminal of the transistor 231 and a diode for blocking a current flowing from a drain terminal of the transistor 232 toward the node N2.

In the above description, the liquid ejecting apparatus is described as a printing apparatus, but the liquid ejecting apparatus may be a three-dimensional shaping apparatus which ejects liquid to form a three-dimensional object, a textile printing apparatus which ejects liquid to print onto a textile, or the like.

In addition, the drive circuit is provided in the main substrate 100, but may be configured to be provided in the carriage 20 (or the head unit 3) together with the drive IC 50. If the drive circuit is provided in the head unit 3, it is not necessary to supply a signal with a large amplitude through the flexible flat cable 190, and thus, it is possible to improve anti-noise characteristics.

Furthermore, in the above description, an example is described in which the piezoelectric element Pzt for ejecting ink is used as a drive target of the drive circuit 120a (120b), but when considering the drive circuit 120a (120b) which is separated from the printing apparatus, the drive target is not limited to the piezoelectric element Pzt, and can be applied to all of a load with capacitive components, such as an ultrasonic motor, a touch panel, an electrostatic speaker, or a liquid crystal panel.

A drive circuit according to an aspect of the embodiment includes a control signal generator that generates a control signal, based on a drive signal which drives a capacitive load and a source drive signal which is a source signal of the drive signal, and an amplification unit that includes a high-side transistor and a low-side transistor which are controlled based on the control signal and that outputs the drive signal from an output terminal, and drives the capacitive load, in which the drive signal includes a first period in which a voltage changes to be higher than or equal to a first voltage per unit time; and a second period in which the voltage changes to be lower than the first voltage or does not change per unit time, in which the first period includes a period in which one of the high-side transistor and the low-side transistor performs a switching operation, and in which the second period includes a period in which one of the high-side transistor and the low-side transistor performs a linear operation.

According to the drive circuit of the aspect, a low pass filter is not needed compared with a class D amplification method, and thus, power which is consumed by the low pass filter can be ignored and power consumption is reduced by the amount consumed. In addition, if only a switching operation is performed in the same manner as in the class D amplification method, waveform accuracy of the drive signal is decreased, but according to the aspect, the waveform accuracy is increased by the linear operation in the second period.

In the drive circuit according to the aspect, the drive signal may have a trapezoidal waveform, the first period may be a period in which a voltage of the drive signal changes, and the second period may be a period in which the voltage of the drive signal is constant. According to the configuration, it is possible to accurately reproduce a trapezoidal waveform proper for driving, for example, a piezoelectric element by using the linear operation.

In addition, in the drive circuit according to the aspect, the drive signal may have a waveform with continuous slope, the first period may be a period having a relatively large voltage change of the drive signal, and the second period may be a period having a relatively small voltage change of the drive signal. According to the configuration, it is possible to accurately reproduce a waveform with a continuous slope by using the linear operation during a period in which there is a relatively small voltage change as in the vicinity of a minimum value and a maximum value of, for example, a sine wave.

In the drive circuit according to the aspect, the high-side transistor may perform a switching operation and the low-side transistor may be turned off, in a case where the voltage of the drive signal increases in the first period, and the low-side transistor may perform a switching operation and the high-side transistor may be turned off, in a case where the voltage of the drive signal decreases in the first period.

In addition, in the drive circuit according to the aspect, the high-side transistor may perform a linear operation and the low-side transistor may be turned off, in a case where the drive signal has a voltage higher than or equal to a predetermined threshold value in the second period, and the low-side transistor may perform a linear operation and the high-side transistor may be turned off, in a case where the drive signal has a voltage lower than the threshold value in the second period.

In the configuration, the threshold value may be lower than a maximum value of the voltage of the drive signal, and may be higher than a minimum value of the voltage of the drive signal.

The embodiment is not limited to a drive circuit which drives a capacitive load such as a piezoelectric element and can be realized by various aspects. The embodiment can also be conceptualized as, for example, a control method of a drive circuit, a liquid ejecting apparatus including the drive circuit, and furthermore, a head unit in the liquid ejecting apparatus or the like.

In addition, the aforementioned liquid ejecting apparatus may be an apparatus which ejects liquid, and also includes a three-dimensional shaping apparatus (so-called 3D printer), a textile printing apparatus, or the like, in addition to a printing apparatus which is described above.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A drive circuit comprising:
a control signal generator configured to generate a control signal, based on a drive signal, which drives a capacitive load, and a source drive signal which is a source signal of the drive signal;
a high-side transistor and a low-side transistor which are configured to be controlled based on the control signal; and
an output terminal which is connected to the high-side transistor and the low-side transistor and from which the drive signal is configured to be output to drive the capacitive load during
a first period in which a voltage of the drive signal changes to be higher than or equal to a first voltage per unit time, and
a second period in which the voltage of the drive signal changes to be lower than the first voltage or does not change per unit time,
the first period including a period in which one of the high-side transistor and the low-side transistor performs a switching operation in response to a first signal of the control signal which is supplied to the one of the high-side transistor and the low-side transistor, the first signal being repeatedly and alternately switched between a first voltage and a second voltage, and
the second period including a period in which the one of the high-side transistor and the low-side transistor performs a linear operation in response to a second signal of the control signal which is supplied to the one of the high-side transistor and the low-side transistor, the second signal having a third voltage different from the first and second voltages.

2. The drive circuit according to claim 1, wherein
the drive signal has a trapezoidal waveform,
the first period is a period in which the voltage of the drive signal changes, and
the second period is a period in which the voltage of the drive signal is constant.

3. The drive circuit according to claim 1, wherein
the drive signal has a waveform with continuous slope,
the first period is a period having a large voltage change of the drive signal, and
the second period is a period having a small voltage change of the drive signal, which is smaller than the large voltage change of the drive signal.

4. The drive circuit according to claim 1, wherein
the high-side transistor is configured to perform the switching operation and the low-side transistor is configured to be turned off, while the voltage of the drive signal increases in the first period, and the low-side transistor is configured to perform the switching operation and the high-side transistor is configured to be turned off, while the voltage of the drive signal decreases in the first period.

5. The drive circuit according to claim 1, wherein
the high-side transistor is configured to perform the linear operation and the low-side transistor is configured to be turned off, while the drive signal has a voltage higher than or equal to a predetermined threshold value in the second period, and the low-side transistor is configured to perform the linear operation and the high-side transistor is configured to be turned off, while the drive signal has a voltage lower than the threshold value in the second period.

6. The drive circuit according to claim 5, wherein
the threshold value is lower than a maximum value of the voltage of the drive signal, and is higher than a minimum value of the voltage of the drive signal.

7. A control method for controlling a drive circuit, the control method comprising:

controlling one of a high-side transistor and a low-side transistor of the drive circuit to perform a switching operation in at least a part of a first period by a control signal generator of the drive circuit, the control signal generator being configured to generate a control signal, based on a drive signal, which drives a capacitive load, and a source drive signal which is a source signal of the drive signal, the high-side transistor and the low-side transistor being configured to be controlled based on the control signal and being connected to an output terminal from which the drive signal is configured to be output to drive the capacitive load during the first period and a second period, the first period being a period in which a voltage changes to be higher than or equal to a first voltage per unit time, the second period being a period in which the voltage changes to be lower than the first voltage per unit time or does not change per unit time, the controlling to perform the switching operation in at least the part of the first period including controlling the one of the high-side transistor and the low-side transistor to perform the switching operation in response to a first signal of the control signal which is supplied to the one of the high-side transistor and the low-side transistor, the first signal being repeatedly and alternately switched between a first voltage and a second voltage; and controlling the one of the high-side transistor and the low-side transistor to perform a linear operation in at least a part of the second period by the control signal generator, the controlling the one of the high-side transistor and the low-side transistor to perform the linear operation in at least the part of the second period including controlling the one of the high-side transistor and the low-side transistor to perform the linear operation in response to a second signal of the control signal which is supplied to the one of the high-side transistor and the low-side transistor, the second signal having a third voltage different from the first and second voltages.

8. The drive circuit according to claim 1, wherein
the control signal generator includes a differential amplifier configured to amplify and output a difference voltage between the drive signal and the source drive signal to generate the control signal.

* * * * *